(12) United States Patent
Tsuchino et al.

(10) Patent No.: US 8,268,433 B2
(45) Date of Patent: Sep. 18, 2012

(54) INFORMATION RECORDING MEDIUM AND METHOD FOR PRODUCING SAME, AND SPUTTERING TARGET

(75) Inventors: Akio Tsuchino, Osaka (JP); Hideo Kusada, Osaka (JP); Rie Kojima, Osaka (JP); Noboru Yamada, Osaka (JP); Toshiyuki Matunaga, Osaka (JP)

(73) Assignee: Panasonic Corporation, Osaka (JP)

( * ) Notice: Subject to any disclaimer, the term of this patent is extended or adjusted under 35 U.S.C. 154(b) by 288 days.

(21) Appl. No.: 12/811,890

(22) PCT Filed: Oct. 23, 2009

(86) PCT No.: PCT/JP2009/005608
§ 371 (c)(1),
(2), (4) Date: Jul. 7, 2010

(87) PCT Pub. No.: WO2010/052842
PCT Pub. Date: May 14, 2010

(65) Prior Publication Data
US 2010/0279053 A1 Nov. 4, 2010

(30) Foreign Application Priority Data
Nov. 7, 2008 (JP) ................................ 2008-286073

(51) Int. Cl.
*B32B 3/02* (2006.01)
(52) U.S. Cl. ..................... 428/64.4; 428/64.5; 428/64.6; 430/270.13
(58) Field of Classification Search .................. 428/64.5; 430/270.13
See application file for complete search history.

(56) References Cited

U.S. PATENT DOCUMENTS
| | | |
|---|---|---|
| 2003/0138669 A1 | 7/2003 | Kojima et al. |
| 2004/0028869 A1 | 2/2004 | Terao et al. |
| 2005/0018593 A1 | 1/2005 | Doi et al. |

FOREIGN PATENT DOCUMENTS
| | | |
|---|---|---|
| JP | 63-225934 | 9/1988 |
| JP | 63-225935 | 9/1988 |
| JP | 1-303643 | 12/1989 |
| JP | 2003-233931 | 8/2003 |
| JP | 2003-323743 | 11/2003 |
| JP | 2004-071038 | 3/2004 |
| JP | 2005-063634 | 3/2005 |

OTHER PUBLICATIONS

International Search Report for international application No. PCT/JP2009/005608, dated Jan. 12, 2010 (3 pages).

*Primary Examiner* — Elizabeth Mulvaney
(74) *Attorney, Agent, or Firm* — Hamre, Schumann, Mueller & Larson, P.C.

(57) ABSTRACT

An information recording medium (1) of the present invention is an information recording medium allowing information to be recorded thereon by irradiation with a laser beam or by application of electrical energy. The information recording medium (1) includes a recording layer (15) capable of undergoing a phase change by the irradiation with the laser beam or by the application of the electrical energy. The recording layer (15) contains Sb, Te, Ge, and C, and a content of Te in the recording layer (15) is at least 8 atom % but not more than 25 atom %.

23 Claims, 9 Drawing Sheets

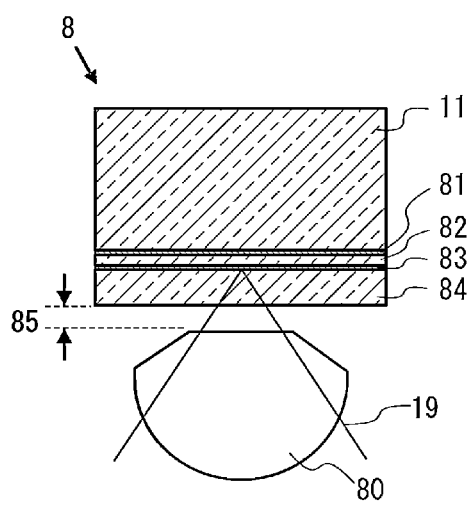
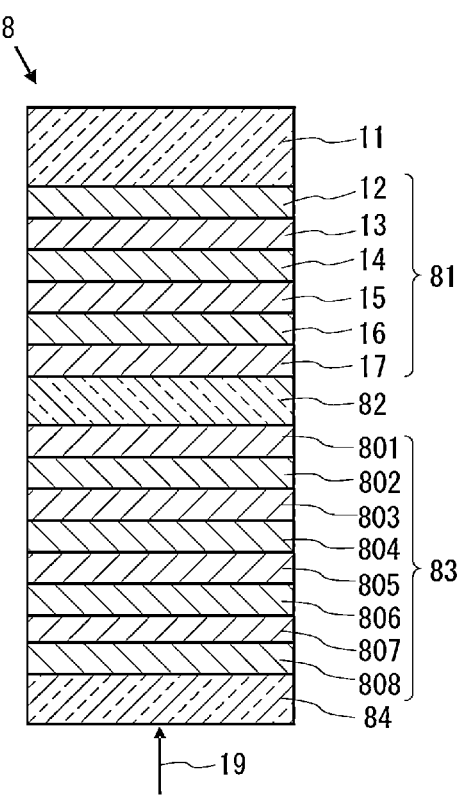
FIG. 8A
FIG. 8B

INFORMATION RECORDING MEDIUM AND METHOD FOR PRODUCING SAME, AND SPUTTERING TARGET

TECHNICAL FIELD

The present invention relates to an information recording medium on or from which information is recorded or reproduced by an optical or electrical means, and a method for producing the recording medium. The present invention also relates to a target to be used for the production method.

BACKGROUND ART

As an example of an optical information recording medium, there can be mentioned a phase-change information recording medium with respect to which information can be recorded, erased, and rewritten by an optical means using a laser beam. The recording, erasing, and rewriting with respect to the phase-change information recording medium are performed by allowing the phase change material composing the recording layer thereof to change reversibly between a crystalline state and an amorphous state. Generally, the recording of information is performed by heating the recording layer to a temperature higher than its melting point by irradiation with a laser beam at a high power (recording power), melting the irradiated region, and then cooling it rapidly to form an amorphous phase. In contrast, the erasure of information is performed by heating the recording layer to a temperature higher than its crystallization temperature and lower than its melting point by irradiation with a laser beam at a power (erasing power) lower than that used for recording so as to increase the temperature of the recording layer, and then cooling it gradually to form a crystalline phase. The crystalline region and amorphous region thus formed have different reflectances from each other, and thereby information can be reproduced. As the difference between these reflectances increases, higher quality of reproduced signals can be achieved.

As an example of the phase-change information recording medium, there can be mentioned Blu-ray Disc media commercially available today. The Blu-ray Disc media can be used for digital high-definition broadcasting, and have a recording capacity of 25 GB (one layer) or 50 GB (two layers on one side) and a transfer rate of 36 Mbps (1× speed). Examples of the material used for the recording layer included in a rewritable Blu-ray Disc medium include a material having a composition located on a line extending between $Ge_{50}Te_{50}$ and $Sb_{40}Te_{60}$ (see Patent Literature 1), a material having a composition located on a line extending between $Ge_{50}Te_{50}$ and $Bi_{40}Te_{60}$ obtained by substituting Sb with Bi (see Patent Literature 2) in the composition located on the line extending between $Ge_{50}Te_{50}$ and $Sb_{40}Te_{60}$, and a material that contains Sb as its main component (near 70 atom %) and is based on a composition located in the vicinity of an eutectic point of SbTe (see Patent Literature 3).

The SbTe eutectic material is characterized in that it has a wider margin with respect to the recording linear speed. It is possible to control the crystallization ability of the recording layer by an amount of Sb contained as the main component. A larger amount of Sb can enhance the crystallization ability further, making it possible to record information at a higher linear velocity. Moreover, the above-mentioned composition located in the vicinity of the eutectic point has a large amount of optical change between the crystalline phase and amorphous phase, and thereby high signal quality can be achieved. Since addition of Ge, Ag—In or the like into SbTe, for example, can increase the crystallization temperature and enhance the signal storage stability, such ternary and quaternary materials have been developed as materials at a level of or close to practical use.

As an example of the configuration of the Blu-ray Disc media, there can be mentioned a configuration in which a reflective layer, a first dielectric layer, a first interface layer, a recording layer, a second interface layer, a second dielectric layer, and a cover layer are formed in this order on a surface of a substrate.

The first dielectric layer and the second dielectric layer have a function of enhancing the optical absorption efficiency of the recording layer by allowing their thicknesses to be adjusted, increasing the difference between the reflectance when the recording layer is in the crystalline phase and the reflectance when the recording layer is in the amorphous phase, and increasing the signal amplitude. The first dielectric layer and the second dielectric layer also have a function of protecting the recording layer from moisture, etc. As an example of the material used for these dielectric layers, a mixture of ZnS and $SiO_2$ can be mentioned. This material is an amorphous material, and has low heat conductivity, high refractive index, and high transparency as its properties.

The first interface layer and the second interface layer are provided to prevent the elements composing the first dielectric layer and the second dielectric layer from diffusing into the recording layer when rewrite recording is performed repeatedly, and to prevent the rewriting property of the recording layer from being changed. As an example of the material used for the interface layers, there has been disclosed a material containing $ZrO_2$ and $Cr_2O_3$, for example (see Patent Literature 4, for example). This material is excellent because it has a high transparency with respect to a blue-violet wavelength region (near 405 nm) laser and also has a high heat resistance because of a high melting point.

Optically, the reflective layer has a function of increasing an amount of light to be absorbed by the recording layer. Thermally, the reflective layer has a function of diffusing promptly the heat generated in the recording layer and cooling the recording layer rapidly so that the recording layer becomes amorphous easily. Furthermore, the reflective layer also has a function of protecting the recording layer, the interface layers, and the dielectric layers from the environment in which the medium is used. Therefore, as the material for the reflective layer, an Ag alloy with a high heat conductivity has been used preferably.

Further increases in the capacity and transfer rate will be required in the future, and various techniques have been studied accordingly. As one of the techniques for increasing the capacity, it is considered providing two or more information layers on one side. When this technique is used, the information layer disposed on the laser beam incident side is required to have a high transmittance that allows the laser beam to pass therethrough and the information layer disposed far from the laser beam incident side is required to have a high reflectance because the laser beam that is incident from one side of the information recording medium is used to reproduce the change in reflectance of each recording layer. Thus, in the information layer on the laser beam incident side, it is necessary to reduce the thickness of the recording layer to increase the transmittance, and in the information layer disposed far from the laser beam incident side, it is necessary to increase the thicknesses of the recording layer and the reflective layer to increase the reflectance.

As a technique for increasing the capacity further, it also can be considered increasing the recording (mark/space) density in a plane to increase the recording capacity per information layer from 25 GB to 30 GB or 33.4 GB, for example.

Since an increase in the recording density shortens the interval between a recorded mark (=an amorphous region) and a pace (=a crystalline region), the material composition of each of the layers and the configuration of the information recording medium need to be made suitable for high density recording.

Furthermore, since the resultant higher transfer rate shortens the period of time during which the recording layer is irradiated with the laser beam, it is necessary to record and erase information in a shorter time. This requires to use a phase change material in which atoms can move faster, having an enhanced crystallization rate.

CITATION LIST

Patent Literature

PTL 1: JP 63 (1988)-225934 A
PTL 2: JP 63 (1988)-225935 A
PTL 3: JP 1 (1989)-303643 A
PTL 4: JP 2003-323743 A

SUMMARY OF INVENTION

Technical Problem

As described above, the SbTe eutectic material has a wider margin with respect to the recording linear speed and is thought to be a phase change material advantageous for increasing the transfer rate among the conventional phase change materials used for the recording layer. However, the present inventors have found a problem in that an information recording medium in which this phase change material is used has poor reliability.

Specifically, the problem is in that when recording is performed once on an information recording medium before and after a high temperature accelerated test (weathering test), the signal quality observed after the accelerated test becomes worse than that observed before the accelerated test. This is called recording-once shelf-life deterioration. A detailed analysis on the shelf-life deterioration indicates that the optimal power (recording sensitivity) in recording once is different between before and after the accelerated test. Conceivably, this is because the state of the recorded region (amorphous region) changes between before and after the accelerated test. The shelf-life deterioration became significant when the recording density and recording speed were increased. This is because a higher recording density and a higher recording speed shorten the time that can be spent raising the temperature of the recording layer at the time of recording, and thus it becomes difficult to form the marks.

A more detailed analysis indicates the present inventors that a higher content of Te worsens the shelf-life deterioration. That is, it has been found that an amount of Te contained in the SbTe eutectic material affects the shelf-life deterioration.

Moreover, such a change in the crystalline state as mentioned above causes not only the shelf-life deterioration but also archival overwrite deterioration that refers to deterioration in signal quality observed when the information recorded before the accelerated test is overwritten after the accelerated test.

These deteriorations at the accelerated test indicate that in the situation where the information recording medium actually is used, the recording layer included in the information recording medium changes over time and recording or rewriting of information thereon will be impossible in, for example, several years. That is, the information recording media undergoing the shelf-life deterioration and archival overwrite deterioration have poor reliability.

The present invention has been accomplished to solve the above-mentioned problems. The present invention is intended to provide an information recording medium vulnerable to neither the shelf-life deterioration nor the archival overwrite deterioration but has excellent reliability and satisfactory recording property, by realizing a highly-reliable phase change material whose crystalline state and amorphous state are less likely to change over time and using this phase change material for the recording layer of the information recording medium. The present invention is also intended to provide a method for producing the information recording medium, and a sputtering target used for producing the information recording medium.

Solution to Problem

In order to accomplish the foregoing objects, the present inventors found an amount of Te that is less likely to cause the shelf-life deterioration and archival overwrite deterioration when contained in the phase change material. The present inventors also found that addition of a C-element can suppress the change in the crystalline state occurring over time.

The information recording medium of the present invention is an information recording medium allowing information to be recorded thereon by irradiation with a laser beam or by application of electrical energy. The information recording medium includes a recording layer capable of undergoing a phase change by the irradiation with the laser beam or by the application of the electrical energy. The recording layer contains Sb, Te, Ge, and C, and a content of Te in the recording layer is at least 8 atom % but not more than 25 atom %.

A first method for producing an information recording medium of the present invention is a method for producing the above-mentioned information recording medium, and includes at least the step of forming the recording layer included in the information recording medium. In the step, the recording layer is formed by a sputtering method using a sputtering target containing Sb, Te, Ge, and C, a content of Te being at least 5 atom % but not more than 30 atom %.

A second method for producing an information recording medium of the present invention is a method for producing the above-mentioned information recording medium of the present invention, and includes at least the step of forming the recording layer included in the information recording medium. In the step, the recording layer is formed by sputtering simultaneously, using a plurality of power supplies, a plurality of sputtering targets that each are composed of at least one element selected from Sb, Te, Ge, and C and have different compositions from each other.

The sputtering target of the present invention is a sputtering target used for forming the recording layer included the information recording medium of the present invention. The sputtering target contains Sb, Te, Ge, and C, a content of Te being at least 5 atom % but not more than 30 atom %.

Advantageous Effects of Invention

The phase change material used for the recording layer included in the information recording medium of the present invention is less likely to change over time in the crystalline state and amorphous state and has excellent reliability. By using this phase change material for the recording layer, it is possible to realize an information recording medium having excellent reliability with suppressed shelf-life deterioration and archival overwrite deterioration while having excellent recording property and signal storage stability. With the method for producing the information recording medium and the sputtering target of the present invention, it is possible to produce an information recording medium having the above-mentioned effects.

BRIEF DESCRIPTION OF DRAWINGS

FIG. 8A shows partial cross-sectional views of an optical system and an information recording medium according to Embodiment 7 of the present invention.

FIG. 8B is a partial cross-sectional view showing a detailed configuration of the information recording medium shown in FIG. 8A.

DESCRIPTION OF EMBODIMENTS

Figure 1:
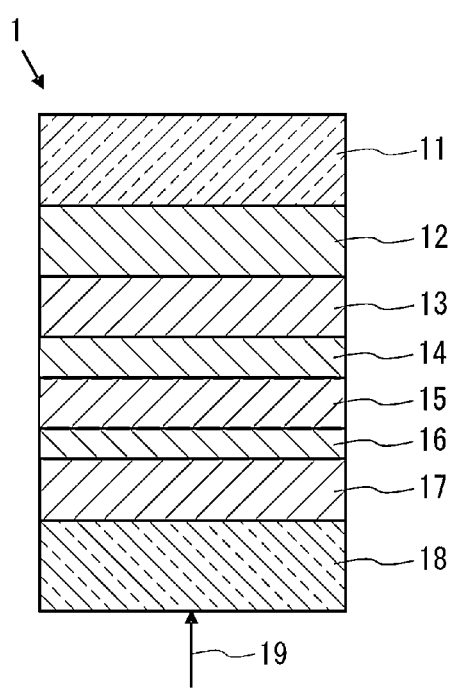
FIG. 1 is a partial cross-sectional view of an information recording medium according to Embodiment 1 of the present invention.

The information recording medium of the present invention is an information recording medium allowing information to be recorded thereon by irradiation with a laser beam or by application of electrical energy. The information recording medium includes a recording layer capable of undergoing a phase change by the irradiation with the laser beam or by the application of the electrical energy. The recording layer contains Sb, Te, Ge, and C, and a content of Te in the recording layer is at least 8 atom % but not more than 25 atom %. Use of such a recording layer (hereinafter, it may be referred to as a recording layer of the present invention) makes it possible to obtain an information recording medium having excellent reliability with suppressed shelf-life deterioration and archival overwrite deterioration while having excellent recording property and signal storage stability.

In the information recording medium of the present invention, it is possible to obtain a satisfactory crystallization ability by allowing the recording layer to contain at least 65 atom % of Sb. Thereby, the rewriting performance can be enhanced.

Moreover, in the information recording medium of the present invention, when Sb, Te, Ge, and C contained in the recording layer are represented by formula (1) below:

$$Sb_{x1}Te_{x2}Ge_{x3}C_{x4}(\text{atom \%}) \quad (1),$$

the formula (1) satisfies $x1 \geqq 65$, $8 \leqq x2 \leqq 25$, $2 \leqq x3 \leqq 20$, $0 < x4 \leqq 20$, and $x1+x2+x3+x4=100$. Use of such a recording layer makes it possible to obtain an information recording medium having excellent recording property and signal storage stability, with the shelf-life deterioration and archival overwrite deterioration suppressed further.

In this description, "$Sb_{x1}Te_{x2}Ge_{x3}C_{x4}(\text{atom \%})$" is a composition formula taking the total number of "Sb" atoms, "Te" atoms, "Ge" atoms, and "C" atoms as a reference (100 atom %). Hereinafter, the same expression will be used in the same manner.

In the information recording medium of the present invention, the content of Te preferably is equal to or higher than a content of Ge. Thereby, a high signal amplitude and satisfactory rewriting performance can obtained. Here, when the information recording medium of the present invention is an information recording medium allowing information to be recorded thereon by the irradiation with the laser beam (hereinafter, it may be referred to as an optical information recording medium), the information recording medium includes N information layers, where N is an integer satisfying $N \geqq 2$, and the N information layers are referred to as a first information layer to an N-th information layer sequentially from a side opposite to a laser beam incident side, it is desirable that at least the first information layer include the recording layer.

In the information recording medium of the present invention, the recording layer may contain further an element M, where M is at least one element selected from B, Al, Ga, In, S, Mg, Si, N, Bi, Zn, Cu, Ag, Au, Ni, Mn, Cr, W, Ti, Nb, Ta, Zr, Y, Ce, Nd, Gd, Tb, and Dy. Use of such a recording layer makes it possible to enhance further the rewriting performance, signal amplitude, and signal storage stability, and to suppress the shelf-life deterioration and archival overwrite deterioration more reliably. When Sb, Te, Ge, C and M contained in the recording layer are represented by formula (2) below:

$$Sb_{x1}Te_{x2}Ge_{x3}C_{x4}M_{x5}(\text{atom \%}) \quad (2),$$

the formula (2) satisfies preferably $x1 \geqq 65$, $8 \leqq x2 \leqq 25$, $2 \leqq x3 \leqq 20$, $0 \leqq x4 \leqq 20$, $0 < x5 \leqq 10$, and $x1+x2+x3+x4+x5=100$. By thus defining the atomic percentages of Sb, Te, Ge, C, and M contained in the recording layer, it is possible to obtain an information recording medium in which all of the properties are well balanced.

For example, when the M is at least one element selected from Si and N, the shelf-life deterioration and archival overwrite deterioration can be suppressed more reliably.

When the M is In or Zn, the signal storage stability can be enhanced further. When the M is Bi, the rewriting performance can be enhanced further. Hence, it also is preferable that the M is at least one element selected from In, Bi, and Zn.

In the information recording medium of the present invention, the recording layer contains Sb, Te, Ge, and C (alternatively, Sb, Te, Ge, C, and the element M). It is desirable that the recording layer contain Sb, Te, Ge, and C (alternatively, Sb, Te, Ge, C, and the element M) as its main component. In order to obtain the effects of the present invention more reliably, the recording layer may be formed substantially of Sb, Te, Ge, and C (alternatively, may be formed substantially of Sb, Te, Ge, C, and the element M).

When this description states that the recording layer contains Sb, Te, Ge, and C (alternatively, Sb, Te, Ge, C, and the element M) as its main component, it means that the total of atoms of Sb, Te, Ge, and C (alternatively, the total of atoms of Sb, Te, Ge, C, and the element M) is at least 93 atom %, and preferably at least 97 atom % when the total of all atoms contained in the recording layer is taken as 100 atom %. Even when the recording layer is formed substantially of Sb, Te, Ge, and C (alternatively, formed substantially of Sb, Te, Ge, C, and the element M), the recording layer may contain a trace amount (5 atom % or less, for example) of an element (such as N and Ar) other than these elements.

In the case where the information recording medium of the present invention is the optical information recording medium, and furthermore, it is a multilayered information recording medium including N information layers, where N is an integer satisfying N≧2 and the N information layers are referred to as the first information layer to the N-th information layer sequentially from the side opposite to the laser beam incident side, at least one of the information layers from the first information layer to the N-th information layer includes the recording layer. Preferably, the first information layer includes the recording layer of the present invention. This configuration is preferable particularly when the N is 2, 3, or 4, that is, when the information recording medium includes 2, 3, or 4 information layers because more excellent recording performance can be achieved in such a case.

When the information recording medium of the present invention is the optical information recording medium, the information recording medium further may include a first adjacent layer disposed adjacent to a surface of the recording layer on the side opposite to the laser beam incident side, and a second adjacent layer disposed adjacent to a surface of the recording layer on the laser beam incident side. It is desirable that at least one of the first adjacent layer and the second adjacent layer be composed of an oxide of at least one element selected from Si, Zr, Hf, Bi, Cr, In, Ga, Al, Ti, Nb, Y, Zn, and Dy. Thereby, the repetitive rewriting performance can be enhanced. In this case, the information recording medium of the present invention further may include a dielectric layer disposed on the side opposite to the laser beam incident side with respect to the recording layer. It is desirable that the dielectric layer be composed of an oxide of at least one, element selected from Si, Zr, Hf, Bi, Cr, In, Ga, Al, Ti, Nb, Y, Zn, and Dy. Thereby, more satisfactory repetitive rewriting performance can be obtained.

Moreover, when the information recording medium of the present invention is the optical information recording medium, the information recording medium further may include a reflective layer disposed on the side opposite to the laser beam incident side with respect to the recording layer. Preferably, the reflective layer mainly contains Ag. The phrase "the reflective layer mainly contains Ag" means that a content of Ag in the reflective layer is at least 90 wt %.

Next, the method for producing the information recording medium of the present invention will be described.

The first production method of the present invention is a method for producing the information recording medium of the present invention, and includes at least the step of forming the recording layer included in the information recording medium. In the step, the recording layer is formed by a sputtering method using a sputtering target containing Sb, Te, Ge, and C, a content of Te being at least 5 atom % but not more than 30 atom %. This method makes it possible to produce the information recording medium of the present invention having excellent reliability with suppressed shelf-life deterioration and archival overwrite deterioration while having excellent recording property and signal storage stability.

In the first production method of the present invention, it is preferable that the sputtering target contains at least 60 atom % of Sb. This makes it possible to form the recording layer containing at least 65 atom % of Sb, and thereby it is possible to form the information recording medium having enhanced rewriting performance and satisfactory recording property.

In the first production method of the present invention, the sputtering target further may contain an element M, where M is at least one element selected from B, Al, Ga, In, S, Mg, Si, N, Bi, Zn, Cu, Ag, Au, Ni, Mn, Cr, W, Ti, Nb, Ta, Zr, Y, Ce, Nd, Gd, Tb, and Dy. This method makes it possible to produce the information recording medium having further enhanced rewriting performance, increased signal amplitude, and enhanced signal storage stability, with the shelf-life deterioration and archival overwrite deterioration suppressed reliably.

The second production method of the present invention is a method for producing the above-mentioned information recording medium of the present invention, and includes at least the step of forming the recording layer included in the information recording medium. In the step, the recording layer is formed by sputtering simultaneously, using a plurality of power supplies, a plurality of sputtering targets that each are composed of at least one element selected from Sb, Te, Ge, and C and have different compositions from each other. This method makes it possible to produce the information recording medium of the present invention having excellent reliability with suppressed shelf-life deterioration and archival overwrite deterioration while having excellent recording property and signal storage stability.

In the step of the second production method of the present invention, the recording layer may be formed by sputtering simultaneously, using the plurality of power supplies, a plurality of sputtering targets that each are composed of at least one element selected from Sb, Te, Ge, C, and an element M, where M is at least one element selected from B, Al, Ga, In, S, Mg, Si, N, Bi, Zn, Cu, Ag, Au, Ni, Mn, Cr, W, Ti, Nb, Ta, Zr, Y, Ce, Nd, Gd, Tb, and Dy, and have different compositions from each other. This method makes it possible to produce the information recording medium having further enhanced rewriting performance, increased signal amplitude, and enhanced signal storage stability, with the shelf-life deterioration and archival overwrite deterioration suppressed reliably.

Next, the sputtering target of the present invention will be described.

The sputtering target of the present invention is a sputtering target used for forming the recording layer included in the information recording medium of the present invention. The sputtering target contains Sb, Te, Ge, and C, a content of Te being at least 5 atom % but not more than 30 atom %. Producing the recording layer with this sputtering target makes it possible to produce the information recording medium of the present invention having excellent reliability with suppressed shelf-life deterioration and archival overwrite deterioration while having excellent recording property and signal storage stability.

The sputtering target of the present invention further may contain an element M, where M is at least one element selected from B, Al, Ga, In, S, Mg, Si, N, Bi, Zn, Cu, Ag, Au, Ni, Mn, Cr, W, Ti, Nb, Ta, Zr, Y, Ce, Nd, Gd, Tb, and Dy. Producing the recording layer with this sputtering target makes it possible to produce the information recording medium having further enhanced rewriting performance, increased signal amplitude, and enhanced signal storage stability, with the shelf-life deterioration and archival overwrite deterioration suppressed reliably.

Hereinafter, embodiments of the present invention will be described with reference to the drawings. The following embodiments are examples and the present invention is not limited to these. Furthermore, in the following embodiments, the same parts are indicated with identical numerals and the same descriptions thereof may be omitted.

Embodiment 1

As Embodiment 1 of the present invention, an example of an information recording medium (optical information recording medium) on and from which information is recorded and reproduced using a laser beam will be described. FIG. 1 shows a partial cross section of the optical information recording medium.

An information recording medium 1 shown in FIG. 1 includes a reflective layer 12, a first dielectric layer 13, a first interface layer (first adjacent layer) 14, a recording layer 15, a second interface layer (second adjacent layer) 16, a second dielectric layer 17, and a cover layer 18 stacked in this order on a surface of a substrate 11. The information recording medium 1 is irradiated with, from a second dielectric layer 17 side, an energy beam (usually a laser beam) 19 so as to allow information to be recorded and reproduced thereon and therefrom.

The cover layer 18 is composed of, for example, a dielectric or a resin, such as a photocurable resin (particularly, an ultraviolet curable resin) and a slow-acting thermosetting resin, and preferably has low optical absorption with respect to the laser beam used. For the cover layer 18, glass or a resin, such as polycarbonate, amorphous polyolefin, and polymethylmethacrylate (PMMA), can be used. When these materials are used, the cover layer 18 is bonded to the second dielectric layer 17 with a resin such as a photocurable resin (particularly, an ultraviolet curable resin) and a slow-acting thermosetting resin.

The substrate 11 is a disc-shaped transparent substrate. As the material for the substrate 11, there can be used glass or a resin, such as polycarbonate, amorphous polyolefin, and polymethylmethacrylate (PMMA). A guide groove (with a track pitch of 0.32 μm) for guiding the laser beam may be formed in a surface of the substrate 11 on a recording layer 15 side, if necessary. Preferably, a surface of the substrate 11 on a side opposite to the recording layer 15 side is smooth. The substrate 11 has a thickness of approximately 500 μm to 1300 μm. However, particularly when the cover layer 18 has a thickness of approximately 100 μm, which allows satisfactory recording and reproducing to be performed at an numerical aperture (NA) of 0.85, the substrate 11 preferably has a thickness in the range of 1050 μm to 1150 μm.

The reflective layer 12 is disposed on the side opposite to the laser beam incident side with respect to the recording layer 15, and has an optical function of increasing the amount of light to be absorbed by the recording layer 15. Furthermore, the reflective layer 12 also has a thermal function of diffusing quickly the heat generated in the recording layer 15 and facilitating amorphization of the recording layer 15. Moreover, the reflective layer 12 also has a function of protecting the multilayer film from the environment in which the medium is used.

As the material for the reflective layer 12, there can be used a single metal with a high thermal conductivity, such as Ag, Au, Cu, Al, Pt, Ti, and W. Furthermore, it also is possible to use: an Al alloy obtained by adding, for example, Cr, Ni, or Ti to Al; an Au alloy obtained by adding, for example, Cu, Cr, or Nd to Au; an Ag alloy obtained by adding, for example, Cu, Pd, Ga, In, or Nd to Ag; an Ag alloy obtained by adding, for example, Pd, Ti, Ru, Al, Au, Ni, Nd, Ga, Ca, In, Gd, or Y to Ag—Cu; an Ag alloy obtained by adding, for example, Au or Pd to Ag—Nd; or an Ag alloy obtained by adding, for example, Sn or Ga to Ag—In. It also is possible to use an alloy such as Ag—Ga—Sn, Ag—Ga—Y, Ag—Ga—Al, Ag—Zn—Al, and Cu—Si. Particularly, Ag alloys are preferable as the material for the reflective layer 12 because they have high thermal conductivities. Preferably, the Ag alloy used here is an alloy that mainly contains Ag and the concentration of another element added is 5 wt % or less. Preferably, the reflective layer 12 has a thickness of at least 30 nm, which allows it to have a sufficient thermal diffusion function. Even in this range, when the reflective layer 12 has a thickness larger than 240 nm, its thermal diffusion function becomes excessively strong and the recording sensitivity is lowered. Thus, it is more preferable that the reflective layer 12 has a thickness in the range of 30 nm to 240 nm.

The first dielectric layer 13 has a function of adjusting an optical distance to increase the optical absorptance of the recording layer 15, and a function of increasing the rate of change in an amount of reflected light between before and after recording to increase the signal amplitude. The first dielectric layer 13 also has a function of diffusing quickly the heat generated in the recording layer 15 into the reflective layer 12 to cool the recording layer 15. When this thermal diffusion is highly effective, the thermal load on the recording layer 15 is reduced and thereby satisfactory repeated rewriting property can be obtained. As the material for the first dielectric layer 13, there can be used an oxide such as $SiO_2$, $ZrO_2$, $ZrSiO_4$, $HfO_2$, $ZnO$, $Cr_2O_3$, $In_2O_3$, $Ga_2O_3$, $Al_2O_3$, $TiO_2$, $Nb_2O_5$, $Y_2O_3$, $Bi_2O_3$, $CeO_2$, and $Dy_2O_3$, a nitride such as CN, TiN, ZrN, $Si_3N_4$, GeN, AlN, Ge—Si—N, and Ge—Cr—N, a carbide such as SiC, a sulfide such as ZnS, and a fluoride such as $LaF_3$, $CeF_3$, and $YF_3$. Among these, it is desirable that the first dielectric layer 13 be composed of an oxide of at least one element selected from Si, Zr, Hf, Bi, Cr, In, Ga, Al, Ti, Nb, Y, Zn, and Dy because it can enhance the repetitive rewriting performance further. Or the first dielectric layer 13 may be composed of a mixture of materials selected from these. Specifically, examples thereof include $ZrO_2$—$Y_2O_3$ (stabilized zirconia or partially stabilized zirconia), $ZrO_2$—$Cr_2O_3$, $ZrO_2$—$SiO_2$—$Cr_2O_3$, $ZrO_2$—$Y_2O_3$—$Cr_2O_3$, $ZrSiO_4$—$Cr_2O_3$, $ZrO_2$—$SiO_2$—$ZnO$, $ZrO_2$—$In_2O_3$, $ZrO_2$—$SiO_2$—$In_2O_3$, $ZrO_2$—$Y_2O_3$—$In_2O_3$, $ZrO_2$—$SiO_2$—$In_2O_3$—$Cr_2O_3$, $HfO_2$—$Cr_2O_3$, $HfO_2$—$SiO_2$—$Cr_2O_3$, $ZrO_2$—$Ga_2O_3$, $ZrO_2$—$SiO_2$—$Ga_2O_3$, $ZrO_2$—$SiO_2$—$Ga_2O_3$—$Cr_2O_3$, $ZrO_2$—$Al_2O_3$, $ZrO_2$—$TiO_2$, $SiO_2$—$TiO_2$, $TiO_2$—$Nb_2O_5$, $ZrO_2$—$Nb_2O_5$, $ZrO_2$—$SiO_2$—$Al_2O_3$, $ZrO_2$—$Dy_2O_3$, $ZrO_2$—$SiO_2$—$Dy_2O_3$, $In_2O_3$—$Dy_2O_3$, $Bi_2O_3$—$SiO_2$, $TiO_2$—$CeO_2$, $ZrO_2$—$AlN$, $Al_2O_3$—$AlN$, $ZrO_2$—$Cr_2O_3$—$SiC$, $ZrO_2$—$SiO_2$—$ZnS$, $SiO_2$—$ZnS$, $ZrO_2$—$SiO_2$—$LaF_3$, $ZrO_2$—$SiO_2$—$Cr_2O_3$—$LaF_3$, $ZrO_2$—$CeF_3$, $ZrO_2$—$SiO_2$—$CeF_3$, $ZrO_2$—$SiO_2$—$Cr_2O_3$—$CeF_3$, $Dy_2O_3$—$CeF_3$, and $ZrO_2$—$Dy_2O_3$—$CeF_3$. Preferably, the first dielectric layer 13 has a thickness of 2 nm to 50 nm, and more preferably 3 nm to 40 nm in order to increase further the rate of change in the amount of reflected light.

The first interface layer 14 and the second interface layer 16 serve as barriers that prevents the diffusion of elements from the first dielectric layer 13 and the second dielectric layer 17 into the recording layer 15 and prevents the entry of moisture into the recording layer 15. The diffusion of elements from the dielectric layers 13 and 17 deteriorates the rewriting property because the crystallization rate of the recording layer 15 is lowered, and deteriorates the signal storage stability because the crystallization temperature is lowered. For example, when ZnS—SiO$_2$ is used for the first dielectric layer 13, an S-element is diffused into the recording layer 15 during recording and the crystallization rate is lowered, deteriorating the rewriting property.

Since the first interface layer 14 and the second interface layer 16 are provided in contact with the recording layer 15, they also have a function of accelerating or suppressing the crystallization rate of the recording layer 15. Moreover, it is desirable that the first interface layer 14 and the second interface layer 16 each have excellent adhesiveness with the recording layer 15. Preferably, a material with low optical absorption is used for the first interface layer 14 and the second interface layer 16. As the material for these interface layers, there can be used an oxide such as SiO$_2$, ZrO$_2$, ZrSiO$_4$, HfO$_2$, ZnO, Cr$_2$O$_3$, In$_2$O$_3$, Ga$_2$O$_3$, Al$_2$O$_3$, TiO$_2$, Nb$_2$O$_5$, Y$_2$O$_3$, Bi$_2$O$_3$, CeO$_2$, and Dy$_2$O$_3$, a nitride such as CN, TiN, ZrN, Si$_3$N$_4$, GeN, AlN, Ge—Si—N, and Ge—Cr—N, a carbide such as SiC, a sulfide such as ZnS, and a fluoride such as LaF$_3$, CeF$_3$, and YF$_3$. Or it may be a mixture of materials selected from these. Among these cases, it is preferable when the first interface layer 14 and the second interface layer 16 each contain an oxide of at least one element selected from Si, Zr, Hf, Bi, Cr, In, Ga, Al, Ti, Nb, Y, Zn, and Dy because their adhesiveness with the recording layer 15 is enhanced further, and thereby satisfactory repetitive rewriting performance can be realized. Specifically, there can be mentioned ZrO$_2$—Y$_2$O$_3$ (stabilized zirconia or partially stabilized zirconia), ZrO$_2$—Cr$_2$O$_3$, ZrO$_2$—SiO$_2$—Cr$_2$O$_3$, ZrO$_2$—Y$_2$O$_3$—Cr$_2$O$_3$, ZrSiO$_4$—Cr$_2$O$_3$, ZrO$_2$—SiO$_2$—ZnO, ZrO$_2$—In$_2$O$_3$, ZrO$_2$—SiO$_2$—In$_2$O$_3$, ZrO$_2$—Y$_2$O$_3$—In$_2$O$_3$, ZrO$_2$—SiO$_2$—In$_2$O$_3$—Cr$_2$O$_3$, HfO$_2$—Cr$_2$O$_3$, HfO$_2$—SiO$_2$—Cr$_2$O$_3$, ZrO$_2$—Ga$_2$O$_3$, ZrO$_2$—SiO$_2$—Ga$_2$O$_3$, ZrO$_2$—SiO$_2$—Ga$_2$O$_3$—Cr$_2$O$_3$, ZrO$_2$—Al$_2$O$_3$, ZrO$_2$—TiO$_2$, SiO$_2$—TiO$_2$, ZrO$_2$—Nb$_2$O$_5$, ZrO$_2$—SiO$_2$—Al$_2$O$_3$, ZrO$_2$—Dy$_2$O$_3$, ZrO$_2$—SiO$_2$—Dy$_2$O$_3$, In$_2$O$_3$—Dy$_2$O$_3$, Bi$_2$O$_3$—SiO$_2$, TiO$_2$—CeO$_2$, ZrO$_2$—AlN, Al$_2$O$_3$—AlN, ZrO$_2$—SiC, ZrO$_2$—Cr$_2$O$_3$—SiC, ZrO$_2$—SiO$_2$—ZnS, SiO$_2$—ZnS, ZrO$_2$—SiO$_2$—LaF$_3$, ZrO$_2$—SiO$_2$—Cr$_2$O$_3$—LaF$_3$, ZrO$_2$—CeF$_3$, ZrO$_2$—SiO$_2$—CeF$_3$, ZrO$_2$—SiO$_2$—Cr$_2$O$_3$—CeF$_3$, and Dy$_2$O$_3$—CeF$_3$. Preferably, the first interface layer 14 and the second interface layer 16 have a thickness of 1 nm to 12 nm. When the interface layers 14 and 16 are excessively thin, a sufficient barrier effect cannot be obtained, which causes the diffusion of elements and/or entry of moisture into the recording layer 15 and deteriorates the signal quality. When they are too thick, the effect of accelerating or suppressing the crystallization of the recording layer 15 becomes excessively high, deteriorating the recording and reproducing properties. Thus, it is further preferable that the first interface layer 14 and the second interface layer 16 have a thickness of 2 nm to 10 nm. The first interface layer 14 does not necessarily have to be provided in the case where, for example, there is no possibility of the diffusion of elements from the first dielectric layer 13 occurring, as will be described in Embodiment 2.

The second dielectric layer 17 has a function of protecting the recording layer 15 from moisture, etc., and like the first dielectric layer 13, it has a function of adjusting the optical distance to increase the optical absorptance of the recording layer 15 and a function of increasing the rate of change in the amount of reflected light between before and after recording so as to increase the signal amplitude. For the second dielectric layer 17, it is possible to use, for example, an oxide such as ZrO$_2$, HfO$_2$, SiO$_2$, MgO, ZnO, TiO$_2$, Nb$_2$O$_2$, Ta$_2$O$_5$, and Al$_2$O$_3$, a nitride such as CN, TiN, ZrN, Si$_3$N$_4$, GeN, AlN, Ge—Si—N, and Ge—Cr—N, a sulfide such as ZnS, and a carbide such as SiC. Among these materials, a mixture of ZnS and SiO$_2$ particularly is excellent as the material to be used for the second dielectric layer 17 because it is an amorphous material and has a high deposition rate and refractive index, and satisfactory mechanical strength and moisture resistance. The thickness of the second dielectric layer 17 can be determined by calculation based on a matrix method (see, for example, Hiroshi Kubota, "Wave Optics", Iwanami Shoten, 1971, Chapter 3) so that the following conditions are satisfied: the optical absorptance of the recording layer 15 is increased, and the rate of change in amount of reflected light between the case where the recording layer 15 is in a crystalline phase and the case where it is in an amorphous phase is increased. Specifically, it is desirable that the second dielectric layer 17 has a thickness in the range of 10 nm to 150 nm, and more preferably in the range of 25 nm to 80 nm.

The recording layer 15 is a part that characterizes the present invention. The recording layer 15 is formed of a material that undergoes a phase change by irradiation with the laser beam 19. The recording layer 15 contains Sb, Te, Ge, and C. A content of Te in the recording layer 15 is at least 8 atom % but not more than 25 atom %. As for other components in the recording layer 15, a content of Sb may be at least 60 atom %, a content of Ge may be at least 1 atom % but not more than 25 atom %, and a content of C may be more than 0 atom % but not more than 25 atom %, for example.

A major role of each of the elements contained in this Sb—Te—Ge—C phase change material is as follows. Sb controls the crystallization ability of the recording layer between when it is in the crystalline phase and when it is in the amorphous phase. Te controls the optical change (changes in the refractive index and extinction coefficient) between the crystalline phase and the amorphous phase. Ge controls the stability (crystallization temperature) of the amorphous phase. Sb, Te, and Ge bond to each other in the crystalline phase and the amorphous phase. In contrast, C does not bond to Sb—Te—Ge. C bonds to each other and is present in the crystalline phase and an amorphous phase while being isolated from Sb—Te—Ge. Thus, C can suppress the structural change of Sb—Te—Ge occurring over time. A comparison between the role of each of these elements and the properties of the information recording medium indicates that the amount of Sb can control the rewritability, the amount of Te can control the signal amplitude (quality of reproduced signal), the amount of Ge can control the signal storage stability, and the amount of C can suppress the shelf-life deterioration and archival overwrite deterioration. Use of the recording layer 15 formed of such a material can suppress the shelf-life deterioration and archival overwrite deterioration on the information recording medium and allows the medium to have satisfactory recording property and signal storage stability.

The recording layer 15 cannot contain a large amount of Te because it has been known from the experiments by the present inventors that an excess amount of Te increases the shelf-life deterioration and archival overwrite deterioration. Therefore, the amount of Te contained in the recording layer 15 is set to 25 atom % or less. In contrast, when the amount of Te is less than 8 atom %, a satisfactory quality of reproduced signal cannot be obtained. Therefore, the amount of Te contained in the recording layer 15 is set to at least 8 atom %.

In order to enhance the crystallization ability and obtain satisfactory rewriting property, the recording layer 15 preferably contains at least 65 atom % of Sb.

In order to obtain satisfactory signal storage stability, the recording layer 15 preferably contains at least 2 atom % of Ge. However, when the recording layer 15 contains an excess amount of Ge, the crystallization ability is lowered. Thus, the amount of Ge contained in the recording layer 15 preferably is 20 atom % or less.

As described above, the shelf-life deterioration and archival overwrite deterioration can be suppressed by allowing the recording layer 15 to contain C. However, an excess amount of C results in reduced amounts of Te and Ge in the recording layer 15, deteriorating the signal amplitude and signal storage stability. Thus, the recording layer 15 preferably contains 20 atom % or less of C.

When the above-mentioned preferable contents of the components contained in the recording layer 15 are represented by a formula $Sb_{x1}Te_{x2}Ge_{x3}C_{x4}$ (atom %), X1, X2, X3, and X4 preferably satisfy x1≧65, 8≦x2≦25, 2≦x3≦20, 0<x4<20 and x1+x2+x3+x4=100.

In order to enhance further the crystallization ability, the recording layer 15 may contain Bi that belongs to the same family as that of Sb in the periodic table. Since Bi has a higher crystallization ability than that of Sb, it is preferable that the recording layer 15 contains Bi even in a small amount so as to be rewritable at a higher linear velocity in the future. Moreover, in order to increase further the amount of optical change, the recording layer 15 may contain S that belongs to the same family as that of Te. In order to achieve further the stability of the amorphous phase, the recording layer 15 may contain an element M, where M is at least one element selected from Al, Ga, In, Mg, Zn, Cu, Ag, Au, Ni, Mn, Cr, W, Ti, Nb, Ta, Zr, Y, Ce, Nd, Gd, Tb, and Dy. Among these elements, In and Zn can stabilize the amorphous phase even when contained in small amounts, and thus it is more preferable for the recording layer 15 to contain them from the view point of signal storage stability. Furthermore, in order to suppress the structural change occurring over time, the recording layer 15 may contain Si that belongs to the same family as that of C, or B or N that is less likely to bond to Sb that is a main component (a component contained most in the recording layer 15). Among these elements, Si and N are more preferable because B is highly reactive with moisture under a high temperature.

Hence, the phase change material to be used for the recording layer 15 may be a phase change material represented by $Sb_{x1}Te_{x2}Ge_{x3}C_{x4}M_{x5}$ (atom %), where M is at least one element selected from B, Al, Ga, In, S, Mg, Si, N, Bi, Zn, Cu, Ag, Au, Ni, Mn, Cr, W, Ti, Nb, Ta, Zr, Y, Ce, Nd, Gd, Tb, and Dy. For example, there can be mentioned Sb—Te—Ge—C—Bi, Sb—Te—Ge—C—In, Sb—Te—Ge—C—Zn, Sb—Te—Ge—C—Si, Sb—Te—Ge—C—N, Sb—Te—Ge—C—Bi—In, Sb—Te—Ge—C—Si—N, Sb—Te—Ge—C—Bi—Si, Sb—Te—Ge—C—In—Si, Sb—Te—Ge—C—N—In, Sb—Te—Ge—C—Si—Zn, Sb—Te—Ge—C—Si—Ag, Sb—Te—Ge—N—Al, Sb—Te—Ge—N—Cr, Sb—Te—Ge—N—Zr, Sb—Te—Ge—C—Bi—Ga, Sb—Te—Ge—C—Si—Ga, Sb—Te—Ge—C—Bi—Mn, Sb—Te—Ge—C—Bi—Ta, Sb—Te—Ge—C—Si—Dy, Sb—Te—Ge—C—Bi—Si—N, and Sb—Te—Ge—C—In—Bi—Si. Among these phase change materials, a phase change material in which the element M is at least one element selected from Si and N, or at least one element selected from In, Bi, and Zn particularly is preferable to be used for the recording layer 15.

As mentioned above, Bi can increase the crystallization ability even when contained in a small amount, but it makes the stability of the amorphous phase poor at the same time. Although In can stabilize the amorphous phase even when contained in a small amount, it lowers the crystallization ability at the same time. Accordingly, when the recording layer 15 contains a large amount of the element M, the signal storage stability is lowered and the rewriting performance is deteriorated. Thus, the content of the element M preferably is 10 atom % or less. When the contents of the components contained in the recording layer 15 are represented by a formula $Sb_{x1}Te_{x2}Ge_{x3}C_{x4}M_{x5}$ (atom %), x1, x2, x3, x4, and x5 preferably satisfy x1≧65, 8≦x2≦25, 2≦x3≦20, 0<x4≦20, 0<x5≦10, and x1+x2+x3+x4+x5=100.

Preferably, the recording layer 15 contains: Sb, Te, Ge, and C; or Sb, Te, Ge, C, and the element M, as its main component. Alternatively, the recording layer 15 may be formed of Sb, Te, Ge, and C; or Sb, Te, Ge, C, and the element M. Even in this case, the recording layer 15 may contain an element other than Sb, Te, Ge, C, and the element M as long as a content thereof is 5 atom % or less.

The recording layer 15 preferably has a thickness of 25 nm or less because an excess thickness thereof increases the heat capacity, requiring a higher recording power. In order to obtain a satisfactory amount of optical change, it is more preferable that the recording layer 15 has a thickness of at least 2 nm but not more than 20 nm.

Next, a method for producing the information recording medium 1 described in the present embodiment will be described.

The reflective layer 12, the first dielectric layer 13, the first interface layer 14, the recording layer 15, the second interface layer 16, and the second dielectric layer 17 can be formed by a sputtering method, which is one of vapor phase film forming methods. First, the substrate 11 (with a thickness of 1100 µm, for example) is set in a film forming apparatus.

Subsequently, the reflective layer 12 is formed first. Here, when the substrate 11 has a guide groove, the reflective layer 12 is formed on a surface of the substrate on which the groove is formed. The reflective layer 12 is formed by sputtering a target made of metal or an alloy that composes the reflective layer 12, in an atmosphere of a rare gas (for example, it may be any one of Ar gas, Kr gas, and Xe gas. Among them, the Ar gas, which is inexpensive, preferably is used. This also applies to the rare gas to be described later.) or an atmosphere of a mixed gas of rare gas and reactive gas (oxygen gas or nitrogen gas, for example).

Subsequently, the first dielectric layer 13 is formed on the reflective layer 12. The first dielectric layer 13 can be formed by sputtering a target made of a mixture that composes the second dielectric layer 13, in a rare gas atmosphere or in an atmosphere of a mixed gas of rare gas and reactive gas.

Next, the first interface layer 14 is formed on the first dielectric layer 13. The first interface layer 14 can be formed by sputtering a sputtering target made of a mixture that composes the first interface layer 14, in a rare gas atmosphere or in an atmosphere of a mixed gas of rare gas and reactive gas. Alternatively, the first interface layer 14 can be formed by sputtering reactively a sputtering target containing a metal element that composes the first interface layer 14, in an atmosphere of a mixed gas of rare gas and reactive gas.

Subsequently, the recording layer 15 is formed on the first interface layer 14. The recording layer 15 can be formed by sputtering a sputtering target made of a material such as an Sb—Te—Ge—C alloy and an Sb—Te—Ge—C-M alloy in accordance with the composition of the recording layer 15, in a rare gas atmosphere, in an atmosphere of a mixed gas of rare gas and reactive gas, or in an atmosphere of a mixed gas of Kr and reactive gas. Preferably, this sputtering target contains at least 5 atom % but not more than 30 atom % of Te. The recording layer 15 can be formed also by sputtering sputtering targets made of Sb, Te, Ge, C, and the element M, respectively, at the same time using a plurality of power supplies. The recording layer 15 can be formed also by sputtering targets, such as a binary-composition sputtering target and a ternary composition sputtering target, containing elements selected from Sb, Te, Ge, C, and the element M in combination, at the same time using a plurality of power supplies. Also in these cases, the recording layer 15 can be formed by the sputtering in a rare gas atmosphere, in an atmosphere of a mixed gas of rare gas and reactive gas, or in an atmosphere of a mixed gas of Kr and reactive gas.

Subsequently, the second interface layer 16 is formed on the recording layer 15. The second interface layer 16 can be formed by sputtering a sputtering target made of a mixture that composes the second interface layer 16, in a rare gas atmosphere or in an atmosphere of a mixed gas of rare gas and reactive gas. Alternatively, the second interface layer 16 can be formed by sputtering reactively a sputtering target containing a metal element that composes the second interface layer 16, in an atmosphere of a mixed gas of rare gas and reactive gas.

Subsequently, the second dielectric layer 17 is formed on the second interface layer 16. The second dielectric layer 17 can be formed by sputtering a sputtering target made of a mixture that composes the second dielectric layer 17, in a rare gas atmosphere or in an atmosphere of a mixed gas of rare gas and reactive gas. Alternatively, the second dielectric layer 17 can be formed by sputtering reactively a sputtering target containing a metal element that composes the second dielectric layer 17, in an atmosphere of a mixed gas of rare gas and reactive gas.

The power supply to be used in each of the above-mentioned sputtering processes can be a direct current (DC) power supply or a radio frequency (RF) power supply. The supply power may be 1 W to 10 kW. The sputtering performed using the DC power supply is referred to as "DC sputtering", and the sputtering performed using the RF power supply is referred to as "RF sputtering".

The pressure inside the film formation chamber during sputtering can be 0.01 Pa to 50 Pa, for example.

Finally, the cover layer 18 is formed on the second dielectric layer 17. The cover layer 18 can be formed by applying a resin, such as a photocurable resin (particularly, an ultraviolet curable resin) and a slow-acting thermosetting resin, to the first dielectric layer 17, performing spin coating, and then curing the resin. As the cover layer 18, a disc-shaped substrate made of glass or a resin, such as polycarbonate, amorphous polyolefin, and PMMA, may be used. In this case, the cover layer 18 can be formed by applying a resin, such as a photocurable resin (particularly, an ultraviolet curable resin) and a slow-acting thermosetting resin, to the second dielectric layer 17, placing the substrate thereon, spreading the resin uniformly by spin coating, and curing the resin.

Besides the sputtering method, a vacuum vapor deposition method, an ion plating method, a chemical vapor deposition method (CVD method), and a molecular beam epitaxy method (MBE method) also can be used as the method for forming each of the layers.

After the formation of the second dielectric layer 17 or the cover layer 18, an initialization process can be performed for crystallizing the entire surface of the recording layer 15, if necessary. The initialization process can be performed by irradiation with a laser beam. Preferably, the laser beam used for the initialization has a wavelength of 790 nm to 830 nm in order to shorten the time required for the initialization by increasing the beam width and lower the production cost of the information recording medium.

Embodiment 2

Figure 2:
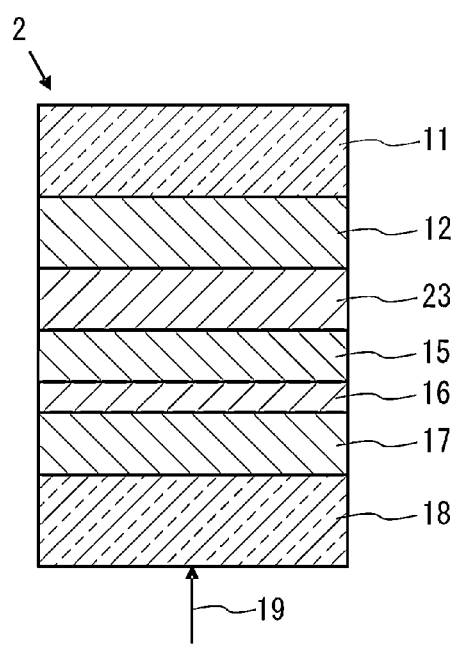
FIG. 2 is a partial cross-sectional view of an information recording medium according to Embodiment 2 of the present invention.

As Embodiment 2 of the present invention, another example of the optical information recording medium on and from which information is recorded and reproduced using a laser beam will be described. FIG. 2 shows a partial cross-sectional view of the optical information recording medium.

An information recording medium 2 shown in FIG. 2 includes the reflective layer 12, a first dielectric layer 23, the recording layer 15, the second interface layer 16, the second dielectric layer 17, the cover layer 18 stacked in this order on the surface of the substrate 11. The information recording medium 2 is irradiated with, from the second dielectric layer 17 side, the energy beam (usually the laser beam) 19 so as to allow information to be recorded and reproduced thereon and therefrom.

The substrate 11, the reflective layer 12, the recording layer 15, the second interface layer 16, the second dielectric layer 17, and the cover layer 18 are identical to those of Embodiment 1, respectively, in terms of material, function, and shape.

The material for the first dielectric layer 23 also can be selected from the materials that can be used for the first dielectric layer 13 described in Embodiment 1. However, the first dielectric layer 23 serves as the first adjacent layer that is in contact with the recording layer 15. More specifically, the first dielectric layer 23 needs not only to have the function of the first dielectric layer 13 of Embodiment 1 but also to have the effect of accelerating or suppressing the crystallization rate of the recording layer 15 because it is provided in contact with the recording layer 15. Moreover, it is desired that the first dielectric layer 23 has excellent adhesiveness with the recording layer 15. Therefore, it is more preferable that the material for the first dielectric layer 23 is the same as that used for the first interface layer 14 of Embodiment 1. The thickness of the first dielectric layer 23 can be determined by a calculation based on the matrix method as in Embodiment 1. Specifically, it is desirable that the thickness fall in the range of 2 nm to 80 nm, and more preferably in the range of 4 nm to 45 nm.

Next, a method for producing the information recording medium 2 described in the present embodiment will be explained.

First, the substrate 11 (with a thickness of 1100 μm, for example) is set in a film forming apparatus.

Subsequently, the reflective layer 12, the first dielectric layer 23, the recording layer 15, the second interface layer 16, and the second dielectric layer 17 are formed sequentially. The methods for forming these layers are the same as those described in Embodiment 1, respectively. The first dielectric layer 23 can be formed by the same method as that used for forming the first dielectric layer 13 of Embodiment 1. Finally, the cover layer 18 is formed by the same method as in Embodiment 1.

After the formation of the second dielectric layer 17 or the cover layer 18, the initialization process can be performed for crystallizing the entire surface of the recording layer 15, if necessary. The initialization process can be performed by irradiation with a laser beam. Preferably, the laser beam used for the initialization has a wavelength of 790 nm to 830 nm in order to shorten the time required for the initialization by increasing the beam width and lower the production cost of the information recording medium.

Embodiment 3

Figure 3:
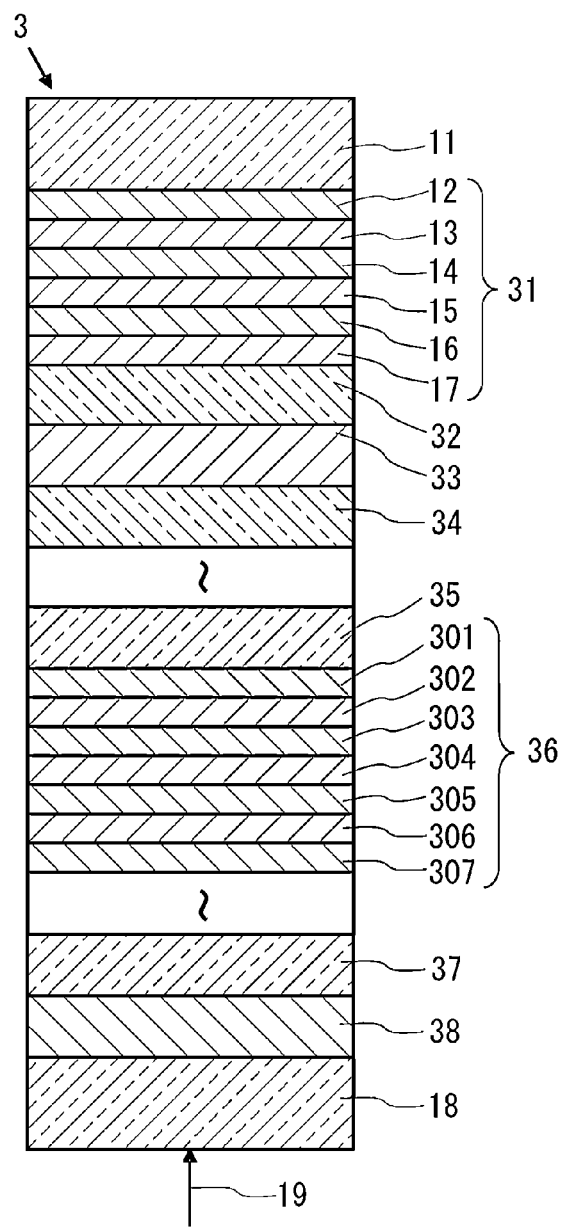
FIG. 3 is a partial cross-sectional view of an information recording medium according to Embodiment 3 of the present invention.

As Embodiment 3 of the present invention, another example of the optical information recording medium on and from which information is recorded and reproduced using a laser beam will be described. FIG. 3 shows a partial cross-sectional view of the optical information recording medium. The information recording medium 3 of the present embodiment includes N information layers, where N is an integer of 2 or more, on and from which information is recorded and reproduced. It is a multilayer optical information recording medium in which information can be recorded on and reproduced from each information layer by irradiation with the energy beam (usually, the laser beam) 19 from one side. The information recording medium 3 is provided with a first information layer 31 to an N-th information layer 38 that are stacked sequentially, with optical separation layers 32, 34, 35, 37, etc. interposed therebetween.

The substrate 11 and the cover layer 18 are identical to those described in Embodiment 1, respectively, in terms of material, function, and shape.

The optical separation layers 32, 34, 35, 37, etc. each are composed of, for example, a dielectric or a resin, such as a photocurable resin (particularly, an ultraviolet curable resin) and a slow-acting thermosetting resin, and preferably has low optical absorption with respect to the laser beam used. The optical separation layers 32, 34, 35, 37, etc. are provided for differentiating the focal positions on the first information layer 31, the second information layer 33, the n-th information layer 36 (here, n is an integer satisfying $3 \leq n \leq N-1$) and the N-th information layer 38. The optical separation layers 32, 34, 35, 37, etc. each need to have a thickness equal to or larger than focal depth $\Delta Z$ that is determined according to the numerical aperture (NA) of an objective lens and wavelength $\lambda$ of the laser beam. Assuming that the reference of the optical intensity at a focal point is 80% of the optical intensity in the case of aberration free, $\Delta Z$ can be approximated by $\Delta Z = \lambda / \{2(NA)^2\}$. The optical separation layers 32, 34, 35, 37, etc. may have a guide groove formed on the laser beam incident side.

First, the configuration of the first information layer 31 will be described. The first information layer 31 includes the reflective layer 12, the first dielectric layer 13, the first interface layer 14, the recording layer 15, the second interface layer 16, the second dielectric layer 17 stacked sequentially on the surface of the substrate 11. The substrate 11, the reflective layer 12, the first dielectric layer 13, the first interface layer 14, the recording layer 15, the second interface layer 16, and the second dielectric layer 17 are identical to those described in Embodiment 1, respectively, in terms of material, function, and shape. In the first information layer 31, the first interface layer 14 can be provided, if needed, when, for example, the diffusion of elements from the first dielectric layer 17 occurs as described in Embodiment 1.

Next, the configuration of the n-th information layer 36 will be described. The n-th information layer 36 includes a transmittance adjusting layer 301, a reflective layer 302, a first dielectric layer 303, a first interface layer 304, a recording layer 305, a second interface layer 306, and a second dielectric layer 307 stacked sequentially on a surface of the optical separation layer 35.

The transmittance adjusting layer 301 has a function of adjusting the transmittance of the n-th information layer 36. With this layer, it is possible to increase both transmittance $T_c$ (%) of the n-th information layer 36 given when the recording layer 305 is in the crystalline state, and transmittance $T_a$ (%) of the n-th information layer 36 given when the recording layer 305 is in the amorphous state. Specifically, when the transmittance adjusting layer 301 is provided, $T_c$ and $T_a$ can be increased by 2% to 10% from those in the case where the transmittance adjusting layer 301 is absent. Furthermore, the transmittance adjusting layer 301 also has a function of diffusing quickly the heat generated in the recording layer 304 into the reflective layer 302 to cool the recording layer 305. In order to increase the transmittance further, refractive index $n_1$ and extinction coefficient $k_1$ of the transmittance adjusting layer 301 satisfy preferably $n_1 \geq 2.0$ and $k_1 \leq 0.1$, and further preferably $2.0 \leq n_1 \leq 3.0$ and $k_1 \leq 0.05$. For the transmittance adjusting layer 301, it is possible to use an oxide such as $TiO_2$, $ZrO_2$, $HfO_2$, $ZnO$, $Nb_2O_5$, $Ta_2O_5$, $Bi_2O_3$, $Y_2O_3$, and $CeO_2$, and a nitride such as Ti—N, Zr—N, Nb—N, Ta—N, Si—N, Ge—N, Cr—N, Al—N, Ge—Si—N, and Ge—Cr—N. Preferably, thickness d1 of the transmittance adjusting layer 301 satisfies $(1/16) \lambda/n1 \leq d1 \leq (7/32) \lambda/n1$ or $(9/16) \lambda/n1 \leq d1 \leq (21/32) \lambda/n1$.

The reflective layer 302 can be formed using the same material as that used for the reflective layer 12 described in Embodiment 1 and also is identical thereto in terms of function and shape. Preferably, the reflective layer 302 has a thickness of 20 nm or less to allow the n-th information layer 36 to have transmittance.

As the material for the first dielectric layer 303, the material used for the first dielectric layer 13 in Embodiment 1 can be used. The first dielectric layer 303 has a function of adjusting the optical distance to increase the optical absorbance of the recording layer 305 and a function of increasing the rate of change in the amount of reflected light between before and after recording to increase the signal amplitude. Furthermore, it also has a function of diffusing quickly the heat generated in the recording layer 305 into the reflective layer 302 to cool the recording layer 305. The thickness of the first dielectric layer 303 can be determined by a calculation based on the matrix method, and preferably falls within the range of 3 nm to 30 nm.

The first interface layer 304 can be formed using the same material as that used for the first interface layer 14 described in Embodiment 1 and also is identical thereto in terms of function and shape. The first interface layer 304 can be provided, if needed, when, for example, the diffusion of elements from the first dielectric layer 303 occurs.

The recording layer 305 can be formed using the same material as that used for the recording layer 15 described in Embodiment 1 and also is identical thereto in terms of function and shape. However, it is preferable that the recording layer 305 is as thin as possible to increase its transmittance with respect to the laser beam. Preferably, the recording layer 305 has a thickness of 10 nm or less in the second and third information layers, and has a thickness of 4 nm or less in the fourth information layer or beyond.

In the case of the multilayer optical information recording medium with N information layers, when the phase change material of the present invention (the material used for the recording layer 15 in Embodiment 1) is used for the recording layer of at least one of the N information layers, the materials used for the recording layers of the other information layers are not limited to the phase change material of the present invention. Examples of phase change materials other than the phase change material of the present invention include a material represented by composition formula: $Ge_r M1_s M2_t Te_{100-(r+s+t)}$ (atom %). M1 is an element selected from Sb, Bi, and Sn. M2 is an element selected from Si, Ti, V, Fe, Co, Ni, Cu, Zr, Nb, Mo, Se, Ru, Rs, Pd, Mn, Ag, Al, Cr, Sn, Ga, In, Ta, Dy, Gd, Td, Os, Ir, W, Pt, and Au. Preferably, r satisfies $30 \leq r \leq 50$, s satisfies $35 \leq s \leq 60$, and t satisfies $0 \leq t \geq 20$. Besides these materials, a material containing Sb and M3 can be used, for example, where M3 is at least one element selected from Al, V, Mn, Ga, Ge, Se, Ag, In, Sn, Te, Pb, Bi, C, Si, Zn, and Au, except for the phase change material of the present invention. Using these materials for the recording layer makes it possible to increase the difference in reflectance between the information recording medium in the crystalline phase and that in the amorphous phase, and obtain satisfactory recording and reproducing properties. Particularly, the material represented by $Ge_rM1_sM2_tTe_{100-(r+s+t)}$ (atom %) has satisfactory signal storage stability, and also has excellent repeated rewriting performance even when it is formed thin. Thus, it is suitable as the material for the recording layers of the other information layers (the information layers in which the recording layer is not formed of the phase change material of the present invention).

The recording layers of the other information layers can be formed of irreversible phase change material. As the irreversible phase change material, it is preferable to use, for example, TeOx+M3, where M3 is an element such as Pd, Ge, Si, and Bi, as disclosed in JP 7 (1995)-25209 A (JP 2006849 B), for example. When the recording layers of the other information layers are formed of irreversible phase change material, the medium is a write-once information recording medium on which information can be written only once. The present invention suitably can be applied also to such an information recording medium in order to reduce the problems of recording sensitivity and signal storage stability.

The second interface layer 306 can be formed using the same material as that used for the second interface layer 16 described in Embodiment 1 and also is identical thereto in terms of function and shape.

The second dielectric layer 307 can be formed using the same material as that used for the second dielectric layer 17 described in Embodiment 1 and also is identical thereto in terms of function and shape. The thickness thereof can be determined by a calculation based on the matrix method.

Preferably, the reflectance from each of the information layers in the state where the information recording medium 3 is completed is 1.3% to 6.5% in order to obtain a satisfactory signal amplitude. In the information recording medium with three or more information layers, the laser beam 19 must pass through many information layers, and thus it is difficult for the laser beam 19 to reach the information layer closer to the substrate 11. Accordingly, in order to obtain a satisfactory signal amplitude, the reflectance preferably is 1.3% to 3.3%. In addition, in order to stabilize the focus servo (pull-in), it is more preferable that the reflectances from all the information layers are approximately the same as each other.

Next, a method for producing the information recording medium 3 described in the present embodiment will be explained.

First, the substrate 11 (with a thickness of 1100 μm, for example) is set in a film forming apparatus.

Subsequently, in order to form the first information layer 31, the reflective layer 12, the first dielectric layer 13, the first interface layer 14, the recording layer 15, the second interface layer 16, and the second dielectric layer 17 are formed sequentially. The methods for forming these layers are the same as those described in Embodiment 1, respectively.

Subsequently, the optical separation layer 32 is formed on the first dielectric layer 17. The optical separation layer 32 can be formed by applying a resin such as a photocurable resin (particularly, an ultraviolet curable resin) or a slow-acting thermosetting resin to the first information layer 31, performing spin coating, and then curing the resin. It also can be formed by a printing method using a mesh, etc. When the optical separation layer 32 with a guide groove is provided, a transfer substrate (mold) having a groove in a predetermined shape formed on a surface thereof is placed on the resin that has not been cured yet, and then the substrate 11 and the transfer substrate are subject to spin coating to adhere to each other. After that, the resin is cured. Thereafter, the transfer substrate is separated from the cured resin. Thus, the optical separation layer 32 with a predetermined guide groove can be formed.

Subsequently, the second information layer 33 is formed, and then the optical separation layer 34 is formed in the same manner as the optical separation layer 32. The method for forming the second information layer 33 is the same as that for forming the n-th information layer 36 described below.

Subsequently, the third to n−1-th information layers are produced, with optical separation layers interposed therebetween. Thereafter, the optical separation layer 35 is formed by the same method as that for forming the optical separation layer 32, and then the n-th information layer 36 is formed. For forming the n-th information layer 36, the transmittance adjusting layer 301 is formed first. The transmittance adjusting layer 301 can be formed by sputtering a sputtering target made of a dielectric that composes the transmittance adjusting layer 301, in a rare gas atmosphere or in an atmosphere of a mixed gas of rare gas and reactive gas. Alternatively, the transmittance adjusting layer 301 also can be formed by sputtering reactively a sputtering target containing a metal element that composes the transmittance adjusting layer 301, in an atmosphere of a mixed gas of rare gas and reactive gas.

Subsequently, the reflective layer 302 is formed on the transmittance adjusting layer 301. The reflective layer 302 can be formed by the same method as that used for forming the reflective layer 12 described in Embodiment 1.

Subsequently, the first dielectric layer 303 is formed on the reflective layer 302. The second dielectric layer 303 can be formed by the same method as that used the first dielectric layer 13 described in Embodiment 1.

Subsequently, the first interface layer 304 is formed on the first dielectric layer 303. The first interface layer 304 can be formed by the same method as that used for forming the first interface layer 14 described in Embodiment 1.

Subsequently, the recording layer 305 is formed on the first interface layer 304. The recording layer 305 can be formed by the same method as that used for forming the recording layer 15 described in Embodiment 1.

Subsequently, the second interface layer 306 is formed on the recording layer 305. The second interface layer 306 can be formed by the same method as that used for forming the second interface layer 16 described in Embodiment 1.

Subsequently, the second dielectric layer 307 is formed on the second interface layer 306. The second dielectric layer 307 can be formed by the same method as that used for forming the second dielectric layer 17 described in Embodiment 1.

Subsequently, the n+1-th to N-1-th information layers are produced, with optical separation layers interposed therebetween. Thereafter, the optical separation layer 37 is formed by the same method as that used for forming the optical separation layer 32, and then the N-th information layer 38 is formed. Finally, the cover layer 18 is formed on the N-th information layer 38 by the same method as in Embodiment 1.

After the formation of each of the information layers or each of the optical separation layers or the formation of the cover layer 18, an initialization process can be performed for crystallizing the entire surface of the recording layer included in the information layer, if necessary. In all cases, the initialization can be performed by irradiation with a laser beam. Preferably, the laser beam used for the initialization has a wavelength of 790 nm to 830 nm in order to shorten the time required for the initialization by increasing the beam width and lower the production cost of the information recording medium.

Embodiment 4

Figure 4:
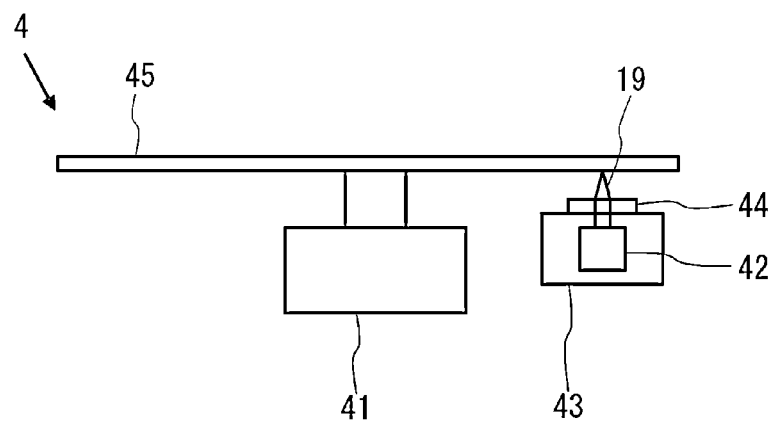
FIG. 4 is a schematic view showing a part of a configuration of an example of a recording and reproducing apparatus for recording and reproducing information on and from the information recording medium of the present invention.

As Embodiment 4 of the present invention, a method for recording and reproducing information on and from the information recording media 1, 2, and 3 described in Embodiments 1, 2, and 3, respectively, will be explained. FIG. 4 is a schematic view of a part of the configuration of a recording and reproducing apparatus 4 used for the recording and reproducing method of the present embodiment. The recording and reproducing apparatus 4 includes a spindle motor 41 for rotating the information recording medium, an optical head 43 provided with a semiconductor laser 42, and an objective lens 44 for focusing the laser beam 19 emitted from the semiconductor laser (laser source) 42. In FIG. 4, reference numeral 45 denotes a disc-shaped information recording medium. The configuration of this information recording medium is the same as those of the information recording medium 1, 2, or 3 (see Embodiment 1, 2, or 3).

In order to adjust the spot diameter of the laser beam 19 within the range of 0.4 μm to 0.7 μm, the numerical aperture (NA) of the objective lens 44 preferably is in the range of 0.5 to 1.0. The wavelength of the laser beam preferably is 450 nm or less (more preferably, it is in a blue-violet region of 350 nm to 450 nm). The linear velocity at which information is recorded and reproduced is preferably in the range of 2.5 m/s to 25 m/s in which crystallization is less likely to be caused by the reproducing beam and a sufficiently high erasure rate can be obtained.

Recording, erasing, and rewriting of information with respect to the information recording medium is performed by modulating the power of the laser beam 19 between a peak power (write power) that is a high power and a bias power (erase power) that is a low power. The irradiation with the laser beam at the peak power forms an amorphous phase in a local area of the recording film of the information recording medium, and the amorphous phase serves as a recorded region (recorded mark). The area between recorded marks is irradiated with a laser beam at the bias power, and thereby a crystalline phase is formed to serve as an erased region. In the case of irradiation with a laser beam at the peak power, it is common to use a multipulse composed of pulse trains. The multipulse may be modulated at levels of the peak power and the bias power, or may be modulated at levels of an arbitrary power between 0 mW and the peak power. As the method for modulating the pulse, it is possible to use N−1 strategy, N/2 strategy, and a CASL type (dog bone type) method pursuant to a Blu-ray Disc standard, and an arbitrary modulation method.

It is possible to allow the marks and spaces to have desired lengths by providing a periodic clock generated by a pulse generator, etc. In the Blu-ray Disc system, the periodic clock at 1× speed can be set to 66 MHz (=15.15 ns), for example.

When the substrate 11 has a guide groove, information may be recorded on a groove surface (groove) close to the laser beam incident side or on a groove surface (land) far from the laser beam incident side, or on both of them.

Information is reproduced by irradiating the information recording medium with a laser beam and reading signals from the information recording medium by a detector. The power of the laser beam used for reproduction is a power that does not affect the optical state of the recorded marks and allows a sufficient amount of reflected light to be obtained for detecting the recorded marks on the information recording medium.

FIG. 4 illustrates only the configuration necessary to describe the present embodiment and example. Neither each control circuit nor each drive circuit is shown, and some of small components, such as a collective lens and an actuator, are not illustrated, either. These components are added to the actual recording and reproducing apparatus, if needed.

Embodiment 5

Figure 5:
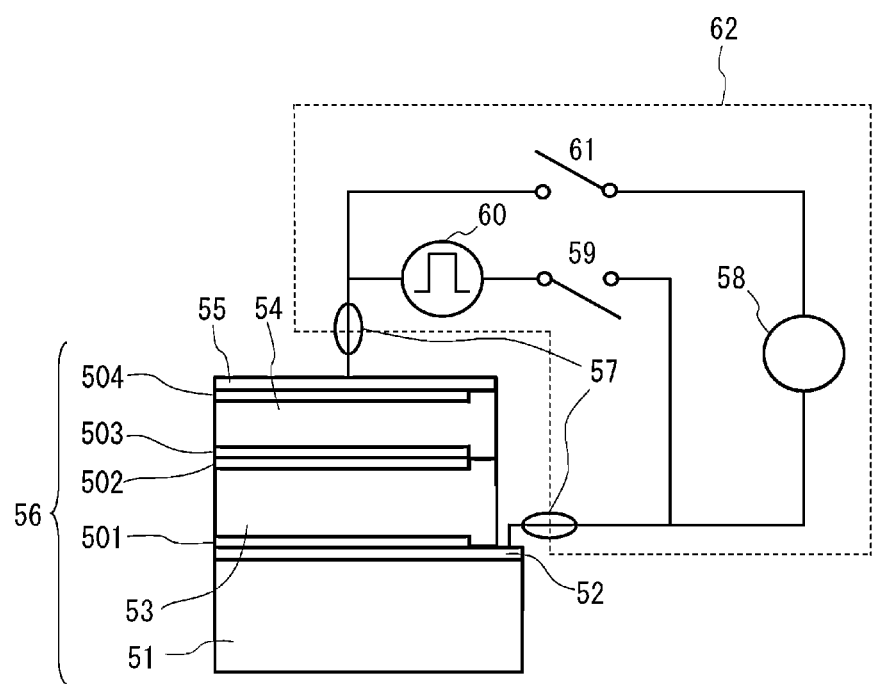
FIG. 5 is a schematic view showing a part of the configuration of an information recording medium and a part of the configuration of an electrical information recording and reproducing apparatus according to Embodiment 5 of the present invention.

As Embodiment 5 of the present invention, an example of an information recording medium allowing information to be recorded thereon by application of electrical energy will be described. FIG. 5 shows a partial cross section of the electrical information recording medium (memory) 56.

As the material for a substrate 51, there can be used a resin substrate such as polycarbonate substrates, a glass substrate, a ceramic substrate such as $Al_2O_3$ substrate, various semiconductor substrates such as an Si substrate, and various metal substrates such as a Cu substrate. Here, the case where an Si substrate is used as the substrate 51 will be described. The electrical information recording medium 56 has a configuration in which a lower electrode 52, a first interface layer 501, a first recording layer 53, a second interface layer 502, a third interface layer 503, a second recording layer 54, a fourth interface layer 504, and an upper electrode 55 are stacked sequentially on the substrate 51. The lower electrode 52 and the upper electrode 55 are formed in order to apply current to the first recording layer 53 and the second recording layer 54. The first interface layer 501 and the second interface layer 502 are provided to adjust the crystallization time of the first recording layer 53. The third interface layer 503 and the fourth interface layer 504 are provided to adjust the crystallization time of the second recording layer 54. The electrical information recording medium 56 of the present embodiment corresponds to the information recording medium including N information layers (N=2 in the present embodiment). The electrical information recording medium 56 includes two information layers: an information layer composed of the first interface layer 501, the first recording layer 53, and the second interface layer 502; and an information layer composed of the third interface layer 503, the second recording layer 54, and the fourth interface layer 504.

The materials for the first interface layer 501, the second interface layer 502, the third interface layer 503, and the fourth interface layer 504 can be the same as those used for the first interface layer 16 of Embodiment 1.

The first recording layer 53 and the second recording layer 54 each are formed of a material that undergoes an reversible phase change between the crystalline phase and the amorphous phase due to Joule heat generated by the application of an electric current. The phenomenon of change in electrical resistivity between the crystalline phase and the amorphous phase is utilized for recording information on the first recording layer 53 and the second recording layer 54, and the materials for these layers can be the same as that used for the recording layer 15 of Embodiment 1 that is the phase change material of the present invention.

The first recording layer 53 and the second recording layer 54 can be formed by the same method as that used for forming the recording layer 15 of Embodiment 1.

As the material for the lower electrode 52 and the upper electrode 55, there can be used a single metal material such as Al, Au, Ag, Cu, and Pt, or an alloy material containing one or a plurality of elements selected therefrom as its main component and one or a plurality of other elements added suitably thereinto in order to, for example, enhance the moisture resistance or adjust the thermal conductivity. The lower electrode 52 and the upper electrode 55 can be formed by sputtering, in a rare gas atmosphere, a metal base material or an alloy base material to be used as the material. As the method for forming each of the layers, it also is possible to use a vacuum vapor deposition method, an ion plating method, a CVD method, and an MBE method, for example.

Embodiment 6

As Embodiment 6 of the present invention, an example of a system using the electrical information recording medium (memory) 56 described in Embodiment 5 will be described. FIG. 5 shows a schematic view of the system.

An electrical information recording and reproducing apparatus 62 is connected electrically to the electrical information recording medium 56 via application units 57. The electrical information recording and reproducing apparatus 62 allows a pulse power supply 60 to be connected between the lower electrode 52 and the upper electrode 55 via a switch 59 in order to apply an electric current pulse to the first recording layer 53 and the second recording layer 54. In order to detect a change in resistance caused by the phase changes of the first recording layer 53 and the second recording layer 54, a resistance measuring device 58 is connected between the lower electrode 52 and the upper electrode 55 via a switch 61. In order to turn the first recording layer 53 or the second recording layer 54 in the amorphous phase (a high resistance state) into the crystalline phase (a low resistance state), the switch 59 is closed (the switch 61 is opened) to apply an electric current pulse between the electrodes, and the temperature of the region applied with the electric current pulse is maintained higher than the crystallization temperature but lower than the melting point of the material during the crystallization time. In order to turn the crystalline phase back to the amorphous phase again, a relatively higher electric current pulse than that applied during the crystallization is applied for a shorter time to raise the temperature of the recording layer to be higher than its melting point and melt it, and then cool it rapidly. The pulse power supply 60 of the electrical information recording and reproducing apparatus 62 is a power supply that outputs a recording and erasing pulse.

Figure 6:
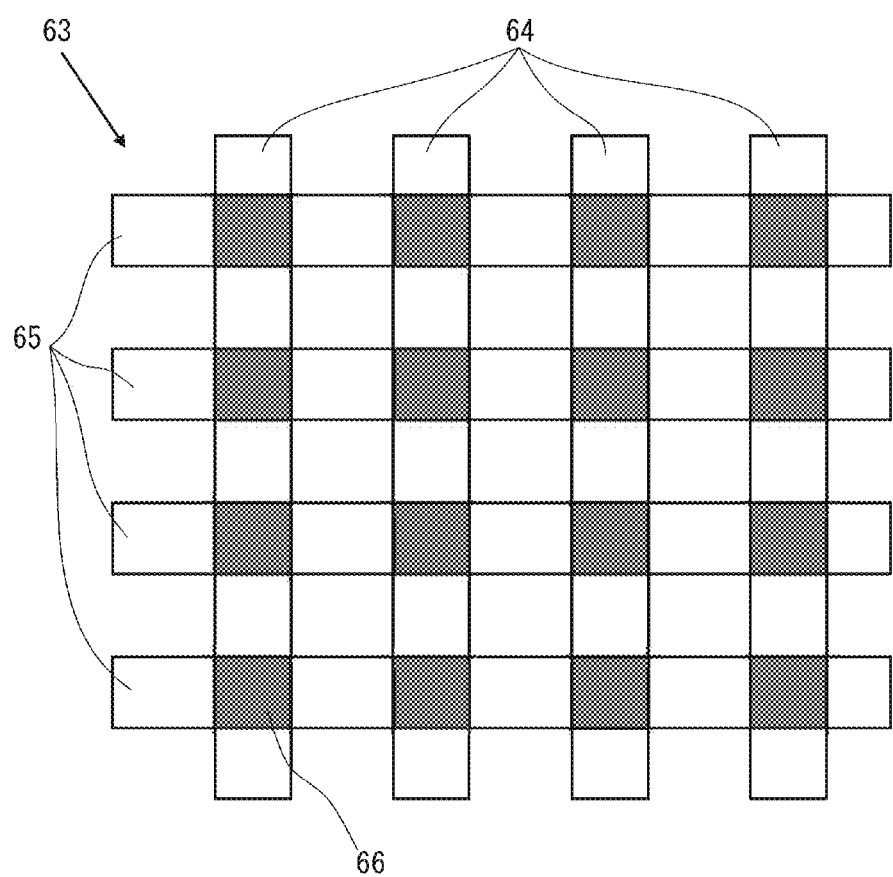
FIG. 6 is a schematic view showing a part of the configuration of an electrical information recording medium according to Embodiment 6 of the present invention.

By disposing a large number of the electrical information recording media 56 in a matrix form, a high-capacity electrical information recording medium 63 as shown in FIG. 6 can be constructed. The same structure as that of the electrical information recording medium 56 is formed in a minute region in each of memory cells 66. Information can be recorded and reproduced in and from each of the memory cells 66 by selecting one of word lines 64 and one of bit lines 65.

Figure 7:
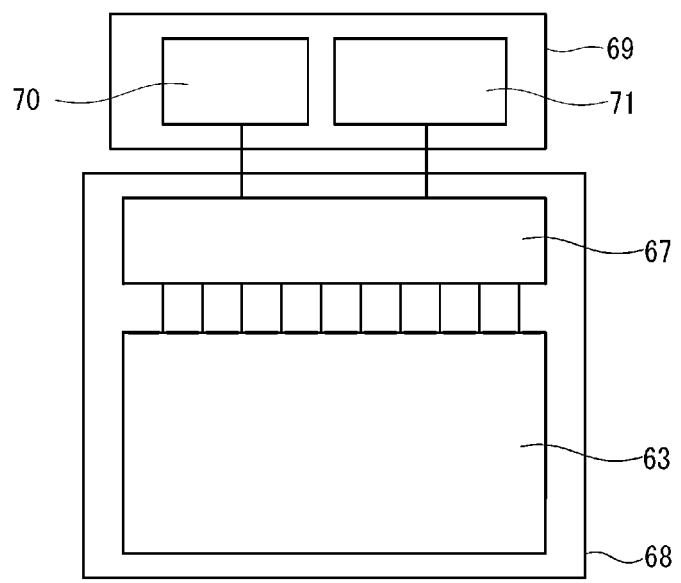
FIG. 7 is a schematic view showing a part of the configuration of the electrical information recording medium according to Embodiment 6 of the present invention and a part of the configuration of a recording and reproducing system thereof.

FIG. 7 shows an example of the configuration of an information recording system using the electrical information recording medium 63. A memory unit 68 is composed of the electrical information recording medium 63 and an addressing circuit 67. The addressing circuit 67 selects one of the word lines 64 and one of the bit lines 65 of the electrical information recording medium 63, and thereby information can be recorded and reproduced in and from each of the memory cells 66. Furthermore, by connecting electrically the memory unit 68 to an external circuit 69 composed of at least a pulse power supply 70 and a resistance measuring device 71, it is possible to record and reproduce information on and from the electrical information recording medium 63.

Embodiment 7

As Embodiment 7 of the present invention, still another example of the information recording medium on and from which information is recorded and reproduced using a laser beam will be described: The information recording medium of the present embodiment is used in a system that performs recording by using a near field light emitted from an optical system composed of a combination of a collective lens and a solid emersion lens (SIL). The optical system makes it possible to obtain a numerical aperture (NA) higher than that of the collective lens. Thus, it is possible to realize an optical system in which an effective NA>1 is satisfied. Moreover, use of the near field light present locally makes it possible to record information at high density, exceeding the limit in the case where the optical beam diameter is reduced by diffracting the optical beam. Use of such a technique makes it possible to realize a high-capacity information recording medium in which each of the information layers has a capacity of at least 60 GB.

FIG. 8A shows a partial cross section of an optical information recording medium 8 and a partial cross section of an SIL 80 of the present embodiment. The information recording medium 8 is composed of two information layers, and includes a first information layer 81, an optical separation layer 82, a second information layer 83, and a cover layer 84 stacked sequentially on the substrate 11. The laser beam 19 emitted from the SIL 80 is incident on the first information layer 81 and the second information layer 83 to record and reproduce information thereon and therefrom. The SIL 80 is disposed so that an emission plane of the SIL 80 on a flat surface side thereof and a surface of the cover layer 84 are spaced apart with a distance 85 therebetween. A desirable optical relationship is that $n_s$ is close to $n_2$, where $n_s$ is a refractive index of the SIL 80 and $n_2$ is that of the cover layer 84. More preferably, the relationship of $n_s < n_2$ is satisfied. When this relationship is satisfied, an effective NA of the SIL 80 is increased and an incidence angle of the laser beam 19 on the information recording medium 8 is increased, and thereby information can be recorded at a higher density.

In an optical system using the SIL 80, the distance 85 needs to be extremely short because it is necessary to generate a near field light between the flat surface side of the SIL 80 and the surface of the cover layer 84 so that the near field light allows the laser beam 19 emitted from the emission plane of the SIL 80 to be incident on the information recording medium 8. The near field light (not shown) can guide the laser beam 19 to the information recording medium 8. That is, when no near field light is generated, the laser beam 19 is reflected by the flat portion of the SIL 80, and thus the laser beam 19 fails to reach the information recording medium 8. Therefore, the distance 85 preferably is 50 nm or less. The information recording medium 8 can have a capacity of 180 GB by using the SIL 80 in which the effective NA=1.62 and the laser beam 19 with a wavelength of 405 nm.

FIG. 8B shows a partial cross section of the information recording medium 8 in detail.

The substrate 11 has the same function as that described in Embodiment 1. However, the track pitch preferably is 100 nm to 300 nm because smaller marks are formed on the information recording medium 8.

Next, the configuration of the first information layer 81 will be described. The first information layer 81 includes the reflective layer 12, the first dielectric layer 13, the first interface layer 14, the recording layer 15, the second interface layer 16, and the second dielectric layer 17 stacked sequentially on the surface of the substrate 11. The substrate 11, the reflective layer 12, the first dielectric layer 13, the first interface layer 14, the recording layer 15, the second interface layer 16, and the second dielectric layer 17 are identical to those described in Embodiment 1, respectively, in terms of material, function, and shape. In the first information layer 81, the first interface layer 14 can be provided, if needed, when, for example, the diffusion of elements from the first dielectric layer 17 occurs, as described in Embodiment 1.

The optical separation layer 82 has the same function as that of the optical separation layer 32 described in Embodiment 3. As the material for the optical separation layer 82, it is preferable to use a material having a refractive index close to $n_s$, which is the refractive index of the SIL 80, like the material for the cover layer 84, and it is more preferable to use a material having a larger refractive index than $n_s$. Specifically, the material for the optical separation layer 82 preferably has a refractive index of at least 1.8, and it is possible to use a material obtained by adding $TiO_2$-based fine particles or $ZrO_2$-based fine particles to an acrylic resin. Or both of the $TiO_2$-based fine particles and $ZrO_2$-based fine particles may be added into an acrylic resin. Although an acrylic resin is used also for the optical separation layer 32 of Embodiment 3, it is not appropriate to use it for the optical separation layer 82 of the present embodiment because the refractive index of an acrylic resin is as low as 1.5. Hence, the $TiO_2$-based fine particles (with a refractive index of approximately 2.6) and/or $ZrO_2$-based fine particles (with a refractive index of approximately 2.2) are added into an acrylic resin to make a material having a refractive index of at least 1.8, and use it for the optical separation layer 82. In order to focus the near field light generated by the SIL 80 onto the recording layer 15, the distance between the cover layer 84 and the recording layer 15 preferably is 10 μm. Preferably, the optical separation layer 82 has a thickness of 5 μm or less, and more preferably a thickness of 3 μm, taking the thickness of the cover layer 84 into consideration as well.

Next, the configuration of the second information layer 83 will be described. The second information layer 83 includes a transmittance adjusting layer 801, a reflective layer 802, a first dielectric layer 803, a first interface layer 804, a recording layer 805, a second interface layer 806, a second dielectric layer 807, and a third dielectric layer 808 stacked sequentially on a surface of the optical separation layer 82.

The transmittance adjusting layer 801 can be formed using the same material as that used for the transmittance adjusting layer 301 described in Embodiment 3 and also is identical thereto in terms of function and shape.

The reflective layer 802 can be formed using the same material as that used for the reflective layer 302 described in Embodiment 3 and also is identical thereto in terms of function and shape.

The first dielectric layer 803 can be formed using the same material as that used for the first dielectric layer 303 described in Embodiment 3 and also is identical thereto in terms of function and shape.

The first interface layer 804 can be formed using the same material as that used for the first interface layer 304 described in Embodiment 3 and also is identical thereto in terms of function and shape. The first interface layer 804 can be provided, if needed, when, for example, the diffusion of elements from the first dielectric layer 803 occurs.

The recording layer 805 can be formed using the same material as that used for the recording layer 305 described in Embodiment 3 and also is identical thereto in terms of function and shape. In the information recording medium 8, when the phase change material of the present invention (the material used for the recording layer 15 in Embodiment 1) is used for the recording layer of at least one of the first information layer 81 and the second information layer 83, the material used for the recording layer of the other information layer is not limited to the phase change material of the present invention. As described also in Embodiment 3, it is preferable that the phase change material of the present invention is used for the recording layer 15 of the first information layer 81, and the phase change material represented by composition formula: $Ge_rM1_sM2_tTe_{100-(r+s+t)}$ (atom %) mentioned in Embodiment 3 is used for the recording layer 805 of the second information layer 83.

The second interface layer 806 can be formed using the same material as that used for the second interface layer 306 described in Embodiment 3 and also is identical thereto in terms of function and shape.

The second dielectric layer 807 can be formed using the same material as that used for the second dielectric layer 307 described in Embodiment 3 and also is identical thereto in terms of function.

The third dielectric layer 808 has the same function as that of the second dielectric layer 807. In the information recording medium 8, in order to increase the difference between the crystalline phase and the amorphous phase and obtain a signal amplitude, it is preferable to satisfy $n_4<n_2<n_3$, where $n_3$ is the refractive index of the material to be used for the second dielectric layer 807, $n_4$ is the refractive index of the material to be used for the third dielectric layer 808, and $n_2$ is the refractive index of the cover layer 84. Specifically, the material to be used for the third dielectric layer 808 contains at least one selected from materials such as $SiO_2$, $Al_2O_3$, MgO, $MgSiO_3$, $ZrSiO_4$, $Si_3N_4$, $CeF_3$, $LaF_3$, and $YF_3$.

The cover layer 84 has the same function as that of the cover layer 18 described in Embodiment 3. As the material for the cover layer 84, a material having a refractive index close to $n_s$, which is the refractive index of the SIL 80, preferably is used as described above, and more preferably, a material having a larger refractive index than $n_s$ is used. Specifically, the material for the cover layer 84 preferably has a refractive index of at least 1.8, and it is possible to use a material obtained by adding $TiO_2$-based fine particles or $ZrO_2$-based fine particles to an acrylic resin. Or both of the $TiO_2$-based fine particles and $ZrO_2$-based fine particles may be added into an acrylic resin. In order to focus the near field light generated by the SIL 80 onto the recording layer 15, the distance between the cover layer 84 and the recording layer 15 preferably is 10 μm. In the case of an information recording medium having two information layers like the information recording medium 8, the cover layer 84 preferably has a thickness of 5 μm or less, and more preferably a thickness of 1 μm.

Preferably, the reflectance from each of the information layers in the state where the information recording medium 8 is completed is 3.0% to 6.5% in order to obtain a satisfactory signal amplitude. In addition, in order to stabilize the focus servo (pull-in), it is more preferable that the reflectances from the first information layer 81 and the second information layer 83 are approximately the same as each other.

Next, a method for producing the information recording medium 8 described in the present embodiment will be explained.

First, the substrate 11 (with a thickness of 1100 μm, for example) is set in a film forming apparatus.

Subsequently, in order to form the first information layer 81, the reflective layer 12, the first dielectric layer 13, the first interface layer 14, the recording layer 15, the second interface layer 16, and the second dielectric layer 17 are formed sequentially. The methods for forming these layers are the same as those described in Embodiment 1, respectively.

Subsequently, the optical separation layer 82 is formed on the first dielectric layer 17. The optical separation layer 82 can be formed by applying the acrylic resin containing the $TiO_2$-based fine particles, etc. added thereinto to the first information layer 81, performing spin coating, and then curing the resin. It also can be formed by a printing method using a mesh, etc. When providing the optical separation layer 82 with a guide groove, a transfer substrate (mold) with a groove in a predetermined shape formed on a surface thereof is placed on the resin that has not been cured yet, and then the substrate 11 and the transfer substrate are subject to spin coating to adhere to each other. After that, the resin is cured. Thereafter, the transfer substrate is separated from the cured resin. Thus, the optical separation layer 82 with a predetermined guide groove can be formed.

Subsequently, the second information layer 83 is formed. For forming the second information layer 83, the transmittance adjusting layer 801 is formed first. The method for forming the transmittance adjusting layer 801 is the same as that used for forming the transmittance adjusting layer 301 of Embodiment 3.

Subsequently, the reflective layer 802 is formed on the transmittance adjusting layer 801. The reflective layer 802 can be formed by the same method as that used for forming the reflective layer 302 described in Embodiment 3.

Subsequently, the first dielectric layer 803 is formed on the reflective layer 802. The second dielectric layer 803 can be formed by the same method as that used for forming the first dielectric layer 303 described in Embodiment 3.

Subsequently, the first interface layer 804 is formed on the first dielectric layer 803. The first interface layer 804 can be formed by the same method as that used for forming the first interface layer 304 described in Embodiment 3.

Subsequently, the recording layer 805 is formed on the first interface layer 804. The recording layer 805 can be formed by the same method as that used for forming the recording layer 805 described in Embodiment 3.

Subsequently, the second interface layer 806 is formed on the recording layer 805. The second interface layer 806 can be formed by the same method as that used for forming the second interface layer 306 described in Embodiment 3.

Subsequently, the second dielectric layer 807 is formed on the second interface layer 806. The second dielectric layer 807 can be formed by the same method as that used for forming the second dielectric layer 307 described in Embodiment 3.

Subsequently, the third dielectric layer 808 is formed on the second dielectric layer 807. The third dielectric layer 808 can be formed by the same method as that used for forming the second dielectric layer 807.

Finally, the cover layer 84 is formed. The cover layer 84 can be formed by the same method as that used for forming the cover layer 18 described in Embodiment 1.

After the formation of the second dielectric layer 807, the third dielectric 808, the optical separation layer 82, or the cover layer 84, an initialization process can be performed for crystallizing the entire surface of the recording layer included in the information layer, if necessary. In all cases, the initialization can be performed by irradiation with a laser beam. Preferably, the laser beam used for the initialization has a wavelength of 790 nm to 830 nm in order to shorten the time required for the initialization by increasing the beam width and lower the production cost of the information recording medium.

Embodiment 8

Figure 9:
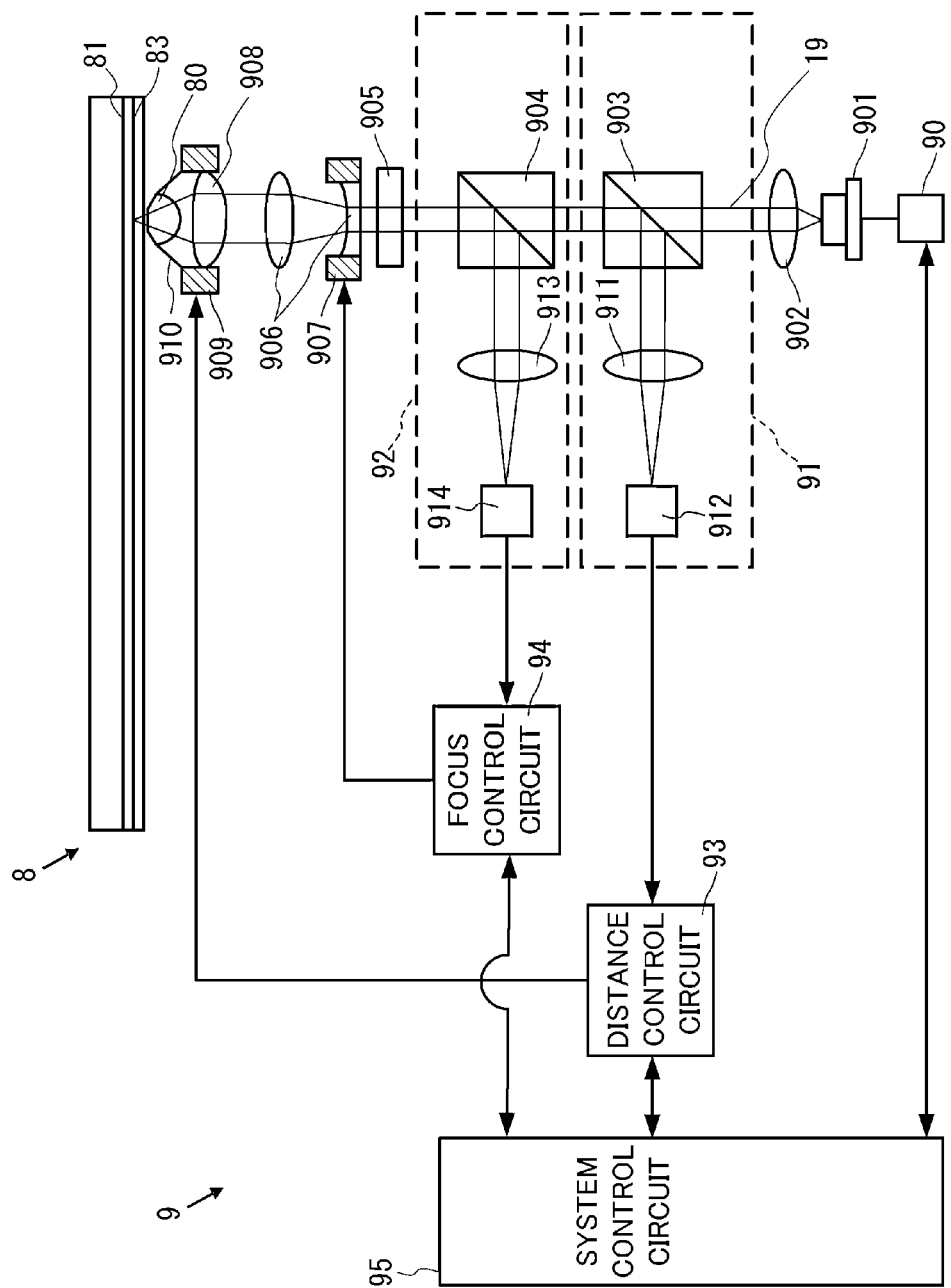
FIG. 9 is a schematic view showing an example of the configuration of a recording and reproducing apparatus used for recording and reproducing information on and from an information recording medium according to Embodiment 8 of the present invention.

As Embodiment 8 of the present invention, an apparatus for recording and reproducing information on and from the information recording medium 8 described in Embodiment 7 will be explained. FIG. 9 shows schematically a part of the configuration of a recording and reproducing apparatus 9 to be used in the recording and reproducing method of the present invention.

First, an optical system of the apparatus 9 will be described. The laser beam 19 emitted from a laser source 901 passes through a collimating lens 902 that collimates the laser beam 19, and passes further a beam splitter 903 and a beam splitter 904. Preferably, the laser beam 19 has a wavelength of 450 nm or less (more preferably, a wavelength in a blue-violet region of 350 nm to 450 nm). Here, the beam splitter 903 is a non-polarizing beam splitter independent of the polarization direction, and the beam splitter 904 is a polarizing beam splitter dependent on the polarization direction. The non-polarizing beam splitter 903 splits the reflected light (returned light) from a region in which the near field light is generated. The polarizing beam splitter 904 splits the reflected light (far field light) from the information layer. Furthermore, the laser beam 19 passes through a quarter-wave plate 905 that performs conversion between linearly polarized light and circularly polarized light, and a beam expander 906. The beam expander 906 corrects the aberration by allowing an actuator 907 to control the distance between two lenses of the beam expander 906, and controls the focusing position of the laser beam 19 inside the information recording medium 8. Furthermore, the laser beam 19 passes through a collective lens 908 and the SIL 80, and is guided by the near field light (not shown) to be focused on the first information layer 81 or the second information layer 83 included in the information recording medium 8. As the SIL 80, a hemispherical lens cut tapered on its flat surface side is used, for example. The flat surface side faces a surface of the information recording medium 8. The collective lens 908 and the SIL 80 are fixed integrally to each other by a lens holder 910. An actuator 909 adjusts the distance (the distance 85 shown in FIG. 8A) between the flat portion of the SIL 80 and the information recording medium 8.

A first detecting system 91 and a second detecting system 92 detect the amount of light reflected from the region in which the near field light is generated by the SIL 80, and the amount of light reflected from the information recording medium 8, respectively. In the first detecting system 91, the non-polarizing beam splitter 903 splits the returned light. A first detecting lens 911 collects the returned light, and a first detector 912 detects the amount of the returned light. In contrast, in the second detecting system 92, the polarizing beam splitter 904 splits the reflected light from the information layer included in the information recording medium 8. A second detecting lens 913 collects the reflected light from the information layer, and a second detector 914 detects the amount of the reflected light.

Next, a control system of the apparatus will be described. A distance control circuit 93 converts the amount of light detected by the first detector 912 into electric signals. Based on the electric signals, control signals are generated to drive the actuator 909. In this way, servo control is performed so as to keep the distance between the flat portion of the SIL 80 and the information recording medium 8 constant as determined. A focus control circuit 94 converts the amount of light detected by the second detector 914 into electric signals (focus error signals). Based on the electric signals, control signals are generated to drive the actuator 907. In this way, servo control is performed so as to keep the distance between the two lenses of the beam expander 906 constant as determined. A laser drive circuit 90 controls the power and modulation method of the laser source 901. As described in Embodiment 4, the modulation of the laser beam is performed by modulating the power of the laser beam between the peak power that is a high power and the bias power that is a low power. In the case of irradiation with a laser beam at the peak power, it is common to use a multipulse composed of pulse trains. The multipulse may be modulated at levels of the peak power and the bias power, or may be modulated at levels of an arbitrary power between 0 mW and the peak power. The laser drive circuit 90, the distance control circuit 93, and the focus control circuit 94 are controlled by a system control circuit 95 that controls the entire system of the apparatus (such as synchronization and linkage).

FIG. 9 illustrates only the configuration necessary to describe the present embodiment and example, and illustrates neither a tracking control circuit nor a reproduced signal processing circuit. They are added to the actual recording and reproducing apparatus, if needed.

EXAMPLES

Hereinafter, the present invention will be described in further detail using examples.

Example 1

In the present example, information recording media each having the same configuration as that of the information recording medium 1 shown in FIG. 1 were produced. Hereinafter, the method for producing the information recording media 1 of the present example will be described with reference to FIG. 1.

First, a polycarbonate substrate having a guide groove (with a depth of 20 nm and a track pitch of 0.32 μm) for guiding the laser beam was prepared as the substrate 11. On the substrate 11, a 100 nm-thick Ag—Pd—Cu film (containing at least 96 wt % of Ag) to serve as the reflective layer 12, a 13 nm-thick $TiO_2$ film to serve as the first dielectric layer 13, a 3 nm-thick $(ZrO_2)_{35}(SiO_2)_{35}(Cr_2O_3)_{30}$ (mol %) film to serve as the first interface layer 14, a 10 nm-thick film (the composition thereof will be described later) to serve as the recording layer 15, a 5 nm-thick $(ZrO_2)_{35}(SiO_2)_{35}(Cr_2O_3)_{30}$ (mol %) film to serve as the second interface layer 16, and a $(ZnS)_{80}(SiO_2)_{20}$ (mol %) film to serve as the second dielectric layer 17 were formed sequentially by the sputtering method. Thereafter, an ultraviolet curable resin was applied to the second dielectric layer 17 and spin coating was performed. After that, the resin was cured with ultraviolet rays to form the cover layer 18. Thus, the information recording medium 1 was produced. Finally, the initialization process was performed for crystallizing the entire surface of the recording layer 15 with a laser beam.

The thickness of the second dielectric layer 17 was determined by the calculation based on the matrix method. Specifically, it was determined so that when a laser beam with a wavelength of 405 nm was incident, the information recording medium with the recording layer 15 being in the crystalline state (a mirror surface area of the substrate) had a reflectance of 18% to 30%, and the information recording medium with the recording layer 15 being in the amorphous state (the mirror surface area of the substrate) had a reflectance of 2% to 8%.

In the information recording media 1 of the present example, the materials used for the recording layers 15 were phase change materials represented by $Sb_{x1}Te_{x2}Ge_{x3}C_{x4}$ (atom %), where (X1, X2, X3, X4)=(65, 25, 5, 5), (65, 20, 10, 5), (65, 15, 10, 10), (60, 15, 15, 10), (70, 15, 10, 5), (80, 15, 3, 2), (80, 15, 1, 4), (65, 10, 20, 5), (65, 8, 22, 5), (73, 15, 10, 2), (70, 10, 10, 10), (65, 10, 10, 15), (65, 10, 5, 20), (65, 8, 5, 22), (63, 10, 5, 22), (78, 12, 5, 5), (75, 15, 5, 5), (73, 13, 9, 5), (75, 11, 9, 5), (77, 11, 4, 8), (74, 14, 4, 8), (72, 12, 8, 8), and (72, 10, 8, 10), respectively. These media were numbered 1-101 to 1-123, respectively.

These recording layers 15 were formed by sputtering using alloy sputtering targets each containing Sb, Te, Ge, and C. Specifically, in the order of the above-mentioned phase change materials, they were sputtering targets with a composition containing Sb, Te, Ge, and C, where (Sb, Te, Ge, C)= (62, 28, 5, 5), (62, 23, 10, 5), (62, 18, 10, 10), (57, 18, 15, 10), (67, 18, 10, 5), (77, 18, 3, 2), (77, 18, 1, 4), (62, 13, 20, 5), (62, 11, 22, 5), (70, 18, 10, 2), (67, 13, 10, 10), (62, 13, 10, 15), (62, 13, 5, 20), (62, 11, 5, 22), (60, 13, 5, 22), (75, 15, 5, 5), (72, 18, 5, 5), (70, 16, 9, 5), (72, 14, 9, 5), (74, 14, 4, 8), (71, 17, 4, 8), (69, 15, 8, 8) and (69, 13, 8, 10) in atom %, respectively.

As comparative examples, information recording media (numbered 1-001, 1-002, 1-003, and 1-004) were produced. They had the above-mentioned configuration of the information recording medium 1, but the recording layers 15 thereof were formed of $Sb_{65}Te_{30}Ge_5$, $Sb_{70}Te_{25}Ge_5$, $Sb_{70}Te_7Ge_{15}C_8$, and $Sb_{60}Te_{30}Ge_5C_5$, respectively.

The information recording media 1 of the present example and the information recording media of the present comparative examples thus produced were evaluated for recording-once shelf-life deterioration, archival overwrite deterioration (hereinafter referred to as Arc. OW deterioration), and modulation degree of 9T mark at 2× and 4× speed recordings. All of the evaluations were made using the recording and reproducing apparatus 4 shown in FIG. 4. The wavelength of the laser beam was 405 nm and the numerical aperture NA of the object lens was 0.85. Information was recorded on the groove. Reproduction was performed at 1× speed and 0.35 mW in all the evaluations. Furthermore, the accelerated test was conducted in a thermostatic bath at 80° C. and 20% RH (Relative Humidity) for 50 hours. The below-mentioned CNR (Carrier to Noise Ratio) and erasure rate evaluations were made using a spectrum analyzer.

The shelf-life deterioration was evaluated as follows. A 2T (or 3T) mark was recorded once before and after performing the accelerated test under the above-mentioned conditions, and the 2T (or 3T) mark recorded before the accelerated test and the 2T (or 3T) mark recorded after the accelerated test were measured for the recording power property of CNR to see if there was a difference therebetween (if power shift had occurred). Specifically, the recording power at which CNR reaches a saturation value (=the maximum value−1 dB) was defined as recording sensitivity, and the amount of change in CNR between before and after the accelerated test was evaluated at powers of the recording sensitivity×0.8, the recording sensitivity×0.9, the recording sensitivity, and the recording sensitivity×1.1. No shelf-life deterioration means that CNR did not change between before and after the accelerated test at all of the above-mentioned powers. In the present example, with respect to the shelf-life deterioration, ⊚ indicates that the amount of change in CNR (=CNR before acceleration−CNR after acceleration) is 1 dB or less, ○ indicates 2 dB or less, and Δ indicates 3 dB or less at all of the powers, and x indicates that it is more than 3 dB at least one of the powers.

The Arc. OW deterioration was evaluated as follows. First, a 9T (or 8T) mark was recorded 10 times at the power of recording sensitivity before the accelerated test. After the accelerated test, a 2T (3T when the mark recorded before the accelerated test was 8T) mark was recorded once on the 9T (or 8T) mark, and the 2T (or 3T) mark was measured for CNR. This CNR was compared with the CNR of a 2T (or 3T) mark recorded 10 times before the accelerated test to see if there was a difference therebetween. In the present example, with respect to the Arc. OW deterioration, ⊚ indicates that the amount of change in CNR (=CNR before acceleration−CNR after acceleration) is 1 dB or less, ○ indicates 2 dB or less, and Δ indicates 3 dB or less, and x indicates that it is more than 3 dB at least one of the powers.

As the rewriting performance, the erasure rate of 9T mark was evaluated. The evaluation of the erasure rate of 9T mark was made as follows. A 9T mark was recorded 10 times, and a 2T mark was recorded once thereon. The 9T mark before the 2T mark was recorded thereon and the 9T mark after the 2T mark was recorded thereon were measured for amplitude to see if there was a difference therebetween. The information recording media with high rewriting performance (crystallization ability) had a high erasure rate. With respect to the erasure rate, ⊚ indicates at least 30 dB, ○ indicates at least 25 dB, Δ indicates at least 20 dB, and x indicates less than 20 dB.

The signal storage stability was evaluated based on the storage stability of 2T (or 3T) mark. The evaluation of the signal storage stability was made as follows. A 2T (or 3T) mark recorded 10 times was measured for CNR before and after the accelerated test (at 80° C. and 20% RH for 50 hours) to see if there was a difference therebetween. With respect to the amount of change in CNR (CNR before acceleration−CNR after acceleration), ⊚ indicates 0.0 dB or less, ○ indicates 1.0 dB or less, Δ indicates 3.0 dB or less, and x indicates more than 3.0 dB.

The modulation degree of 9T mark was obtained by capturing reproduced signals from a 9T mark recorded 10 times with an oscilloscope, and calculating based on the difference between the maximum level and the minimum level. With respect to the modulation degree of 9T mark, ⊚ indicates at least 50%, ○ indicates at least 45%, Δ indicates at least 40%, and x indicates less than 40%.

Table 1 shows the evaluation results of the shelf-life deterioration, Arc. OW deterioration, rewriting performance (erasure rate), signal storage stability, and modulation degree of 9T mark at 2× and 4× speed recordings, when 1× linear velocity was defined as 4.9 m/s (the shortest mark length (2T)=0.149 μm, periodic clock=66 MHz). In Table 1, a comprehensive evaluation was made based on the shelf-life deterioration, Arc. OW deterioration, rewriting performance, signal storage stability, and modulation degree of 9T mark. In the comprehensive evaluation, x indicates that at least one item was evaluated as x, Δ indicates that no item was evaluated as x and at least two items were evaluated as Δ, ○ indicates that one item or less was evaluated as Δ and no item was evaluated as ⊚, and ⊚ indicates that no item was evaluated as Δ and at least one item was evaluated as ⊚.

The information recording media evaluated as x in the comprehensive evaluation were not usable practically. However, the information recording media evaluated as Δ, ○, or ⊚ were usable practically. Among the practically-usable information recording media, those evaluated as ○ were superior to those evaluated as Δ, and those evaluated as ⊚ were further superior thereto.

TABLE 1

| Disc No. | Recording layer 15 | 2× speed (=9.8 m/s) ||||| 4× speed (=19.6 m/s) ||||| Comprehensive evaluation |
|---|---|---|---|---|---|---|---|---|---|---|---|---|
| | | Shelf-life deterioration | Arc. OW deterioration | Rewriting performance | Storage stability | Modulation degree of 9T | Shelf-life deterioration | Arc. OW deterioration | Rewriting performance | Storage stability | Modulation degree of 9T | |
| 1-101 | $Sb_{65}Te_{25}Ge_5C_5$ | ○ | ○ | ○ | ○ | ⊚ | Δ | Δ | Δ | ○ | ○ | Δ |
| 1-102 | $Sb_{65}Te_{20}Ge_{10}C_5$ | ○ | ○ | ○ | ○ | ⊚ | ○ | ○ | Δ | ⊚ | ○ | ○ |
| 1-103 | $Sb_{65}Te_{15}Ge_{10}C_{10}$ | ○ | ○ | ○ | ○ | ⊚ | ○ | ○ | Δ | ⊚ | ○ | ○ |
| 1-104 | $Sb_{60}Te_{15}Ge_{15}C_{10}$ | ○ | ○ | Δ | ○ | ⊚ | ○ | Δ | Δ | ⊚ | ○ | Δ |
| 1-105 | $Sb_{70}Te_{15}Ge_{10}C_5$ | ○ | ○ | ⊚ | ○ | ⊚ | ○ | ○ | Δ | ○ | ⊚ | ○ |
| 1-106 | $Sb_{80}Te_{15}Ge_3C_2$ | ○ | ○ | ⊚ | Δ | ⊚ | ○ | ○ | ⊚ | ○ | ⊚ | ○ |
| 1-107 | $Sb_{80}Te_{15}Ge_1C_4$ | ○ | ○ | ⊚ | Δ | ⊚ | ○ | ○ | ⊚ | Δ | ⊚ | Δ |
| 1-108 | $Sb_{65}Te_{10}Ge_{20}C_5$ | ○ | ○ | ○ | ⊚ | ○ | ○ | Δ | Δ | ⊚ | ○ | Δ |
| 1-109 | $Sb_{65}Te_8Ge_{22}C_5$ | ○ | ○ | Δ | ⊚ | Δ | ○ | Δ | Δ | ⊚ | Δ | Δ |
| 1-110 | $Sb_{73}Te_{15}Ge_{10}C_2$ | ○ | ○ | ⊚ | ○ | ○ | ○ | ○ | Δ | ○ | ○ | ○ |
| 1-111 | $Sb_{70}Te_{10}Ge_{10}C_{10}$ | ○ | ○ | ○ | ○ | ○ | ○ | ○ | Δ | ⊚ | ○ | ○ |
| 1-112 | $Sb_{65}Te_{10}Ge_{10}C_{15}$ | ⊚ | ⊚ | ○ | ○ | ○ | ○ | ○ | Δ | ⊚ | ○ | ○ |
| 1-113 | $Sb_{65}Te_{10}Ge_5C_{20}$ | ⊚ | ⊚ | ○ | ○ | ○ | ○ | ○ | Δ | ○ | ○ | ○ |
| 1-114 | $Sb_{65}Te_8Ge_5C_{22}$ | ⊚ | ⊚ | ○ | Δ | Δ | ○ | ○ | Δ | Δ | Δ | Δ |
| 1-115 | $Sb_{63}Te_{10}Ge_5C_{22}$ | ⊚ | ⊚ | Δ | ○ | ○ | ○ | ○ | Δ | Δ | ○ | Δ |
| 1-116 | $Sb_{78}Te_{12}Ge_5C_5$ | ⊚ | ⊚ | ⊚ | ○ | ○ | ○ | ⊚ | ⊚ | ○ | ○ | ⊚ |
| 1-117 | $Sb_{75}Te_{15}Ge_5C_5$ | ⊚ | ⊚ | ⊚ | ○ | ⊚ | ○ | ○ | ○ | ○ | ⊚ | ⊚ |
| 1-118 | $Sb_{73}Te_{13}Ge_9C_5$ | ⊚ | ⊚ | ⊚ | ○ | ○ | ○ | ○ | Δ | ○ | ○ | ⊚ |
| 1-119 | $Sb_{75}Te_{11}Ge_9C_5$ | ⊚ | ⊚ | ⊚ | ○ | ○ | ⊚ | ○ | ○ | ○ | ○ | ⊚ |
| 1-120 | $Sb_{77}Te_{11}Ge_4C_8$ | ⊚ | ⊚ | ⊚ | Δ | ○ | ⊚ | ⊚ | ⊚ | ○ | ○ | ○ |
| 1-121 | $Sb_{74}Te_{14}Ge_4C_8$ | ⊚ | ⊚ | ⊚ | Δ | ⊚ | ⊚ | ○ | ○ | ○ | ⊚ | ○ |
| 1-122 | $Sb_{72}Te_{12}Ge_8C_8$ | ⊚ | ⊚ | ⊚ | ○ | ○ | ⊚ | ○ | Δ | ○ | ○ | ○ |
| 1-123 | $Sb_{72}Te_{10}Ge_8C_{10}$ | ⊚ | ⊚ | ⊚ | ○ | ○ | ⊚ | ○ | Δ | ○ | ○ | ○ |
| 1-001 | $Sb_{65}Te_{30}Ge_5$ | X | X | ○ | ○ | ⊚ | X | X | X | ⊚ | ○ | X |
| 1-002 | $Sb_{70}Te_{25}Ge_5$ | Δ | Δ | ○ | Δ | ⊚ | X | X | ○ | Δ | ⊚ | X |
| 1-003 | $Sb_{70}Te_7Ge_{15}C_8$ | ○ | ○ | ○ | ○ | X | ○ | Δ | Δ | ⊚ | X | X |
| 1-004 | $Sb_{60}Te_{30}Ge_5C_5$ | Δ | X | Δ | ○ | ⊚ | X | X | X | ⊚ | Δ | X |

As shown in Table 1, all of the information recording media 1 (Disc No. 1-101 to 1-123) of the present example were significantly superior to the comparative examples 1-001, 1-002, 1-003, and 1-104 in terms of the shelf-life deterioration and Arc. OW deterioration at 2× and 4× speed recordings. The results of the comparative example 1-003 indicate that less than 8 atom % of Te lowered the modulation degree and deteriorated the quality of reproduced signal. This means that the content of Te needs to be at least 8 atom %. On the other hand, the results of the comparative example 1-004 indicate that more than 25 atom % of Te increased the self deterioration and Arc. OW deterioration. This means that the content of Te needs to be 25 atom % or less. Less than 65 atom % of Sb (Disc No. 1-104) lowered the rewriting performance at 2× speed recording. This means that the content of Sb preferably is at least 65 atom %. Less than 2 atom % of Ge (Disc No. 1-107) lowered the signal storage stability at 4× speed recording, and more than 20 atom % of Ge (Disc No. 1-109) lowered the rewriting performance at 2× speed recording. This means that the content of Ge preferably is at least 2 atom % but not more than 20 atom %. More than 20 atom % of C (Disc No. 1-114 and 1-115) lowered the rewriting performance and signal storage stability at 2× and 4× speed recordings. This means that the content of C preferably is 20 atom % or less.

Next, Table 2 shows the evaluation results of the shelf-life deterioration, Arc. OW deterioration, rewriting performance (erasure rate), signal storage stability, and modulation degree of 9T mark at 2× and 4× speed recordings, when 1× linear velocity was defined as 3.7 m/s (the shortest mark length (2T)=0.112 μm, periodic clock=66 MHz). The evaluations were made using a 3T mark because a 2T mark was smaller than the resolution with respect to the laser spot at a linear velocity of 3.7 m/s and the spectrum analyzer failed to detect it as periodic signals. Also, in the evaluations of the shelf-life deterioration and Arc. OW deterioration, 2T mark was captured into the oscilloscope, the mark level (voltage) thereof was read, and the amount of change therein between before and after the accelerated test was measured. Then, the amount of change was converted into decibel and evaluated as ○, Δ, etc. in the same manner as the above-mentioned CNR. That is, the shelf-life deterioration and Arc. OW deterioration were evaluated on both of the 2T mark and 3T mark. The comprehensive evaluation in Table 2 was made using the same criteria as those of Table 1.

increased the self deterioration and Arc. OW deterioration. This means that the content of Te needs to be 25 atom % or less. Less than 65 atom % of Sb (Disc No. 1-104) lowered the rewriting performance at 2× speed recording. This means that the content of Sb preferably is at least 65 atom %. Less than 2 atom % of Ge (Disc No. 1-107) lowered the signal storage stability at 4× speed recording, and more than 20 atom % of Ge (Disc No. 1-109) lowered the rewriting performance at 2× speed recording. This means that the content of Ge preferably is at least 2 atom % but not more than 20 atom %. More than 20 atom % of C (Disc No. 1-114 and 1-115) lowered the rewriting performance and signal storage stability at 2× and 4× speed recordings. This means that the content of C preferably is 20 atom % or less.

In Table 1 and 2, there are some information recording media evaluated as Δ for rewriting performance and ○ for Arc. OW deterioration (Disc No. 1-104 and Disc No. 1-109, for example). As described above, Arc. OW is an index of rewriting the mark that has been subject to the accelerated test. Accordingly, when the information recording medium has a low rewriting performance, it also is difficult to rewrite its recorded mark that has been subject to the accelerated test. Since the problem to be solved by the present invention is that the state of the recording layer is changed through the accel-

TABLE 2

| | | 2× speed (=7.4 m/s) | | | | | 4× speed (=14.8 m/s) | | | | | |
| --- | --- | --- | --- | --- | --- | --- | --- | --- | --- | --- | --- | --- |
| Disc No. | Recording layer 15 | Shelf-life deterio-ration | Arc. OW deterio-ration | Re-writing perfor-mance | Storage sta-bility | Modula-tion degree of 9 T | Shelf-life deterio-ration | Arc. OW deterio-ration | Re-writing perfor-mance | Storage sta-bility | Modula-tion degree of 9 T | Compre-hensive evalu-ation |
| 1-101 | $Sb_{65}Te_{25}Ge_5C_5$ | ○ | ○ | ○ | Δ | ◎ | Δ | Δ | Δ | ○ | ○ | Δ |
| 1-102 | $Sb_{65}Te_{20}Ge_{10}C_5$ | ○ | ○ | ○ | ○ | ◎ | ○ | ○ | Δ | ◎ | ○ | ○ |
| 1-103 | $Sb_{65}Te_{15}Ge_{10}C_{10}$ | ○ | ○ | ○ | ○ | ◎ | ○ | ○ | Δ | ○ | ○ | ○ |
| 1-104 | $Sb_{60}Te_{15}Ge_{15}C_{10}$ | ○ | ○ | Δ | ○ | ◎ | ○ | Δ | Δ | ◎ | ○ | Δ |
| 1-105 | $Sb_{70}Te_{15}Ge_{10}C_5$ | ○ | ○ | ◎ | ○ | ◎ | ○ | ○ | ○ | ○ | ◎ | ◎ |
| 1-106 | $Sb_{80}Te_{15}Ge_3C_2$ | ○ | ○ | ◎ | Δ | ◎ | ○ | ○ | ◎ | ○ | ◎ | ○ |
| 1-107 | $Sb_{80}Te_{15}Ge_1C_4$ | ○ | ○ | ◎ | Δ | ◎ | ○ | ○ | ◎ | Δ | ◎ | Δ |
| 1-108 | $Sb_{65}Te_{10}Ge_{20}C_5$ | ○ | ○ | ○ | ◎ | ○ | ○ | Δ | Δ | ◎ | ○ | Δ |
| 1-109 | $Sb_{65}Te_8Ge_{22}C_5$ | ○ | ○ | Δ | ◎ | Δ | ○ | Δ | Δ | ◎ | Δ | Δ |
| 1-110 | $Sb_{73}Te_{15}Ge_{10}C_2$ | ○ | ○ | ◎ | ○ | ○ | ○ | ○ | ○ | ○ | ○ | ◎ |
| 1-111 | $Sb_{70}Te_{10}Ge_{10}C_{10}$ | ○ | ○ | ○ | ○ | ○ | ○ | ○ | Δ | ◎ | ○ | ○ |
| 1-112 | $Sb_{65}Te_{10}Ge_{10}C_{15}$ | ◎ | ◎ | ○ | ○ | ○ | ○ | ○ | Δ | ◎ | ○ | ○ |
| 1-113 | $Sb_{65}Te_{10}Ge_5C_{20}$ | ◎ | ◎ | ○ | Δ | ○ | ○ | ○ | Δ | ○ | ○ | Δ |
| 1-114 | $Sb_{65}Te_8Ge_5C_{22}$ | ◎ | ◎ | ○ | Δ | Δ | ○ | ○ | Δ | Δ | Δ | Δ |
| 1-116 | $Sb_{63}Te_{10}Ge_5C_{22}$ | ◎ | ◎ | Δ | ○ | ○ | ○ | ○ | Δ | Δ | ○ | Δ |
| 1-116 | $Sb_{78}Te_{12}Ge_5C_5$ | ◎ | ◎ | ◎ | Δ | ○ | ○ | ◎ | ◎ | ○ | ○ | ○ |
| 1-117 | $Sb_{75}Te_{15}Ge_5C_5$ | ◎ | ◎ | ◎ | Δ | ◎ | ○ | ○ | ○ | ○ | ◎ | ○ |
| 1-118 | $Sb_{73}Te_{13}Ge_9C_5$ | ◎ | ◎ | ◎ | ○ | ○ | ○ | ○ | ○ | ○ | ○ | ◎ |
| 1-119 | $Sb_{75}Te_{11}Ge_9C_5$ | ◎ | ◎ | ◎ | ○ | ○ | ◎ | ○ | ○ | ○ | ○ | ◎ |
| 1-120 | $Sb_{77}Te_{11}Ge_4C_8$ | ◎ | ◎ | ◎ | Δ | ○ | ◎ | ◎ | ◎ | ○ | ○ | ○ |
| 1-121 | $Sb_{74}Te_{14}Ge_4C_8$ | ◎ | ◎ | ◎ | Δ | ◎ | ◎ | ○ | ○ | ○ | ◎ | ○ |
| 1-122 | $Sb_{72}Te_{12}Ge_8C_8$ | ◎ | ◎ | ◎ | Δ | ○ | ◎ | ○ | ○ | ○ | ○ | ○ |
| 1-123 | $Sb_{72}Te_{10}Ge_8C_{10}$ | ◎ | ◎ | ◎ | Δ | ○ | ◎ | ○ | ○ | ○ | ○ | ○ |
| 1-001 | $Sb_{65}Te_{30}Ge_5$ | X | X | ○ | ○ | ◎ | X | X | X | ◎ | ○ | X |
| 1-002 | $Sb_{70}Te_{25}Ge_5$ | Δ | Δ | ○ | Δ | ◎ | X | X | ○ | Δ | ◎ | X |
| 1-003 | $Sb_{70}Te_7Ge_{15}C_8$ | ○ | ○ | ○ | ○ | X | ○ | Δ | Δ | ◎ | X | X |
| 1-004 | $Sb_{60}Te_{30}Ge_5C_5$ | Δ | X | Δ | ○ | ◎ | X | X | X | ◎ | Δ | X |

As shown in Table 2, all of the information recording media 1 (Disc No. 1-101 to 1-123) of the present example also were significantly superior to the comparative examples 1-001, 1-002, 1-003, and 1-004 in terms of the shelf-life deterioration and Arc. OW deterioration at 2× and 4× speed recordings. As in the results of Table 1, the results of the comparative example 1-003 indicate that less than 8 atom % of Te lowered the modulation degree and deteriorated the quality of reproduced signal. This means that the content of Te needs to be at least 8 atom %. On the other hand, the results of the comparative example 1-004 indicate that more than 25 atom % of Te erated test, the Arc. OW deterioration in the present example shows whether the state change occurred also on the mark that had been subject to the accelerated test. That is, when the information recording medium is evaluated as Δ for rewriting performance and ○ for Arc. OW deterioration, it means that the information recording medium has an erasure rate of approximately 20 dB to 25 dB with respect to the mark that has been subject to the accelerated test, but the CNR value of the recorded mark is equivalent to that observed before the accelerated test (lowered therefrom by approximately 1 dB to 2 dB).

As described above, it has been proved that the present invention makes it possible to obtain information recording media having better properties than those of the conventional information recording media.

Example 2

In the present example, information recording media each having the same configuration as that of the information recording medium 2 shown in FIG. 2 were produced. Hereinafter, the method for producing the information recording media 2 of the present example will be described with reference to FIG. 2.

First, a polycarbonate substrate having a guide groove (with a depth of 20 nm and a track pitch of 0.32 μm) for guiding the laser beam was prepared as the substrate 11. On the substrate, a 100 nm-thick Ag—Pd—Cu film (containing at least 96 wt % of Ag) to serve as the reflective layer 12, a 15 nm-thick $(ZrO_2)_{30}(SiO_2)_{30}(Cr_2O_3)_{30}(TiO_2)_{10}$ (mol %) film to serve as the first dielectric layer 13, a 10 nm-thick film to serve as the recording layer 15, a 5 nm-thick $(ZrO_2)_{35}(SiO_2)_{35}(Cr_2O_3)_{30}$ (mol %) film to serve as the second interface layer 16, and a $(ZnS)_{80}(SiO_2)_{20}$ (mol %) film to serve as the second dielectric layer 17 were formed sequentially by the sputtering method. Thereafter, an ultraviolet curable resin was applied to the first dielectric layer 17 and spin coating was performed. After that, the resin was cured with ultraviolet rays to form the cover layer 18. Thus, the information recording medium 2 was produced. Finally, the initialization process was performed for crystallizing the entire surface of the recording layer 15 with a laser beam.

The thickness of the second dielectric layer 17 was determined by the calculation based on the matrix method. Specifically, it was determined so that when a laser beam with a wavelength of 405 nm was incident, the information recording medium with the recording layer 15 being in the crystalline state (a mirror surface area of the substrate) had a reflectance of 18% to 30%, and the information recording medium with the recording layer 15 being in the amorphous state (the mirror surface area of the substrate) had a reflectance of 2% to 8%.

In the information recording media 2 of the present example, the materials used for the recording layers 15 were phase change materials represented by $Sb_{x1}Te_{x2}Ge_{x3}C_{x4}$ (atom %), where (X1, X2, X3, X4)=(65, 25, 5, 5), (65, 20, 10, 5), (65, 15, 10, 10), (60, 15, 15, 10), (70, 15, 10, 5), (80, 15, 3, 2), (80, 15, 1, 4), (65, 10, 20, 5), (65, 8, 22, 5), (73, 15, 10, 2), (70, 10, 10, 10), (65, 10, 10, 15), (65, 10, 5, 20), (65, 8, 5, 22), (63, 10, 5, 22), (78, 12, 5, 5), (75, 15, 5, 5), (73, 13, 9, 5), (75, 11, 9, 5), (77, 11, 4, 8), (74, 14, 4, 8), (72, 12, 8, 8) and (72, 10, 8, 10), respectively. These media were numbered 2-101 to 2-123, respectively. These recording layers 15 were formed using alloy sputtering targets each containing Sb, Te, Ge, and C, as in Example 1. The compositions of the sputtering targets used for forming the phase change materials also were the same as those of the sputtering targets used in Example 1, respectively.

As comparative examples, information recording media (numbered 2-001 and 2-002) were produced. Both of them had the above-mentioned configuration of the information recording medium 2, but the recording layers 15 thereof were formed of $Sb_{65}Te_{30}Ge_5$ and $Sb_{70}Te_{25}Ge_5$, respectively.

The information recording media 2 of the present example and the information recording media of the present comparative examples thus produced were evaluated, as in Example 1, for shelf-life deterioration, Arc. OW deterioration, rewriting performance (erasure rate), and signal storage stability at 2× and 4× speed recordings.

Table 3 shows the evaluation results of the shelf-life deterioration, Arc. OW deterioration, rewriting performance (erasure rate), and signal storage stability at 2× and 4× speed recordings, when 1× linear velocity was defined as 4.9 m/s (the shortest mark length (2T)=0.149 μm, periodic clock=66 MHz). The evaluation criteria for each of the evaluation items with ⊚, ○, Δ, and x were the same as in Example 1.

TABLE 3

| Disc No. | Recording layer 15 | 2× speed (=9.8 m/s) | | | | 4× speed (=19.6 m/s) | | | | Comprehensive evaluation |
|---|---|---|---|---|---|---|---|---|---|---|
| | | Shelf-life deterioration | Arc. OW deterioration | Rewriting performance | Storage stability | Shelf-life deterioration | Arc. OW deterioration | Rewriting performance | Storage stability | |
| 2-101 | $Sb_{65}Te_{25}Ge_5C_5$ | ○ | ○ | ○ | ○ | Δ | Δ | Δ | ○ | Δ |
| 2-102 | $Sb_{65}Te_{20}Ge_{10}C_5$ | ○ | ○ | ○ | ○ | ○ | ○ | Δ | ⊚ | ○ |
| 2-103 | $Sb_{65}Te_{15}Ge_{10}C_{10}$ | ○ | ○ | ○ | ○ | ○ | ○ | Δ | ⊚ | ○ |
| 2-104 | $Sb_{60}Te_{15}Ge_{15}C_{10}$ | ○ | ○ | Δ | ○ | ○ | Δ | Δ | ⊚ | Δ |
| 2-105 | $Sb_{70}Te_{15}Ge_{10}C_5$ | ○ | ○ | ○ | ○ | ○ | ○ | Δ | ○ | ○ |
| 2-106 | $Sb_{80}Te_{15}Ge_3C_2$ | ○ | ○ | ⊚ | Δ | ○ | ○ | ⊚ | ○ | ○ |
| 2-107 | $Sb_{80}Te_{15}Ge_1C_4$ | ○ | ○ | ⊚ | Δ | ○ | ○ | ⊚ | Δ | Δ |
| 2-108 | $Sb_{65}Te_{10}Ge_{20}C_5$ | ○ | ○ | ○ | ⊚ | ○ | Δ | Δ | ⊚ | Δ |
| 2-109 | $Sb_{65}Te_8Ge_{22}C_5$ | ○ | ○ | Δ | ⊚ | ○ | Δ | Δ | ⊚ | Δ |
| 2-110 | $Sb_{73}Te_{15}Ge_{10}C_2$ | ○ | ○ | ⊚ | ○ | ○ | ○ | Δ | ○ | ○ |
| 2-111 | $Sb_{70}Te_{10}Ge_{10}C_{10}$ | ○ | ○ | ○ | ○ | ○ | ○ | Δ | ⊚ | ○ |
| 2-112 | $Sb_{65}Te_{10}Ge_{10}C_{15}$ | ⊚ | ⊚ | ○ | ○ | ○ | ○ | Δ | ⊚ | ○ |
| 2-113 | $Sb_{65}Te_{10}Ge_5C_{20}$ | ⊚ | ⊚ | ○ | ○ | ○ | ○ | Δ | ○ | ○ |
| 2-114 | $Sb_{65}Te_8Ge_5C_{22}$ | ⊚ | ⊚ | ○ | Δ | ○ | ○ | Δ | Δ | Δ |
| 2-115 | $Sb_{63}Te_{10}Ge_5C_{22}$ | ⊚ | ⊚ | Δ | ○ | ○ | ○ | Δ | Δ | Δ |
| 2-116 | $Sb_{78}Te_{12}Ge_5C_5$ | ⊚ | ⊚ | ⊚ | ○ | ○ | ⊚ | ○ | ○ | ⊚ |
| 2-117 | $Sb_{75}Te_{15}Ge_5C_5$ | ⊚ | ⊚ | ⊚ | ○ | ○ | ○ | ○ | ○ | ⊚ |
| 2-118 | $Sb_{73}Te_{13}Ge_9C_5$ | ⊚ | ⊚ | ⊚ | ○ | ○ | ○ | Δ | ○ | ○ |
| 2-119 | $Sb_{75}Te_{11}Ge_9C_5$ | ⊚ | ⊚ | ⊚ | ○ | ⊚ | ○ | ○ | ○ | ⊚ |
| 2-120 | $Sb_{77}Te_{11}Ge_4C_8$ | ⊚ | ⊚ | ⊚ | Δ | ⊚ | ⊚ | ○ | ○ | ○ |
| 2-121 | $Sb_{74}Te_{14}Ge_4C_8$ | ⊚ | ⊚ | ⊚ | Δ | ⊚ | ⊚ | ○ | ○ | ○ |
| 2-122 | $Sb_{72}Te_{12}Ge_8C_8$ | ⊚ | ⊚ | ⊚ | ○ | ⊚ | ○ | Δ | ○ | ○ |
| 2-123 | $Sb_{72}Te_{10}Ge_8C_{10}$ | ⊚ | ⊚ | ⊚ | ○ | ⊚ | ○ | Δ | ○ | ○ |
| 2-001 | $Sb_{65}Te_{30}Ge_5$ | X | X | ○ | ○ | X | X | X | ⊚ | X |
| 2-002 | $Sb_{70}Te_{25}Ge_5$ | Δ | Δ | ○ | Δ | X | X | ○ | Δ | X |

As shown in Table 3, all of the information recording media 2 (Disc No. 2-101 to 2-123) of the present example were significantly superior to the comparative examples 2-001 and 2-002 in terms of the shelf-life deterioration and Arc. OW deterioration at 2× and 4× speed recordings. Less than 65 atom % of Sb (Disc No. 2-104) lowered the rewriting performance at 2× speed recording. This means that the content of Sb preferably is at least 65 atom %. Less than 2 atom % of Ge (Disc No. 2-107) lowered the signal storage stability at 4× speed recording, and more than 20 atom % of Ge (Disc No. 2-109) lowered the rewriting performance at 2× speed recording. This means that the content of Ge preferably is at least 2 atom % but not more than 20 atom %. More than 20 atom % of C (Disc No. 2-114 and 2-115) lowered the rewriting performance and signal storage stability at 2× and 4× speed recordings. This means that the content of C preferably is 20 atom % or less.

Next, Table 4 shows the results of evaluations on the shelf-life deterioration, Arc. OW deterioration, rewriting performance (erasure rate), and signal storage stability at 2× and 4× speed recordings, when 1× linear velocity was defined as 3.7 m/s (the shortest mark length (2T)=0.112 μm, periodic clock=66 MHz). The evaluation criteria for each of the evaluation items with ⊚, ○, Δ, and x were the same as in Example 1.

tent of Ge preferably is at least 2 atom % but not more than 20 atom %. More than 20 atom % of C (Disc No. 2-114 and 2-115) lowered the rewriting performance and signal storage stability at 2× and 4× speed recordings. This means that the content of C preferably is 20 atom % or less.

As described above, it has been proved that the present invention makes it possible to obtain information recording media having better properties than those of the conventional information recording media.

Example 3

In the present example, information recording media each having the same configuration as that of the information recording medium 3 shown in FIG. 3 were produced. The present example is an example in which the information recording media each has two information layers (N=2), and the recording layer of the present invention is used as the recording layer of the first information layer. Since the present example is a dual-layer information recording medium, where N=2, as mentioned above, the optical separation layers 34, 35, and 37 are absent in FIG. 3. Since the second information layer may be regarded as any one of the information layers 33, 36, and 38, the second information layer is referred to as the information layer 36 in the present example. Hereinafter, the method for producing the informa-

TABLE 4

| Disc No. | Recording layer 15 | 2x speed (=7.4 m/s) | | | | 4x speed (=14.8 m/s) | | | | Comprehensive evaluation |
|---|---|---|---|---|---|---|---|---|---|---|
| | | Shelf-life deterioration | Arc. OW deterioration | Rewriting performance | Storage stability | Shelf-life deterioration | Arc. OW deterioration | Rewriting performance | Storage stability | |
| 2-101 | $Sb_{65}Te_{25}Ge_5C_5$ | ○ | ○ | ○ | Δ | Δ | Δ | Δ | ○ | Δ |
| 2-102 | $Sb_{65}Te_{20}Ge_{10}C_5$ | ○ | ○ | ○ | ○ | ○ | ○ | Δ | ⊚ | ○ |
| 2-103 | $Sb_{65}Te_{15}Ge_{10}C_{10}$ | ○ | ○ | ○ | ○ | ○ | ○ | Δ | ⊚ | ○ |
| 2-104 | $Sb_{60}Te_{15}Ge_{15}C_{10}$ | ○ | ○ | Δ | ○ | ○ | Δ | Δ | ⊚ | Δ |
| 2-105 | $Sb_{70}Te_{15}Ge_{10}C_5$ | ○ | ○ | ○ | ○ | ○ | ○ | ○ | ○ | ⊚ |
| 2-106 | $Sb_{80}Te_{15}Ge_3C_2$ | ○ | ○ | ⊚ | Δ | ○ | ○ | ⊚ | ○ | ○ |
| 2-107 | $Sb_{80}Te_{15}Ge_1C_4$ | ○ | ○ | ⊚ | Δ | ○ | ○ | ⊚ | Δ | Δ |
| 2-108 | $Sb_{65}Te_{10}Ge_{20}C_5$ | ○ | ○ | ○ | ⊚ | ○ | Δ | Δ | ⊚ | Δ |
| 2-109 | $Sb_{65}Te_8Ge_{22}C_5$ | ○ | ○ | Δ | ⊚ | ○ | Δ | Δ | ⊚ | Δ |
| 2-110 | $Sb_{73}Te_{15}Ge_{10}C_2$ | ○ | ○ | ⊚ | ○ | ○ | ○ | ○ | ○ | ⊚ |
| 2-111 | $Sb_{70}Te_{10}Ge_{10}C_{10}$ | ○ | ○ | ○ | ○ | ○ | ○ | Δ | ⊚ | ○ |
| 2-112 | $Sb_{65}Te_{10}Ge_{10}C_{15}$ | ⊚ | ⊚ | ○ | ○ | ○ | ○ | Δ | ⊚ | ○ |
| 2-113 | $Sb_{65}Te_{10}Ge_5C_{20}$ | ⊚ | ⊚ | ○ | Δ | ○ | ○ | Δ | ○ | Δ |
| 2-114 | $Sb_{65}Te_8Ge_5C_{22}$ | ⊚ | ⊚ | ○ | Δ | ○ | ○ | Δ | Δ | Δ |
| 2-115 | $Sb_{63}Te_{10}Ge_5C_{22}$ | ⊚ | ⊚ | Δ | ○ | ○ | ○ | Δ | Δ | Δ |
| 2-116 | $Sb_{78}Te_{12}Ge_5C_5$ | ⊚ | ⊚ | ⊚ | Δ | ○ | ⊚ | ⊚ | ○ | ○ |
| 2-117 | $Sb_{75}Te_{15}Ge_5C_5$ | ⊚ | ⊚ | ⊚ | Δ | ○ | ○ | ○ | ○ | ○ |
| 2-118 | $Sb_{73}Te_{13}Ge_9C_5$ | ⊚ | ⊚ | ⊚ | ○ | ○ | ○ | ○ | ○ | ⊚ |
| 2-119 | $Sb_{75}Te_{11}Ge_9C_5$ | ⊚ | ⊚ | ⊚ | ○ | ⊚ | ○ | ○ | ○ | ⊚ |
| 2-120 | $Sb_{77}Te_{11}Ge_4C_8$ | ⊚ | ⊚ | ⊚ | Δ | ⊚ | ⊚ | ○ | ○ | ○ |
| 2-121 | $Sb_{74}Te_{14}Ge_4C_8$ | ⊚ | ⊚ | ⊚ | Δ | ⊚ | ○ | ○ | ○ | ○ |
| 2-122 | $Sb_{72}Te_{12}Ge_8C_8$ | ⊚ | ⊚ | ⊚ | Δ | ⊚ | ○ | ○ | ○ | ○ |
| 2-123 | $Sb_{72}Te_{10}Ge_8C_{10}$ | ⊚ | ⊚ | ⊚ | Δ | ⊚ | ○ | ○ | ○ | ○ |
| 2-001 | $Sb_{65}Te_{30}Ge_5$ | X | X | ○ | ○ | X | X | X | ⊚ | X |
| 2-002 | $Sb_{70}Te_{25}Ge_5$ | Δ | Δ | ○ | Δ | X | X | ○ | Δ | X |

As shown in Table 4, all of the information recording media 2 (Disc No. 2-101 to 2-123) of the present example were significantly superior to the comparative examples 2-001 and 2-002 in terms of the shelf-life deterioration and Arc. OW deterioration at 2× and 4× speed recordings. As in the results of Table 3, less than 65 atom % of Sb (Disc No. 2-104) lowered the rewriting performance at 2× speed recording. This means that the content of Sb preferably is at least 65 atom %. Less than 2 atom % of Ge (Disc No. 2-107) lowered the signal storage stability at 4× speed recording, and more than 20 atom % of Ge (Disc No. 2-109) lowered the rewriting performance at 2× speed recording. This means that the contion recording media 3 of the present example will be described with reference to FIG. 3.

The configuration and the method for forming the films constituting the first information layer 31 of the information recording medium 3 were the same as in Example 1. As in Example 1, the recording layer material of the present invention represented by $Sb_{x1}Te_{x2}Ge_{x3}C_{x4}$ (atom %) was used for the recording layer 15. The thickness of the second dielectric layer 17 was adjusted so that the first information layer 31 with the recording layer 15 being in the crystalline state (the mirror surface area of the substrate) had a reflectance of 18% to 24% when the second information layer was absent.

Subsequently, the optical separation layer 32 with the guide groove was formed on the first information layer 31, and the second information layer 36 was formed on the optical separation layer 32. The second information layer 36 was formed by forming a 20 nm-thick $TiO_2$ film to serve as the transmittance adjusting layer 301, a 10 nm-thick Ag—Pd—Cu film (containing at least 96 wt % of Ag) to serve as the reflective layer 302, a 10 nm-thick $Al_2O_3$ film to serve the first dielectric layer 303, a 5 nm-thick $(ZrO_2)_{25}(SiO_2)_{25}(Cr_2O_3)_{50}$ (mol %) film to serve the first interface layer 304, a 6 nm-thick $Ge_{10}Bi_2Te_{13}$ film to serve as the recording layer 305, a 5 nm-thick $(ZrO_2)_{25}(SiO_2)_{25}(Cr_2O_3)_5(O)$(mol %) film to serve as the second interface layer 306, and a $(ZnS)_{80}(SiO_2)_{20}$ (mol %) film to serve as the second dielectric layer 307 sequentially by the sputtering method.

The thickness of the second dielectric layer 307 was determined by the calculation based on the matrix method. Specifically, it was determined so that when a laser beam with a wavelength of 405 nm was incident, the second information layer 36 with the recording layer 305 being in the crystalline state (the mirror surface area of the substrate) had a reflectance of 3.5% to 7% and a transmittance of 45% to 55%.

Thereafter, an ultraviolet curable resin was applied to the second dielectric layer 307 and spin coating was performed. After that, the resin was cured with ultraviolet rays to form the cover layer 18. Thus, the information recording medium 3 was produced. Finally, an initialization process was performed for crystallizing the entire surfaces of the recording layer 15 of the first information layer 31 and the recording layer 305 of the second information layer 36 with a laser beam.

In the information recording media 3 of the present example, the materials used for the recording layers 15 of the first information layers 31 were phase change materials represented by $Sb_{x1}Te_{x2}Ge_{x3}C_{x4}$ (atom %), where (X1, X2, X3, X4)=(65, 25, 5, 5), (65, 20, 10, 5) (X1, X2, X3, X4), (65, 15, 10, 10), (60, 15, 15, 10), (70, 15, 10, 5), (80, 15, 3, 2), (80, 15, 1, 4), (65, 10, 20, 5), (65, 8, 22, 5), (73, 15, 10, 2), (70, 10, 10, 10), (65, 10, 10, 15), (65, 10, 5, 20), (65, 8, 5, 22), (63, 10, 5, 22), (78, 12, 5, 5), (75, 15, 5, 5), (73, 13, 9, 5), (75, 11, 9, 5), (77, 11, 4, 8), (74, 14, 4, 8), (72, 12, 8, 8), and (72, 10, 8, 10), respectively. These media were numbered 3-101 to 3-123, respectively. These recording layers 15 were formed using alloy sputtering targets each containing Sb, Te, Ge, and C, as in Example 1. The compositions of the sputtering targets used for forming the phase change materials also were the same as those of the sputtering targets used in Example 1, respectively.

As comparative examples, information recording media (numbered 3-001 and 3-002) were produced. Both of them had the above-mentioned configuration of the information recording medium 3, but the recording layers 15 thereof were formed of $Sb_{65}Te_{30}Ge_5$ and $Sb_{70}Te_{25}Ge_5$, respectively.

In the information recording media 3 of the present example and the information recording media of the present comparative example thus produced, the first information layers 31 were evaluated, as in Example 1, for shelf-life deterioration, Arc. OW deterioration, rewriting performance (erasure rate), and signal storage stability at 2× and 4× speed recordings. In the present example, a reproducing power of 0.70 mW was used.

Table 5 shows the evaluation results of the shelf-life deterioration, Arc. OW deterioration, rewriting performance (erasure rate), and signal storage stability at 2× and 4× speed recordings, when 1× linear velocity was defined as 4.9 m/s (the shortest mark length (2T)=0.149 μm, periodic clock=66 MHz). The evaluation criteria for each of the evaluation items with ⊚, ○, Δ, and x were the same as in Example 1.

TABLE 5

| | | 2× speed (=9.8 m/s) | | | | 4× speed (=19.6 m/s) | | | | |
|---|---|---|---|---|---|---|---|---|---|---|
| Disc No. | Recording layer 15 | Shelf-life deterioration | Arc. OW deterioration | Rewriting performance | Storage stability | Shelf-life deterioration | Arc. OW deterioration | Rewriting performance | Storage stability | Comprehensive evaluation |
| 3-101 | $Sb_{65}Te_{25}Ge_5C_5$ | ○ | ○ | ○ | ○ | Δ | Δ | Δ | ○ | Δ |
| 3-102 | $Sb_{65}Te_{20}Ge_{10}C_5$ | ○ | ○ | ○ | ○ | ○ | ○ | Δ | ⊚ | ○ |
| 3-103 | $Sb_{65}Te_{15}Ge_{10}C_{10}$ | ○ | ○ | ○ | ○ | ○ | ○ | Δ | ⊚ | ○ |
| 3-104 | $Sb_{60}Te_{15}Ge_{15}C_{10}$ | ○ | ○ | Δ | ○ | ○ | Δ | Δ | ⊚ | Δ |
| 3-105 | $Sb_{70}Te_{15}Ge_{10}C_5$ | ○ | ○ | ⊚ | ○ | ○ | ○ | Δ | ○ | ○ |
| 3-106 | $Sb_{80}Te_{15}Ge_3C_2$ | ○ | ○ | ⊚ | Δ | ○ | ○ | ⊚ | ○ | ○ |
| 3-107 | $Sb_{80}Te_{15}Ge_1C_4$ | ○ | ○ | ⊚ | Δ | ○ | ○ | ⊚ | Δ | Δ |
| 3-108 | $Sb_{65}Te_{10}Ge_{20}C_5$ | ○ | ○ | ○ | ⊚ | ○ | Δ | Δ | ⊚ | Δ |
| 3-109 | $Sb_{65}Te_8Ge_{22}C_5$ | ○ | ○ | Δ | ⊚ | ○ | Δ | Δ | ⊚ | Δ |
| 3-110 | $Sb_{73}Te_{15}Ge_{10}C_2$ | ○ | ○ | ⊚ | ○ | ○ | ○ | Δ | ○ | ○ |
| 3-111 | $Sb_{70}Te_{10}Ge_{10}C_{10}$ | ○ | ○ | ○ | ○ | ○ | ○ | Δ | ⊚ | ○ |
| 3-112 | $Sb_{65}Te_{10}Ge_{10}C_{15}$ | ⊚ | ⊚ | ⊚ | ○ | ○ | ○ | Δ | ⊚ | ○ |
| 3-113 | $Sb_{65}Te_{10}Ge_5C_{20}$ | ⊚ | ⊚ | ⊚ | ○ | ○ | ○ | Δ | ○ | ○ |
| 3-114 | $Sb_{65}Te_8Ge_5C_{22}$ | ⊚ | ⊚ | ○ | Δ | ○ | ○ | Δ | Δ | Δ |
| 3-115 | $Sb_{63}Te_{10}Ge_5C_{22}$ | ⊚ | ⊚ | Δ | ○ | ○ | ○ | Δ | Δ | Δ |
| 3-116 | $Sb_{78}Te_{12}Ge_5C_5$ | ⊚ | ⊚ | ⊚ | ○ | ○ | ⊚ | ⊚ | ○ | ⊚ |
| 3-117 | $Sb_{75}Te_{15}Ge_5C_5$ | ⊚ | ⊚ | ⊚ | ⊚ | ○ | ○ | ○ | ○ | ⊚ |
| 3-118 | $Sb_{73}Te_{13}Ge_9C_5$ | ⊚ | ⊚ | ⊚ | ○ | ○ | ○ | Δ | ○ | ○ |
| 3-119 | $Sb_{75}Te_{11}Ge_9C_5$ | ⊚ | ⊚ | ⊚ | ○ | ⊚ | ○ | ○ | ○ | ⊚ |
| 3-120 | $Sb_{77}Te_{11}Ge_4C_8$ | ⊚ | ⊚ | ⊚ | Δ | ⊚ | ⊚ | ⊚ | ○ | ○ |
| 3-121 | $Sb_{74}Te_{14}Ge_4C_8$ | ⊚ | ⊚ | ⊚ | Δ | ⊚ | ○ | ○ | ○ | ○ |
| 3-122 | $Sb_{72}Te_{12}Ge_8C_8$ | ⊚ | ⊚ | ⊚ | ○ | ⊚ | ○ | Δ | ○ | ○ |
| 3-123 | $Sb_{72}Te_{10}Ge_8C_{10}$ | ⊚ | ⊚ | ⊚ | ○ | ⊚ | ○ | Δ | ○ | ○ |
| 3-001 | $Sb_{65}Te_{30}Ge_5$ | X | X | ○ | ○ | X | X | X | ⊚ | X |
| 3-002 | $Sb_{70}Te_{25}Ge_5$ | Δ | Δ | ○ | Δ | X | X | ○ | Δ | X |

As shown in Table 5, all of the information recording media 3 (Disc No. 3-101 to 3-123) of the present example were significantly superior to the comparative examples 3-001 and 3-002 in terms of the shelf-life deterioration and Arc. OW deterioration at 2× and 4× speed recordings. Less than 65 atom % of Sb (Disc No. 3-104) lowered the rewriting performance at 2× speed recording. This means that the content of Sb preferably is at least 65 atom %. Less than 2 atom % of Ge (Disc No. 3-107) lowered the signal storage stability at 4× speed recording, and more than 20 atom % of Ge (Disc No. 3-109) lowered the rewriting performance at 2× speed recording. This means that the content of Ge preferably is at least 2 atom % but not more than 20 atom %. More than 20 atom % of C (Disc No. 3-114 and 3-115) lowered the rewriting performance and signal storage stability at 2× and 4× speed recordings. This means that the content of C preferably is 20 atom % or less.

Next, Table 6 shows the evaluation results of the shelf-life deterioration, Arc. OW deterioration, rewriting performance (erasure rate), and signal storage stability at 2× and 4× speed recordings, when 1× linear velocity was defined as 3.7 m/s (the shortest mark length (2T)=0.112 μm, periodic clock=66 MHz). The evaluation criteria for each of the evaluation items with ⊚, ○, Δ, and x were the same as in Example 1.

Example 4

In the present example, another example of the information recording medium 3 shown in FIG. 3 will be described. The present example is an example in which the information recording medium has two information layers (N=2), and the recording layer of the present invention is used as the recording layer of the second information layer.

The method for forming the recording media 3 of the present example is the same as in Example 3, except for the material for the recording layer 15 and the recording layer 305. $Sb_{75}Te_{13}Ge_{7}C_{5}$ (atom %) was used for the recording layer 15 of the first information layer 31. The recording layer 15 had a thickness of 10 nm.

In the information recording media 3 of the present example, the materials used for the recording layers 305 of the second information layers 36 were phase change materials

TABLE 6

| | | 2× speed (=7.4 m/s) | | | | 4× speed (=14.8 m/s) | | | | |
|---|---|---|---|---|---|---|---|---|---|---|
| Disc No. | Recording layer 15 | Shelf-life deterioration | Arc. OW deterioration | Rewriting performance | Storage stability | Shelf-life deterioration | Arc. OW deterioration | Rewriting performance | Storage stability | Comprehensive evaluation |
| 3-101 | $Sb_{65}Te_{25}Ge_{5}C_{5}$ | ○ | ○ | ○ | Δ | Δ | Δ | Δ | ○ | Δ |
| 3-102 | $Sb_{65}Te_{20}Ge_{10}C_{5}$ | ○ | ○ | ○ | ○ | ○ | ○ | Δ | ⊚ | ○ |
| 3-103 | $Sb_{65}Te_{15}Ge_{10}C_{10}$ | ○ | ○ | ○ | ○ | ○ | ○ | Δ | ⊚ | ○ |
| 3-104 | $Sb_{60}Te_{15}Ge_{15}C_{10}$ | ○ | ○ | Δ | ○ | ○ | Δ | Δ | ⊚ | Δ |
| 3-105 | $Sb_{70}Te_{15}Ge_{10}C_{5}$ | ○ | ○ | ⊚ | ○ | ○ | ○ | ○ | ○ | ⊚ |
| 3-106 | $Sb_{80}Te_{15}Ge_{3}C_{2}$ | ○ | ○ | ⊚ | Δ | ○ | ○ | ⊚ | ○ | ○ |
| 3-107 | $Sb_{80}Te_{15}Ge_{1}C_{4}$ | ○ | ○ | ⊚ | ⊚ | ○ | ○ | ⊚ | Δ | Δ |
| 3-108 | $Sb_{65}Te_{10}Ge_{20}C_{5}$ | ○ | ○ | ○ | ⊚ | ○ | Δ | Δ | ⊚ | Δ |
| 3-109 | $Sb_{65}Te_{8}Ge_{22}C_{5}$ | ○ | ○ | Δ | ⊚ | ○ | Δ | Δ | ⊚ | Δ |
| 3-110 | $Sb_{73}Te_{15}Ge_{10}C_{2}$ | ○ | ○ | ⊚ | ○ | ○ | ○ | ○ | ○ | ⊚ |
| 3-111 | $Sb_{70}Te_{10}Ge_{10}C_{10}$ | ○ | ○ | ○ | ○ | ○ | ○ | Δ | ⊚ | ○ |
| 3-112 | $Sb_{65}Te_{10}Ge_{10}C_{15}$ | ⊚ | ⊚ | ○ | ○ | ○ | ○ | Δ | ⊚ | ○ |
| 3-113 | $Sb_{65}Te_{10}Ge_{5}C_{20}$ | ⊚ | ⊚ | ○ | Δ | ○ | ○ | Δ | ○ | Δ |
| 3-114 | $Sb_{65}Te_{8}Ge_{5}C_{22}$ | ⊚ | ⊚ | ○ | Δ | ○ | ○ | Δ | Δ | Δ |
| 3-115 | $Sb_{63}Te_{10}Ge_{5}C_{22}$ | ⊚ | ⊚ | Δ | ○ | ○ | ○ | Δ | Δ | Δ |
| 3-116 | $Sb_{78}Te_{12}Ge_{5}C_{5}$ | ⊚ | ⊚ | ⊚ | Δ | ○ | ⊚ | ⊚ | ○ | ○ |
| 3-117 | $Sb_{75}Te_{15}Ge_{5}C_{5}$ | ⊚ | ⊚ | ⊚ | Δ | ○ | ○ | ○ | ○ | ○ |
| 3-118 | $Sb_{73}Te_{13}Ge_{9}C_{5}$ | ⊚ | ⊚ | ⊚ | ○ | ○ | ○ | ○ | ○ | ⊚ |
| 3-119 | $Sb_{75}Te_{11}Ge_{9}C_{5}$ | ⊚ | ⊚ | ⊚ | ⊚ | ○ | ○ | ○ | ○ | ⊚ |
| 3-120 | $Sb_{77}Te_{11}Ge_{4}C_{8}$ | ⊚ | ⊚ | ⊚ | Δ | ⊚ | ⊚ | ⊚ | ○ | ○ |
| 3-121 | $Sb_{74}Te_{14}Ge_{4}C_{8}$ | ⊚ | ⊚ | ⊚ | Δ | ⊚ | ○ | ○ | ○ | ○ |
| 3-122 | $Sb_{72}Te_{12}Ge_{8}C_{8}$ | ⊚ | ⊚ | ⊚ | Δ | ⊚ | ○ | ○ | ○ | ○ |
| 3-123 | $Sb_{72}Te_{10}Ge_{8}C_{10}$ | ⊚ | ⊚ | ⊚ | Δ | ⊚ | ○ | ○ | ○ | ○ |
| 3-001 | $Sb_{65}Te_{30}Ge_{5}$ | X | X | ○ | ○ | X | X | X | ⊚ | X |
| 3-002 | $Sb_{70}Te_{25}Ge_{5}$ | Δ | Δ | ○ | Δ | X | X | ○ | Δ | X |

As shown in Table 6, all of the information recording media 3 (Disc No. 3-101 to 3-123) of the present example were significantly superior to the comparative examples 3-001 and 3-002 in terms of the shelf-life deterioration and Arc. OW deterioration at 2× and 4× speed recordings. As in the results of Table 5, less than 65 atom % of Sb (Disc No. 3-104) lowered the rewriting performance at 2× speed recording. This means that the content of Sb preferably is at least 65 atom %. Less than 2 atom % of Ge (Disc No. 3-107) lowered the signal storage stability at 4× speed recording, and more than 20 atom % of Ge (Disc No. 3-109) lowered the rewriting performance at 2× speed recording. This means that the content of Ge preferably is at least 2 atom % but not more than 20 atom %. More than 20 atom % of C (Disc No. 3-114 and 3-115) lowered the rewriting performance and signal storage stability at 2× and 4× speed recordings. This means that the content of C preferably is 20 atom % or less.

As described above, it has been proved that the present invention makes it possible to obtain information recording media having better properties than those of the conventional information recording media.

represented by $Sb_{x1}Te_{x2}Ge_{x3}C_{x4}$ (atom %), where (X1, X2, X3, X4)=(65, 25, 5, 5), (65, 20, 10, 5), (65, 15, 10, 10), (60, 15, 15, 10), (70, 15, 10, 5), (80, 15, 3, 2), (80, 15, 1, 4), (65, 10, 20, 5), (65, 8, 22, 5), (73, 15, 10, 2), (70, 10, 10, 10), (65, 10, 10, 15), (65, 10, 5, 20), (65, 8, 5, 22), (63, 10, 5, 22), (78, 12, 5, 5), (75, 15, 5, 5), (73, 13, 9, 5), (75, 11, 9, 5), (77, 11, 4, 8), (74, 14, 4, 8), (72, 12, 8, 8) and (72, 10, 8, 10), respectively. These media were numbered 3-201 to 3-223, respectively. The recording layers 15 and 305 were formed using alloy sputtering targets each containing Sb, Te, Ge, and C, as in Example 1. The compositions of the sputtering targets used for forming the phase change materials also were the same as those of the sputtering targets used in Example 1, respectively.

As comparative examples, information recording media (numbered 3-003 and 3-004) were produced. Both of them had the above-mentioned configuration of the information recording medium 3, but the recording layers 15 thereof were formed of $Sb_{65}Te_{30}Ge_{5}$ and $Sb_{70}Te_{25}Ge_{5}$, respectively.

In the information recording media 3 of the present example and the information recording media of the present comparative example thus produced, the first information layers 31 were evaluated, as in Example 1, for shelf-life deterioration, Arc. OW deterioration, rewriting performance (erasure rate), and signal storage stability at 2× and 4× speed recordings.

In the rewriting performance evaluation of the present example, the erasure rate of 9T mark was evaluated as in Example 1. However, the evaluation criteria was that with respect to the erasure rate, ◉ indicates at least 28 dB, ○ indicates at least 23 dB, Δ indicates at least 20 dB, and × indicates less than 20 dB. In the present example, the reproducing power was 0.70 mW.

Table 7 shows the evaluation results of the shelf-life deterioration, Arc. OW deterioration, rewriting performance (erasure rate), and signal storage stability at 2× and 4× speed recordings, when 1× linear velocity was defined as 4.9 m/s (the shortest mark length (2T)=0.149 periodic clock=66 MHz). The evaluation criteria for each of the evaluation items with ◉, ○, Δ, and × were the same as in Example 1.

3-004 in terms of the shelf-life deterioration and Arc. OW deterioration at 2× and 4× speed recordings. Less than 65 atom % of Sb (Disc No. 3-204) lowered the rewriting performance at 2× speed recording. This means that the content of Sb preferably is at least 65 atom %. Less than 2 atom % of Ge (Disc No. 3-207) lowered the signal storage stability at 4× speed recording, and more than 20 atom % of Ge (Disc No. 3-209) lowered the rewriting performance at 2× speed recording. This means that the content of Ge preferably is at least 2 atom % but not more than 20 atom %. More than 20 atom % of C (Disc No. 3-214 and 3-215) lowered the rewriting performance and signal storage stability at 2× and 4× speed recordings. This means that the content of C preferably is 20 atom % or less.

Next, Table 8 shows the evaluation results of the shelf-life deterioration, Arc. OW deterioration, rewriting performance (erasure rate), and signal storage stability at 2× and 4× speed recordings, when 1× linear velocity was defined as 3.7 m/s

TABLE 7

| | | 2× speed (=9.8 m/s) | | | | 4× speed (=19.6 m/s) | | | | |
|---|---|---|---|---|---|---|---|---|---|---|
| Disc No. | Recording layer 305 | Shelf-life deterioration | Arc. OW deterioration | Rewriting performance | Storage stability | Shelf-life deterioration | Arc. OW deterioration | Rewriting performance | Storage stability | Comprehensive evaluation |
| 3-201 | $Sb_{65}Te_{25}Ge_5C_5$ | ○ | ○ | ○ | ○ | Δ | Δ | Δ | ○ | Δ |
| 3-202 | $Sb_{65}Te_{20}Ge_{10}C_5$ | ○ | ○ | ○ | ○ | ○ | ○ | Δ | ◉ | ○ |
| 3-203 | $Sb_{65}Te_{15}Ge_{10}C_{10}$ | ○ | ○ | ○ | ○ | ○ | ○ | Δ | ◉ | ○ |
| 3-204 | $Sb_{60}Te_{15}Ge_{15}C_{10}$ | ○ | ○ | Δ | ○ | ○ | Δ | Δ | ◉ | Δ |
| 3-205 | $Sb_{70}Te_{15}Ge_{10}C_5$ | ○ | ○ | ◉ | ○ | ○ | ○ | Δ | ○ | ○ |
| 3-206 | $Sb_{80}Te_{15}Ge_3C_2$ | ○ | ○ | ◉ | Δ | ○ | ○ | ◉ | ○ | ○ |
| 3-207 | $Sb_{80}Te_{15}Ge_1C_4$ | ○ | ○ | ◉ | Δ | ○ | ○ | ◉ | Δ | Δ |
| 3-208 | $Sb_{65}Te_{10}Ge_{20}C_5$ | ○ | ○ | ○ | ◉ | ○ | Δ | Δ | ◉ | Δ |
| 3-209 | $Sb_{65}Te_8Ge_{22}C_5$ | ○ | ○ | Δ | ◉ | ○ | Δ | Δ | ◉ | Δ |
| 3-210 | $Sb_{73}Te_{15}Ge_{10}C_2$ | ○ | ○ | ◉ | ○ | ○ | ○ | Δ | ○ | ○ |
| 3-211 | $Sb_{70}Te_{10}Ge_{10}C_{10}$ | ○ | ○ | ○ | ○ | ○ | ○ | Δ | ◉ | ○ |
| 3-212 | $Sb_{65}Te_{10}Ge_{10}C_{15}$ | ◉ | ◉ | ○ | ○ | ○ | ○ | Δ | ◉ | ○ |
| 3-213 | $Sb_{65}Te_{10}Ge_5C_{20}$ | ◉ | ◉ | ○ | ○ | ○ | ○ | Δ | ○ | ○ |
| 3-214 | $Sb_{65}Te_8Ge_5C_{22}$ | ◉ | ◉ | ○ | Δ | ○ | ○ | Δ | Δ | Δ |
| 3-215 | $Sb_{63}Te_{10}Ge_5C_{22}$ | ◉ | ◉ | Δ | ○ | ○ | ○ | Δ | Δ | Δ |
| 3-216 | $Sb_{78}Te_{12}Ge_5C_5$ | ◉ | ◉ | ◉ | ○ | ○ | ◉ | ◉ | ○ | ◉ |
| 3-217 | $Sb_{75}Te_{15}Ge_5C_5$ | ◉ | ◉ | ◉ | ○ | ○ | ○ | ○ | ○ | ◉ |
| 3-218 | $Sb_{73}Te_{13}Ge_9C_5$ | ◉ | ◉ | ◉ | ○ | ○ | ○ | Δ | ○ | ○ |
| 3-219 | $Sb_{75}Te_{11}Ge_9C_5$ | ◉ | ◉ | ◉ | ○ | ◉ | ○ | ○ | ○ | ◉ |
| 3-220 | $Sb_{77}Te_{11}Ge_4C_8$ | ◉ | ◉ | ◉ | Δ | ◉ | ◉ | ○ | ○ | ○ |
| 3-221 | $Sb_{74}Te_{14}Ge_4C_8$ | ◉ | ◉ | ◉ | Δ | ◉ | ◉ | ○ | ○ | ○ |
| 3-222 | $Sb_{72}Te_{12}Ge_8C_8$ | ◉ | ◉ | ◉ | ○ | ◉ | ○ | Δ | ○ | ○ |
| 3-223 | $Sb_{72}Te_{10}Ge_8C_{10}$ | ◉ | ◉ | ◉ | ○ | ◉ | ○ | Δ | ○ | ○ |
| 3-003 | $Sb_{65}Te_{30}Ge_5$ | X | X | ○ | ○ | X | X | X | ◉ | X |
| 3-004 | $Sb_{70}Te_{25}Ge_5$ | Δ | Δ | ○ | Δ | X | X | ○ | Δ | X |

As shown in Table 7, all of the information recording media 3 (Disc No. 3-201 to 3-223) of the present example were significantly superior to the comparative examples 3-003 and (the shortest mark length (2T)=0.112 μm, periodic clock=66 MHz). The evaluation criteria for each of the evaluation items with ◉, ○, Δ and × were the same as in Example 1.

TABLE 8

| | | 2× speed (=7.4 m/s) | | | | 4× speed (=14.8 m/s) | | | | |
|---|---|---|---|---|---|---|---|---|---|---|
| Disc No. | Recording layer 305 | Shelf-life deterioration | Arc. OW deterioration | Rewriting performance | Storage stability | Shelf-life deterioration | Arc. OW deterioration | Rewriting performance | Storage stability | Comprehensive evaluation |
| 3-201 | $Sb_{65}Te_{25}Ge_5C_5$ | ○ | ○ | ○ | Δ | Δ | Δ | Δ | ○ | Δ |
| 3-202 | $Sb_{65}Te_{20}Ge_{10}C_5$ | ○ | ○ | ○ | ○ | ○ | ○ | Δ | ◉ | ○ |
| 3-203 | $Sb_{65}Te_{15}Ge_{10}C_{10}$ | ○ | ○ | ○ | ○ | ○ | ○ | Δ | ◉ | ○ |
| 3-204 | $Sb_{60}Te_{15}Ge_{15}C_{10}$ | ○ | ○ | Δ | ○ | ○ | Δ | Δ | ◉ | Δ |
| 3-205 | $Sb_{70}Te_{15}Ge_{10}C_5$ | ○ | ○ | ◉ | ○ | ○ | ○ | ○ | ○ | ◉ |
| 3-206 | $Sb_{80}Te_{15}Ge_3C_2$ | ○ | ○ | ◉ | Δ | ○ | ○ | ◉ | ○ | ○ |
| 3-207 | $Sb_{80}Te_{15}Ge_1C_4$ | ○ | ○ | ◉ | Δ | ○ | ○ | ◉ | Δ | Δ |
| 3-208 | $Sb_{65}Te_{10}Ge_{20}C_5$ | ○ | ○ | ○ | ◉ | ○ | Δ | Δ | ◉ | Δ |
| 3-209 | $Sb_{65}Te_8Ge_{22}C_5$ | ○ | ○ | Δ | ◉ | ○ | Δ | Δ | ◉ | Δ |
| 3-210 | $Sb_{73}Te_{15}Ge_{10}C_2$ | ○ | ○ | ◉ | ○ | ○ | ○ | ○ | ○ | ◉ |
| 3-211 | $Sb_{70}Te_{10}Ge_{10}C_{10}$ | ○ | ○ | ○ | ○ | ○ | ○ | Δ | ◉ | ○ |

TABLE 8-continued

| | | 2x speed (=7.4 m/s) | | | | 4x speed (=14.8 m/s) | | | | |
|---|---|---|---|---|---|---|---|---|---|---|
| Disc No. | Recording layer 305 | Shelf-life deterioration | Arc. OW deterioration | Rewriting performance | Storage stability | Shelf-life deterioration | Arc. OW deterioration | Rewriting performance | Storage stability | Comprehensive evaluation |
| 3-212 | $Sb_{65}Te_{10}Ge_{10}C_{15}$ | ◎ | ◎ | ○ | ○ | ○ | ○ | Δ | ◎ | ○ |
| 3-213 | $Sb_{65}Te_{10}Ge_5C_{20}$ | ◎ | ◎ | ○ | Δ | ○ | ○ | Δ | ○ | Δ |
| 3-214 | $Sb_{65}Te_8Ge_5C_{22}$ | ◎ | ◎ | ○ | Δ | ○ | ○ | Δ | Δ | Δ |
| 3-215 | $Sb_{63}Te_{10}Ge_5C_{22}$ | ◎ | ◎ | Δ | ○ | ○ | ○ | Δ | Δ | Δ |
| 3-216 | $Sb_{78}Te_{12}Ge_5C_5$ | ◎ | ◎ | ◎ | Δ | ○ | ◎ | ◎ | ○ | ○ |
| 3-217 | $Sb_{75}Te_{15}Ge_5C_5$ | ◎ | ◎ | ◎ | Δ | ○ | ○ | ○ | ○ | ○ |
| 3-218 | $Sb_{73}Te_{13}Ge_9C_5$ | ◎ | ◎ | ◎ | ○ | ○ | ○ | ○ | ○ | ◎ |
| 3-219 | $Sb_{75}Te_{11}Ge_9C_5$ | ◎ | ◎ | ◎ | ○ | ◎ | ○ | ○ | ○ | ◎ |
| 3-220 | $Sb_{77}Te_{11}Ge_4C_8$ | ◎ | ◎ | ◎ | Δ | ◎ | ◎ | ◎ | ○ | ○ |
| 3-221 | $Sb_{74}Te_{14}Ge_4C_8$ | ◎ | ◎ | ◎ | Δ | ◎ | ○ | ○ | ○ | ○ |
| 3-222 | $Sb_{72}Te_{12}Ge_8C_8$ | ◎ | ◎ | ◎ | Δ | ◎ | ○ | ○ | ○ | ○ |
| 3-223 | $Sb_{72}Te_{10}Ge_8C_{10}$ | ◎ | ◎ | ◎ | Δ | ◎ | ○ | ○ | ○ | ○ |
| 3-003 | $Sb_{65}Te_{30}Ge_5$ | X | X | ○ | ○ | X | X | X | ◎ | X |
| 3-004 | $Sb_{70}Te_{25}Ge_5$ | Δ | Δ | ○ | Δ | X | X | ○ | Δ | X |

As shown in Table 8, all of the information recording media 1 (Disc No. 3-201 to 3-223) of the present example were significantly superior to the comparative examples 3-003 and 3-004 in terms of the shelf-life deterioration and Arc. OW deterioration at 2x and 4x speed recordings. As in the results of Table 7, less than 65 atom % of Sb (Disc No. 3-204) lowered the rewriting performance at 2x speed recording. This means that the content of Sb preferably is at least 65 atom %. Less than 2 atom % of Ge (Disc No. 3-207) lowered the signal storage stability at 4x speed recording, and more than 20 atom % of Ge (Disc No. 3-209) lowered the rewriting performance at 2x speed recording. This means that the content of Ge preferably is at least 2 atom % but not more than 20 atom %. More than 20 atom % of C (Disc No. 3-214 and 3-215) lowered the rewriting performance and signal storage stability at 2x and 4x speed recordings. This means that the content of C preferably is 20 atom % or less.

As described above, it has been proved that the present invention makes it possible to obtain information recording media having better properties than those of the conventional information recording media.

Example 5

In the present example, another example of the information recording medium 3 shown in FIG. 3 will be described. The present example is an example in which the information recording medium has three information layers (N=3), and the recording layer of the present invention is used as the recording layer of the first information layer. Since the present example is a three-layer information recording medium, where N=3, as described above, the optical separation layers 35 and 37 are absent (the optical separation layer 35 can be regarded as identical to the optical separation layer 34.) Since the third information layer may be regarded as any one of the information layers 36 and 38, the third information layer is referred to as the information layer 36 in the present example. Hereinafter, the method for producing the information recording media 3 of the present example will be described with reference to FIG. 3.

The configuration and the method for forming the first information layer 31 of the information recording medium 3 are the same as in Example 3. As in Example 3, the recording layer material of the present invention represented by $Sb_{x1}Te_{x2}Ge_{x3}C_{x4}$ (atom %) was used for the recording layer 15. The thickness of the second dielectric layer 17 was adjusted so that the first information layer 31 with the recording layer 15 being in the crystalline state (the mirror surface area of the substrate) had a reflectance of 24% to 33% when the second information layer and the third information layer were absent.

Subsequently, the optical separation layer 32 with the guide groove was formed on the first information layer 31, and the second information layer 33 was formed on the optical separation layer 32. The configuration and the method for forming the second information layer 33 were the same as those of the second information layer 36 of Example 3. The thickness of the second dielectric layer included in the second information layer 33 was determined by the calculation based on the matrix method. Specifically, it was determined so that when a laser beam with a wavelength of 405 nm was incident, the second information layer 33 with the recording layer 305 being in the crystalline state (the mirror surface area of the substrate) had a reflectance of 4% to 8% and a transmittance of 45% to 55%.

Subsequently, the optical separation layer 34 with the guide groove was formed on the second information layer 33, and then an initialization process was performed for crystallizing the entire surfaces of the recording layers of the first information layer 31 and the second information layer 33 with a laser beam.

Subsequently, the third information layer 36 was formed on the optical separation layer 34. The third information layer 36 was formed by forming a 18 nm-thick $TiO_2$ film to serve as the transmittance adjusting layer 301, a 8 nm-thick Ag—Pd—Cu film (containing at least 96 wt % of Ag) to serve as the reflective layer 302, a 6 nm-thick $Al_2O_3$ film to serve as the first dielectric layer 303, a 5 nm-thick $(ZrO_2)_{25}(SiO_2)_{25}(Cr_2O_3)_{50}$ (mol %) film to serve as the first interface layer 304, a 6 nm-thick $Ge_{10}Bi_2Te_{13}$ film to serve as the recording layer 305, a 5 nm-thick $(ZrO_2)_{25}(SiO_2)_{25}(Cr_2O_3)_{50}$ (mol %) film to serve as the second interface layer 306, and a $(ZnS)_{80}(SiO_2)_{20}$ (mol %) film to serve as the second dielectric layer 307 sequentially by the sputtering method.

The thickness of the second dielectric layer 307 was determined by the calculation based on the matrix method. Specifically, it was determined so that when a laser beam with a wavelength of 405 nm was incident, the third information layer 36 with the recording layer 305 being in the crystalline state (the mirror surface area of the substrate) had a reflectance of 2% to 4% and a transmittance of 53% to 63%.

Thereafter, an ultraviolet curable resin was applied to the second dielectric layer 307 and spin coating was performed. After that, the resin was cured with ultraviolet rays to form the cover layer 18. Thus, the information recording medium 3 was produced. Finally, an initialization process was performed for crystallizing the entire surface of the recording layer 305 of the third information layer 36 with a laser beam.

comparative example thus produced, the first information layers 31 were evaluated, as in Example 1, for shelf-life deterioration, Arc. OW deterioration, rewriting performance (erasure rate), and signal storage stability at 2× and 4× speed recordings. In the present example, a reproducing power of 1.0 mW was used.

Table 9 shows the results of evaluations on the shelf-life deterioration, Arc. OW deterioration, rewriting performance (erasure rate), and signal storage stability at 2× and 4× speed recordings, when 1× linear velocity was defined as 4.9 m/s (the shortest mark length (2T)=0.149 μm, periodic clock=66 MHz). The evaluation criteria for each of the evaluation items with ⊚, ○, Δ, and x were the same as in Example 1.

TABLE 9

| | | 2× speed (=9.8 m/s) | | | | 4× speed (=19.6 m/s) | | | | |
|---|---|---|---|---|---|---|---|---|---|---|
| Disc No. | Recording layer 15 | Shelf-life deterioration | Arc. OW deterioration | Rewriting performance | Storage stability | Shelf-life deterioration | Arc. OW deterioration | Rewriting performance | Storage stability | Comprehensive evaluation |
| 3-301 | $Sb_{65}Te_{25}Ge_5C_5$ | ○ | ○ | ○ | ○ | Δ | Δ | Δ | ○ | Δ |
| 3-302 | $Sb_{65}Te_{20}Ge_{10}C_5$ | ○ | ○ | ○ | ○ | ○ | ○ | Δ | ⊚ | ○ |
| 3-303 | $Sb_{65}Te_{15}Ge_{10}C_{10}$ | ○ | ○ | ○ | ○ | ○ | ○ | Δ | ⊚ | ○ |
| 3-304 | $Sb_{60}Te_{15}Ge_{15}C_{10}$ | ○ | ○ | Δ | ○ | ○ | Δ | Δ | ⊚ | Δ |
| 3-305 | $Sb_{70}Te_{15}Ge_{10}C_5$ | ○ | ○ | ⊚ | ○ | ○ | ○ | Δ | ○ | ○ |
| 3-306 | $Sb_{80}Te_{15}Ge_3C_2$ | ○ | ○ | ⊚ | Δ | ○ | ○ | ⊚ | ○ | ○ |
| 3-307 | $Sb_{80}Te_{15}Ge_1C_4$ | ○ | ○ | ⊚ | Δ | ○ | ○ | ⊚ | Δ | Δ |
| 3-308 | $Sb_{65}Te_{10}Ge_{20}C_5$ | ○ | ○ | ○ | ⊚ | ○ | Δ | Δ | ⊚ | Δ |
| 3-309 | $Sb_{65}Te_8Ge_{22}C_5$ | ○ | ○ | Δ | ⊚ | ○ | Δ | Δ | ⊚ | Δ |
| 3-310 | $Sb_{73}Te_{15}Ge_{10}C_2$ | ○ | ○ | ⊚ | ○ | ○ | ○ | Δ | ○ | ○ |
| 3-311 | $Sb_{70}Te_{10}Ge_{10}C_{10}$ | ○ | ○ | ○ | ○ | ○ | ○ | Δ | ⊚ | ○ |
| 3-312 | $Sb_{65}Te_{10}Ge_{10}C_{15}$ | ⊚ | ⊚ | ○ | ○ | ○ | ○ | Δ | ⊚ | ○ |
| 3-313 | $Sb_{65}Te_{10}Ge_5C_{20}$ | ⊚ | ⊚ | ○ | ○ | ○ | ○ | Δ | ○ | ○ |
| 3-314 | $Sb_{65}Te_8Ge_5C_{22}$ | ⊚ | ⊚ | ○ | Δ | ○ | ○ | Δ | Δ | Δ |
| 3-315 | $Sb_{63}Te_{10}Ge_5C_{22}$ | ⊚ | ⊚ | Δ | ○ | ○ | ○ | Δ | Δ | Δ |
| 3-316 | $Sb_{78}Te_{12}Ge_5C_5$ | ⊚ | ⊚ | ⊚ | ○ | ○ | ⊚ | ⊚ | ○ | ⊚ |
| 3-317 | $Sb_{75}Te_{15}Ge_5C_5$ | ⊚ | ⊚ | ⊚ | ○ | ○ | ○ | ○ | ○ | ⊚ |
| 3-318 | $Sb_{73}Te_{13}Ge_9C_5$ | ⊚ | ⊚ | ⊚ | ○ | ○ | ○ | Δ | ○ | ○ |
| 3-319 | $Sb_{75}Te_{11}Ge_9C_5$ | ⊚ | ⊚ | ⊚ | ○ | ⊚ | ○ | ○ | ○ | ⊚ |
| 3-320 | $Sb_{77}Te_{11}Ge_4C_8$ | ⊚ | ⊚ | ⊚ | Δ | ⊚ | ⊚ | ⊚ | ○ | ○ |
| 3-321 | $Sb_{74}Te_{14}Ge_4C_8$ | ⊚ | ⊚ | ⊚ | Δ | ⊚ | ○ | ○ | ○ | ○ |
| 3-322 | $Sb_{72}Te_{12}Ge_8C_8$ | ⊚ | ⊚ | ⊚ | ○ | ⊚ | ○ | ○ | ○ | ○ |
| 3-323 | $Sb_{72}Te_{10}Ge_8C_{10}$ | ⊚ | ⊚ | ⊚ | ○ | ⊚ | ○ | Δ | ○ | ○ |
| 3-005 | $Sb_{65}Te_{30}Ge_5$ | X | X | ○ | ○ | X | X | X | ⊚ | X |
| 3-006 | $Sb_{70}Te_{25}Ge_5$ | Δ | Δ | ○ | Δ | X | X | ○ | Δ | X |

In the information recording media 3 of the present example, the materials used for the recording layers 15 of the first information layers 31 were phase change materials represented by $Sb_{x1}Te_{x2}Ge_{x3}C_{x4}$ (atom %), where (X1, X2, X3, X4)=(65, 25, 5, 5), (65, 20, 10, 5), (65, 15, 10, 10), (60, 15, 15, 10), (70, 15, 10, 5), (80, 15, 3, 2), (80, 15, 1, 4), (65, 10, 20, 5), (65, 8, 22, 5), (73, 15, 10, 2), (70, 10, 10, 10), (65, 10, 10, 15), (65, 10, 5, 20), (65, 8, 5, 22), (63, 10, 5, 22), (78, 12, 5, 5), (75, 15, 5, 5), (73, 13, 9, 5), (75, 11, 9, 5), (77, 11, 4, 8), (74, 14, 4, 8), (72, 12, 8, 8), and (72, 10, 8, 10), respectively. These media were numbered 3-301 to 3-323, respectively. These recording layers 15 were formed using alloy sputtering targets each containing Sb, Te, Ge, and C, as in Example 1. The compositions of the sputtering targets used for forming the phase change materials also were the same as those of the sputtering targets used in Example 1, respectively.

As comparative examples, information recording media (numbered 3-005 and 3-006) were produced. Both of them had the above-mentioned configuration of the information recording medium 3, but the recording layers 15 thereof were formed of $Sb_{65}Te_{30}Ge_5$ and $Sb_{70}Te_{25}Ge_5$, respectively.

In the information recording media 3 of the present example and the information recording media of the present As shown in Table 9, all of the information recording media 3 (Disc No. 3-301 to 3-323) of the present example were significantly superior to the comparative examples 3-005 and 3-006 in terms of the shelf-life deterioration and Arc. OW deterioration at 2× and 4× speed recordings. Less than 65 atom % of Sb (Disc No. 3-304) lowered the rewriting performance at 2× speed recording. This means that the content of Sb preferably is at least 65 atom %. Less than 2 atom % of Ge (Disc No. 3-307) lowered the signal storage stability at 4× speed recording, and more than 20 atom % of Ge (Disc No. 3-309) lowered the rewriting performance at 2× speed recording. This means that the content of Ge preferably is at least 2 atom % but not more than 20 atom %. More than 20 atom % of C (Disc No. 3-314 and 3-315) lowered the rewriting performance and signal storage stability at 2× and 4× speed recordings. This means that the content of C preferably is 20 atom % or less.

Next, Table 10 shows the evaluation results of the shelf-life deterioration, Arc. OW deterioration, rewriting performance (erasure rate), and signal storage stability at 2× and 4× speed recordings, when 1× linear velocity was defined as 3.7 m/s (the shortest mark length (2T)=0.112 μm, periodic clock=66 MHz). The evaluation criteria for each of the evaluation items with ⊚, ○, Δ, and x were the same as in Example 1.

TABLE 10

| Disc No. | Recording layer 15 | 2x speed (=7.4 m/s) | | | | 4x speed (=14.8 m/s) | | | | Comprehensive evaluation |
|---|---|---|---|---|---|---|---|---|---|---|
| | | Shelf-life deterioration | Arc. OW deterioration | Rewriting performance | Storage stability | Shelf-life deterioration | Arc. OW deterioration | Rewriting performance | Storage stability | |
| 3-301 | $Sb_{65}Te_{25}Ge_5C_5$ | ○ | ○ | ○ | △ | △ | △ | △ | ○ | △ |
| 3-302 | $Sb_{65}Te_{20}Ge_{10}C_5$ | ○ | ○ | ○ | ○ | ○ | ○ | △ | ◎ | ○ |
| 3-303 | $Sb_{65}Te_{15}Ge_{10}C_{10}$ | ○ | ○ | ○ | ○ | ○ | ○ | △ | ◎ | ○ |
| 3-304 | $Sb_{60}Te_{15}Ge_{15}C_{10}$ | ○ | ○ | △ | ○ | ○ | △ | △ | ◎ | △ |
| 3-305 | $Sb_{70}Te_{15}Ge_{10}C_5$ | ○ | ○ | ◎ | ○ | ○ | ○ | ○ | ○ | ◎ |
| 3-306 | $Sb_{80}Te_{15}Ge_3C_2$ | ○ | ○ | ◎ | △ | ○ | ○ | ◎ | ○ | ○ |
| 3-307 | $Sb_{80}Te_{15}Ge_1C_4$ | ○ | ○ | ◎ | △ | ○ | ○ | ◎ | △ | △ |
| 3-308 | $Sb_{65}Te_{10}Ge_{20}C_5$ | ○ | ○ | ○ | ◎ | ○ | △ | △ | ◎ | △ |
| 3-309 | $Sb_{65}Te_8Ge_{22}C_5$ | ○ | ○ | △ | ◎ | ○ | △ | △ | ◎ | △ |
| 3-310 | $Sb_{73}Te_{15}Ge_{10}C_2$ | ○ | ○ | ◎ | ○ | ○ | ○ | ○ | ○ | ◎ |
| 3-311 | $Sb_{70}Te_{10}Ge_{10}C_{10}$ | ○ | ○ | ○ | ○ | ○ | ○ | △ | ◎ | ○ |
| 3-312 | $Sb_{65}Te_{10}Ge_{10}C_{15}$ | ◎ | ◎ | ○ | ○ | ○ | ○ | △ | ◎ | ○ |
| 3-313 | $Sb_{65}Te_{10}Ge_5C_{20}$ | ◎ | ◎ | ○ | △ | ○ | ○ | △ | ○ | △ |
| 3-314 | $Sb_{65}Te_8Ge_5C_{22}$ | ◎ | ◎ | ○ | △ | ○ | ○ | △ | △ | △ |
| 3-315 | $Sb_{63}Te_{10}Ge_5C_{22}$ | ◎ | ◎ | △ | ○ | ○ | ○ | △ | △ | △ |
| 3-316 | $Sb_{78}Te_{12}Ge_5C_5$ | ◎ | ◎ | ◎ | △ | ○ | ◎ | ◎ | ○ | ○ |
| 3-317 | $Sb_{75}Te_{15}Ge_5C_5$ | ◎ | ◎ | ◎ | △ | ○ | ○ | ○ | ○ | ○ |
| 3-318 | $Sb_{73}Te_{13}Ge_9C_5$ | ◎ | ◎ | ◎ | ○ | ○ | ○ | ○ | ○ | ◎ |
| 3-319 | $Sb_{75}Te_{11}Ge_9C_5$ | ◎ | ◎ | ◎ | ○ | ◎ | ○ | ○ | ○ | ◎ |
| 3-320 | $Sb_{77}Te_{11}Ge_4C_8$ | ◎ | ◎ | ◎ | △ | ◎ | ◎ | ◎ | ○ | ○ |
| 3-321 | $Sb_{74}Te_{14}Ge_4C_8$ | ◎ | ◎ | ◎ | △ | ◎ | ○ | ○ | ○ | ○ |
| 3-322 | $Sb_{72}Te_{12}Ge_8C_8$ | ◎ | ◎ | ◎ | △ | ◎ | ○ | ○ | ○ | ○ |
| 3-323 | $Sb_{72}Te_{10}Ge_8C_{10}$ | ◎ | ◎ | ◎ | △ | ◎ | ○ | ○ | ○ | ○ |
| 3-005 | $Sb_{65}Te_{30}Ge_5$ | X | X | ○ | ○ | X | X | X | ◎ | X |
| 3-006 | $Sb_{70}Te_{25}Ge_5$ | △ | △ | ○ | △ | X | X | ○ | △ | X |

As shown in Table 10, all of the information recording media 3 (Disc No. 3-301 to 3-323) of the present example were significantly superior to the comparative examples 3-005 and 3-006 in terms of the shelf-life deterioration and Arc. OW deterioration at 2x and 4x speed recordings. As in the results of Table 9, less than 65 atom % of Sb (Disc No. 3-304) lowered the rewriting performance at 2x speed recording. This means that the content of Sb preferably is at least 65 atom %. Less than 2 atom % of Ge (Disc No. 3-307) lowered the signal storage stability at 4x speed recording, and more than 20 atom % of Ge (Disc No. 3-309) lowered the rewriting performance at 2x speed recording. This means that the content of Ge preferably is at least 2 atom % but not more than 20 atom %. More than 20 atom % of C (Disc No. 3-314 and 3-315) lowered the rewriting performance and signal storage stability at 2x and 4x speed recordings. This means that the content of C preferably is 20 atom % or less.

As described above, it has been proved that the present invention makes it possible to obtain information recording media having better properties than those of the conventional information recording media.

Example 6

The present example is an example in which a material obtained by adding further B, or N and/or Si into $Sb_{65}Te_{25}Ge_5C_5$ (atom %) was used as the material for the recording layer 15 of the information recording medium 1 of Example 1. The method for producing the information recording media 1 of the present example was the same as in Example 1.

In the information recording media 1 of the present example, the materials used for the recording layers 15 were materials obtained by adding one of B, N, and Si in amounts of 2 atom %, 5 atom %, 10 atom %, and 13 atom %, respectively, into $Sb_{65}Te_{25}Ge_5C_5$ (atom %). These media were numbered 1-201 to 1-212, respectively, as shown in Table 11. Another information recording medium 1 containing 3 atom % of Si and 2 atom % of N added was produced and numbered 1-213. The B-containing recording layers 15 were formed using alloy sputtering targets each containing Sb, Te, Ge, C and B. Specifically, sputtering targets with a composition (for example, $(Sb_{62}Te_{28}Ge_5C_5)_{95}B_5$ (atom %)) obtained by adding B in amounts of 2 atom %, 5 atom %, 10 atom %, and 13 atom %, respectively, into a sputtering target composed of $Sb_{62}Te_{28}Ge_5C_5$ (atom %) were used. The Si-containing recording layers 15 were formed using alloy sputtering targets each containing Sb, Te, Ge, C and Si. Specifically, sputtering targets with a composition (for example, $(Sb_{62}Te_{28}Ge_5C_{95})_{95}Si_5$ (atom %)) obtained by adding Si in amounts of 2 atom %, 5 atom %, 10 atom %, and 13 atom %, respectively, into a sputtering target composed of $Sb_{62}Te_{28}Ge_5C_5$ (atom %) were used. The N-containing recording layers 15 were formed by sputtering reactively an alloy sputtering target containing Sb, Te, Ge, and C in an atmosphere of Ar and $N_2$. Specifically, the N-containing recording layers 15 were formed by sputtering reactively a sputtering target composed of $Sb_{62}Te_{28}Ge_5C_5$ (atom %) in an atmosphere of a gas obtained by mixing an $N_2$ gas of $3.38 \times 10^{-3}$ Pa·m³/s (2 sccm), $8.45 \times 10^{-3}$ Pa·m³/s (5 sccm), $1.69 \times 10^{-2}$ Pa·m³/s (10 sccm), or $2.197 \times 10^{-2}$ Pa·m³/s (13 sccm) into an Ar gas flow. The recording layer 15 containing 3 atom % of Si and 2 atom % of N added was formed by sputtering reactively an alloy sputtering target containing Sb, Te, Ge, C, and Si in an atmosphere of Ar and $N_2$. Specifically, the recording layer 15 was formed by sputtering reactively a sputtering target composed of $Sb_{60}Te_{27}Ge_5C_5Si_3$ (atom %) in an atmosphere of a gas obtained by mixing an $N_2$ gas of $3.38 \times 10^{-3}$ Pa·m³/s (2 sccm) into an Ar gas flow.

These information recording media 1 were compared with the information recording medium (Disc No. 1-101) containing no B, N, and Si.

Discs No. 1-201 to 1-213 of the present example and Disc No. 1-101 for comparison thus produced were evaluated, as in Example 1, for shelf-life deterioration, Arc. OW deterioration, rewriting performance (erasure rate), and signal storage stability at 2× and 4× speed recordings. In the present example, a reproducing power of 0.35 mW was used as in Example 1.

Table 11 shows the evaluation results of the shelf-life deterioration, Arc. OW deterioration, rewriting performance (erasure rate), and signal storage stability at 2× and 4× speed recordings, when 1× linear velocity was defined as 4.9 m/s (the shortest mark length (2T)=0.149 μm, periodic clock=66 MHz). The evaluation criteria for each of the evaluation items with ⊚, ○, Δ, and x were the same as in Example 1.

2 atom %, 5 atom %, and 10 atom %, were superior to Disc No. 1-101 in terms of the shelf-life deterioration or Arc. OW deterioration. This means that adding B, N, or Si can suppress further the shelf-life deterioration and Arc. OW deterioration. The information recording media 1 (Disc No. 1-204, 1-208, and 1-212) containing any of these elements in an amount of 13 atom % were superior to Disc No. 1-101 in terms of the shelf-life deterioration and Arc. OW deterioration. However, these media had a lowered signal storage stability, and their comprehensive evaluations were equivalent to that of Disc No. 1-101. This means that the addition amount of each of B, N, and Si preferably is 10 atom % or less.

Next, Table 12 shows the evaluation results of the shelf-life deterioration, Arc. OW deterioration, rewriting performance (erasure rate), and signal storage stability at 2× and 4× speed recordings, when 1× linear velocity was defined as 3.7 m/s

TABLE 11

| Disc No. | Element added | Addition amount (atom %) | 2× speed (=9.8 m/s) | | | | 4× speed (=19.6 m/s) | | | | Comprehensive evaluation |
|---|---|---|---|---|---|---|---|---|---|---|---|
| | | | Shelf-life deterioration | Arc. OW deterioration | Rewriting performance | Storage stability | Shelf-life deterioration | Arc. OW deterioration | Rewriting performance | Storage stability | |
| 1-201 | B | 2 | ○ | ○ | ○ | ○ | Δ | ○ | Δ | ○ | ○ |
| 1-202 | B | 5 | ○ | ○ | ○ | ○ | ○ | ○ | Δ | ○ | ○ |
| 1-203 | B | 10 | ⊚ | ⊚ | ○ | ○ | ○ | ○ | Δ | ○ | ○ |
| 1-204 | B | 13 | ⊚ | ⊚ | ○ | Δ | ○ | ○ | Δ | ○ | Δ |
| 1-205 | N | 2 | ○ | ○ | ○ | ○ | Δ | ○ | Δ | ○ | ○ |
| 1-206 | N | 5 | ○ | ○ | ○ | ○ | ○ | ○ | Δ | ○ | ○ |
| 1-207 | N | 10 | ⊚ | ⊚ | ○ | ○ | ○ | ○ | Δ | ○ | ○ |
| 1-208 | N | 13 | ⊚ | ⊚ | ○ | Δ | ○ | ○ | Δ | ○ | Δ |
| 1-209 | Si | 2 | ○ | ○ | ○ | ○ | Δ | ○ | Δ | ○ | ○ |
| 1-210 | Si | 5 | ○ | ○ | ○ | ○ | ○ | ○ | Δ | ○ | ○ |
| 1-211 | Si | 10 | ⊚ | ⊚ | ○ | ○ | ○ | ○ | Δ | ○ | ○ |
| 1-212 | Si | 13 | ⊚ | ⊚ | ○ | Δ | ○ | ○ | Δ | ○ | Δ |
| 1-213 | Si, N | Si = 3, N = 2 | ○ | ○ | ○ | ○ | ○ | ○ | Δ | ○ | ○ |
| 1-101 | Nothing added | 0 | ○ | ○ | ○ | ○ | Δ | Δ | Δ | ○ | Δ |

As shown in Table 11, the information recording media 1 (Disc No. 1-201 to 1-203, 1-205 to 1-207, 1-209 to 1-211, and 1-213), each containing any of these elements in an amount of (the shortest mark length (2T)=0.112 μm, periodic clock=66 MHz). The evaluation criteria for each of the evaluation items with ⊚, ○, Δ, and x were the same as in Example 1.

TABLE 12

| Disc No. | Element added | Addition amount (atom %) | 2× speed (=7.4 m/s) | | | | 4× speed (=14.8 m/s) | | | | Comprehensive evaluation |
|---|---|---|---|---|---|---|---|---|---|---|---|
| | | | Shelf-life deterioration | Arc. OW deterioration | Rewriting performance | Storage stability | Shelf-life deterioration | Arc. OW deterioration | Rewriting performance | Storage stability | |
| 1-201 | B | 2 | ○ | ○ | ○ | Δ | Δ | ○ | Δ | ○ | ○ |
| 1-202 | B | 5 | ○ | ○ | ○ | Δ | ○ | ○ | Δ | ○ | ○ |
| 1-203 | B | 10 | ⊚ | ⊚ | ○ | Δ | ○ | ○ | Δ | ○ | ○ |
| 1-204 | B | 13 | ⊚ | ⊚ | ○ | Δ | ○ | ○ | Δ | ○ | Δ |
| 1-205 | N | 2 | ○ | ○ | ○ | Δ | Δ | ○ | Δ | ○ | ○ |
| 1-206 | N | 5 | ○ | ○ | ○ | Δ | ○ | ○ | Δ | ○ | ○ |
| 1-207 | N | 10 | ⊚ | ⊚ | ○ | Δ | ○ | ○ | Δ | ○ | ○ |
| 1-208 | N | 13 | ⊚ | ⊚ | ○ | Δ | ○ | ○ | Δ | ○ | Δ |
| 1-209 | Si | 2 | ○ | ○ | ○ | Δ | Δ | ○ | Δ | ○ | ○ |
| 1-210 | Si | 5 | ○ | ○ | ○ | Δ | ○ | ○ | Δ | ○ | ○ |
| 1-211 | Si | 10 | ⊚ | ⊚ | ○ | Δ | ○ | ○ | Δ | ○ | ○ |
| 1-212 | Si | 13 | ⊚ | ⊚ | ○ | Δ | ○ | ○ | Δ | ○ | Δ |
| 1-213 | Si, N | Si = 3, N = 2 | ○ | ○ | ○ | Δ | ○ | ○ | Δ | ○ | ○ |
| 1-101 | Nothing added | 0 | ○ | ○ | ○ | Δ | Δ | Δ | Δ | ○ | Δ |

As shown in Table 12, the information recording media 1 (Disc No. 1-201 to 1-213), each containing any of these elements in any of these amounts, were superior to Disc No. 1-101 in terms of the shelf-life deterioration or Arc. OW deterioration. This means that adding B, N, or Si has the effect of suppressing further the shelf-life deterioration and Arc. OW deterioration. That is, B, N, and Si have a function of suppressing the state change of the recording layer caused by the accelerated test, like C. Also, each of them did not lower the signal storage stability as long as the addition amount thereof was 10 atom % or less.

Example 7

The present example is an example in which a material obtained by adding further Bi into $Sb_{70}Te_{15}Ge_{10}C_5$ (atom %) was used as the material for the recording layer 15 of the information recording medium 1 of Example 1. The method for producing the information recording media 1 of the present example is the same as in Example 1.

The information recording media 1 of the present example each included the recording layer 15 composed of a material obtained by adding Bi in an amount of 2 atom %, 5 atom %, 10 atom %, or 13 atom %. These media were numbered 1-301 to 1-304, respectively. The Bi-containing recording layers 15 were formed using alloy sputtering targets each containing Sb, Te, Ge, C and Bi. Specifically, sputtering targets with a composition (for example, $(Sb_{67}Te_{15}Ge_{10}C_5)_{95}Bi_5$ (atom %)) obtained by adding Bi in amounts of 2 atom %, 5 atom %, 10 atom %, and 13 atom %, respectively, into a sputtering target composed of $Sb_{67}Te_{15}Ge_{10}C_5$ (atom %) were used.

These information recording media 1 were compared with the information recording medium (Disc No. 1-105) containing no Bi.

Discs No. 1-301 to 1-304 of the present example and Disc No. 1-105 for comparison thus produced were evaluated, as in Example 1, for shelf-life deterioration, Arc. OW deterioration, rewriting performance (erasure rate), and signal storage stability at 4× speed recording. In the present example, a reproducing power of 0.35 mW was used as in Example 1.

Table 13 shows the evaluation results of the shelf-life deterioration, Arc. OW deterioration, rewriting performance (erasure rate), and signal storage stability at 4× speed recording, when 1× linear velocity was defined as 4.9 m/s (the shortest mark length (2T)=0.149 μm, periodic clock=66 MHz). The evaluation criteria for each of the evaluation items with ⊚, ○, Δ, and x were the same as in Example 1.

TABLE 13

| | | Addition | 4× speed (=19.6 m/s) | | | |
|---|---|---|---|---|---|---|
| Disc No. | Element added | amount (atom %) | Shelf-life deterioration | Arc. OW deterioration | Rewriting performance | Storage stability |
| 1-301 | Bi | 2 | ○ | ○ | ○ | ○ |
| 1-302 | Bi | 5 | ○ | ○ | ○ | ○ |
| 1-303 | Bi | 10 | ○ | ○ | ○ | ○ |
| 1-304 | Bi | 13 | ○ | ○ | ○ | Δ |
| 1-105 | Nothing added | 0 | ○ | ○ | Δ | ○ |

As shown in Table 13, the information recording media 1 (Disc No. 1-301 to 1-303) containing Bi in amounts of 2 atom %, 5 atom %, and 10 atom %, respectively, were superior to Disc No. 1-105 in terms of the rewriting performance. This means that Bi has the function of enhancing the crystallization ability. The information recording medium 1 (Disc No. 1-304) containing 13 atom % of Bi was superior to Disc No. 1-105 in terms of the rewriting performance. However, this medium had a lowered signal storage stability, and its comprehensive evaluation was equivalent to that of Disc No. 1-105. This means that the addition amount of Bi preferably is 10 atom % or less.

Next, Table 14 shows the evaluation results of the shelf-life deterioration, Arc. OW deterioration, rewriting performance (erasure rate), and signal storage stability at 4× speed recording, when 1× linear velocity was defined as 3.7 m/s (the shortest mark length (2T)=0.112 μm, periodic clock=66 MHz). The evaluation criteria for each of the evaluation items with ⊚, ○, Δ, and x were the same as in Example 1.

TABLE 14

| | | Addition | 4× speed (=14.8 m/s) | | | |
|---|---|---|---|---|---|---|
| Disc No. | Element added | amount (atom %) | Shelf-life deterioration | Arc. OW deterioration | Rewriting performance | Storage stability |
| 1-301 | Bi | 2 | ○ | ○ | ⊚ | ○ |
| 1-302 | Bi | 5 | ○ | ○ | ⊚ | ○ |
| 1-303 | Bi | 10 | ○ | ○ | ⊚ | ○ |
| 1-304 | Bi | 13 | ○ | ○ | ⊚ | Δ |
| 1-105 | Nothing added | 0 | ○ | ○ | ○ | ○ |

As shown in Table 14, the information recording media 1 (Disc No. 1-301 to 1-303) containing Bi in amounts of 2 atom %, 5 atom %, and 10 atom %, respectively, were superior to Disc No. 1-105 in terms of the rewriting performance. This means that Bi has the function of enhancing the crystallization ability. The information recording medium 1 (Disc No. 1-304) containing 13 atom % of Bi was superior to Disc No. 1-105 in terms of the rewriting performance. However, this medium had a lowered signal storage stability, and its comprehensive evaluation was equivalent to that of Disc No. 1-105. This means that the addition amount of Bi preferably is 10 atom % or less.

Example 8

The present example is an example in which a material obtained by adding further at least one element (referred to as M') selected from Al, Ga, In, Zn, Cu, Ag, Au, Mn, Cr, W, Ti, Ta, Zr, Gd, and Tb into $Sb_{80}Te_{15}Ge_3C_2$ (atom %) was used as the material for the recording layer 15 of the information recording medium 1 of Example 1. The method for producing the information recording media 1 of the present example is the same as in Example 1.

In the present example, some of the information recording media 1 included the recording layer 15 containing one of the elements Ga, In, Zn, Ag, Ti, and Ta in an amount of 2 atom %, 5 atom %, 10 atom %, or 13 atom %. These media were numbered 1-401 to 1-424, respectively, as shown in Table 15. Also, some of the information recording media 1 included the recording layer 15 containing one of Al, Cu, Au, Mn, Cr, W, Zr, Gd, and Tb in an amount of 5 atom %. These media were numbered 1-425 to 1-433, respectively, as shown in Table 15. In addition, the medium containing 3 atom % of In and 2 atom % of Zn was numbered 1-434. The medium containing 3 atom % of In and 2 atom % of Ag was numbered 1-435. The medium containing 3 atom % of In and 2 atom % of Cr was numbered 1-436. The medium containing 3 atom % of In and 2 atom % of Zr was numbered 1-437. The M'-added recording layers 15 were formed using alloy sputtering targets each containing Sb, Te, Ge, C, and M'. Specifically, sputtering targets with a composition (for example, $(Sb_{77}Te_{18}Ge_3C_2)_{95}In_5$ (atom %), $(Sb_{77}Te_{15}Ge_3C_2)_{90}In_{10}$ (atom %), $(Sb_{77}Te_{18}Ge_3C_2)_{95}Zn_5$ (atom %), $(Sb_{77}Te_{18}Ge_3C_2)_{95}Ti_5$ (atom %), $(Sb_{77}Te_{15}Ge_3C_2)_{95}Al_5$ (atom %), $(Sb_{77}Te_{18}Ge_3C_2)_{95}(In_3Zn_2)_5$ (atom %), and $(Sb_{77}Te_{18}Ge_3C_2)_{95}(In_3Ag_2)_5$ (atom %)) obtained by adding M' in amounts of 2 atom %, 5 atom %, 10 atom %, and 13 atom %, respectively, into a sputtering target composed of $Sb_{77}Te_{15}Ge_3C_2$ (atom %) were used.

These information recording media 1 were compared with the information recording medium (Disc No. 1-106) including the recording layer 15 containing no M'.

As in Example 1, Disc No. 1-401 to 1-437 of the present example and Disc No. 1-106 for comparison thus produced were evaluated for shelf-life deterioration, Arc. OW deterioration, rewriting performance (erasure rate), and signal storage stability at 2× speed recording. In the present example, each of the evaluations was made using a reproducing power of 0.35 mW as in Example 1.

Table 15 shows the evaluation results of the shelf-life deterioration, Arc. OW deterioration, rewriting performance (erasure rate), and signal storage stability at 2× speed recording, when 1× linear velocity was defined as 4.9 m/s (the shortest mark length (2T)=0.149 μm, periodic clock=66 MHz). The evaluation criteria for each of the evaluation items with ⊚, ○, Δ, and x were the same as in Example 1.

TABLE 15

| Disc No. | Element added | Addition amount (atom %) | 2× speed (=9.8 m/s) | | | |
|---|---|---|---|---|---|---|
| | | | Shelf-life deterioration | Arc. OW deterioration | Rewriting performance | Storage stability |
| 1-401 | Ga | 2 | ○ | ○ | ⊚ | ○ |
| 1-402 | Ga | 5 | ○ | ○ | ⊚ | ○ |
| 1-403 | Ga | 10 | ○ | ○ | ○ | ⊚ |
| 1-404 | Ga | 13 | ○ | ○ | Δ | ⊚ |
| 1-405 | In | 2 | ○ | ○ | ⊚ | ○ |
| 1-406 | In | 5 | ○ | ○ | ⊚ | ⊚ |
| 1-407 | In | 10 | ○ | ○ | ○ | ⊚ |
| 1-408 | In | 13 | ○ | ○ | ○ | ⊚ |
| 1-409 | Zn | 2 | ○ | ○ | ⊚ | ○ |
| 1-410 | Zn | 5 | ○ | ○ | ⊚ | ⊚ |
| 1-411 | Zn | 10 | ○ | ○ | ○ | ⊚ |
| 1-412 | Zn | 13 | ○ | ○ | ○ | ⊚ |
| 1-413 | Ag | 2 | ○ | ○ | ⊚ | ○ |
| 1-414 | Ag | 5 | ○ | ○ | ⊚ | ○ |
| 1-415 | Ag | 10 | ○ | ○ | ○ | ⊚ |
| 1-416 | Ag | 13 | ○ | ○ | Δ | ⊚ |
| 1-417 | Ti | 2 | ○ | ○ | ⊚ | ○ |
| 1-418 | Ti | 5 | ○ | ○ | ⊚ | ○ |
| 1-419 | Ti | 10 | ○ | ○ | ○ | ⊚ |
| 1-420 | Ti | 13 | ○ | ○ | Δ | ⊚ |
| 1-421 | Ta | 2 | ○ | ○ | ⊚ | ○ |
| 1-422 | Ta | 5 | ○ | ○ | ⊚ | ○ |
| 1-423 | Ta | 10 | ○ | ○ | ○ | ⊚ |
| 1-424 | Ta | 13 | ○ | ○ | Δ | ⊚ |
| 1-425 | Al | 5 | ○ | ○ | ⊚ | ○ |
| 1-426 | Cu | 5 | ○ | ○ | ⊚ | ○ |
| 1-427 | Au | 5 | ○ | ○ | ⊚ | ○ |
| 1-428 | Mn | 5 | ○ | ○ | ⊚ | ○ |
| 1-429 | Cr | 5 | ○ | ○ | ⊚ | ○ |
| 1-430 | W | 5 | ○ | ○ | ⊚ | ○ |
| 1-431 | Zr | 5 | ○ | ○ | ⊚ | ○ |
| 1-432 | Gd | 5 | ○ | ○ | ⊚ | ○ |
| 1-433 | Tb | 5 | ○ | ○ | ⊚ | ○ |
| 1-434 | In, Zn | In = 3, Zn = 2 | ○ | ○ | ⊚ | ⊚ |
| 1-435 | In, Ag | In = 3, Ag = 2 | ○ | ○ | ⊚ | ○ |
| 1-436 | In, Cr | In = 3, Cr = 2 | ○ | ○ | ⊚ | ○ |
| 1-437 | In, Zr | In = 3, Zr = 2 | ○ | ○ | ⊚ | ○ |
| 1-106 | Nothing added | 0 | ○ | ○ | ⊚ | Δ |

As shown in Table 15, the information recording media 1 (Disc No. 1-401 to 1-437), each containing any of these elements in any of these amounts, were superior to Disc No. 1-106 in terms of the signal storage stability. This means that, like Ge, the elements added in the present example each have the function of enhancing the signal storage stability. However, the information recording media 1 (Disc No. 1-404, 1-408, 1-412, 1-416, 1-420, and 1-424) containing 13 atom % of Ga, In, Zn, Ag, Ti, or Ta had a lowered rewriting performance. This means that the addition amount of each of Ga, In, Zn, Ag, Ti, and Ta preferably is 10 atom % or less.

Next, Table 16 shows the evaluation results of the shelf-life deterioration, Arc. OW deterioration, rewriting performance (erasure rate), and signal storage stability at 2× speed recording, when 1× linear velocity was defined as 3.7 m/s (the shortest mark length (2T)=0.112 μm, periodic clock=66 MHz). The evaluation criteria for each of the evaluation items with ⊚, ○, Δ, and x were the same as in Example 1.

1-408, 1-412, 1-416, 1-420, and 1-424) containing 13 atom % of Ga, In, Zn, Ag, Ti, or Ta had a lowered rewriting performance. This means that the addition amount of each of Ga, In, Zn, Ag, Ti, and Ta preferably is 10 atom % or less.

Moreover, it has been proved that the elements (S, Mg, Ni, Nb, Y, Ce, Nd, and Dy) that were not added in the present example have the same properties as those mentioned above. These results indicate that in order to enhance the signal storage stability, it is preferable to allow the recording layer to contain at least one element selected from Al, Ga, In, Mg, Zn, Cu, Ag, Au, Ni, Mn, Cr, W, Ti, Nb, Ta, Zr, Y, Ce, Nd, Gd, Tb, and Dy. It has been proved experimentally that, although not shown in Table 15, addition of S (preferably in an amount of 10 atom % or less) increases the amount of optical change between the crystalline phase and the amorphous phase, and enhances the modulation degree and the quality of reproduced signal of the information recording medium 1.

TABLE 16

| Disc No. | Element added | Addition amount (atom %) | 2× speed (=7.4 m/s) | | |
|---|---|---|---|---|---|
| | | | Shelf-life deterioration | Arc. OW deterioration | Rewriting performance | Storage stability |
| 1-401 | Ga | 2 | ○ | ○ | ⊚ | ○ |
| 1-402 | Ga | 5 | ○ | ○ | ⊚ | ○ |
| 1-403 | Ga | 10 | ○ | ○ | ○ | ⊚ |
| 1-404 | Ga | 13 | ○ | ○ | Δ | ⊚ |
| 1-405 | In | 2 | ○ | ○ | ⊚ | ○ |
| 1-406 | In | 5 | ○ | ○ | ⊚ | ⊚ |
| 1-407 | In | 10 | ○ | ○ | ○ | ⊚ |
| 1-408 | In | 13 | ○ | ○ | Δ | ⊚ |
| 1-409 | Zn | 2 | ○ | ○ | ⊚ | ○ |
| 1-410 | Zn | 5 | ○ | ○ | ⊚ | ⊚ |
| 1-411 | Zn | 10 | ○ | ○ | ○ | ⊚ |
| 1-412 | Zn | 13 | ○ | ○ | Δ | ⊚ |
| 1-413 | Ag | 2 | ○ | ○ | ⊚ | ○ |
| 1-414 | Ag | 5 | ○ | ○ | ⊚ | ○ |
| 1-415 | Ag | 10 | ○ | ○ | ○ | ⊚ |
| 1-416 | Ag | 13 | ○ | ○ | Δ | ⊚ |
| 1-417 | Ti | 2 | ○ | ○ | ⊚ | ○ |
| 1-418 | Ti | 5 | ○ | ○ | ⊚ | ○ |
| 1-419 | Ti | 10 | ○ | ○ | ○ | ⊚ |
| 1-420 | Ti | 13 | ○ | ○ | Δ | ⊚ |
| 1-421 | Ta | 2 | ○ | ○ | ⊚ | ○ |
| 1-422 | Ta | 5 | ○ | ○ | ⊚ | ○ |
| 1-423 | Ta | 10 | ○ | ○ | ○ | ⊚ |
| 1-424 | Ta | 13 | ○ | ○ | Δ | ⊚ |
| 1-425 | Al | 5 | ○ | ○ | ⊚ | ○ |
| 1-426 | Cu | 5 | ○ | ○ | ⊚ | ○ |
| 1-427 | Au | 5 | ○ | ○ | ⊚ | ○ |
| 1-428 | Mn | 5 | ○ | ○ | ⊚ | ○ |
| 1-429 | Cr | 5 | ○ | ○ | ⊚ | ○ |
| 1-430 | W | 5 | ○ | ○ | ⊚ | ○ |
| 1-431 | Zr | 5 | ○ | ○ | ⊚ | ○ |
| 1-432 | Gd | 5 | ○ | ○ | ⊚ | ○ |
| 1-433 | Tb | 5 | ○ | ○ | ⊚ | ○ |
| 1-434 | In, Zn | In = 3, Zn = 2 | ○ | ○ | ⊚ | ⊚ |
| 1-435 | In, Ag | In = 3, Ag = 2 | ○ | ○ | ⊚ | ○ |
| 1-436 | In, Cr | In = 3, Cr = 2 | ○ | ○ | ⊚ | ○ |
| 1-437 | In, Zr | In = 3, Zr = 2 | ○ | ○ | ⊚ | ○ |
| 1-106 | Nothing added | 0 | ○ | ○ | ⊚ | Δ |

As shown in Table 16, the information recording media 1 (Disc No. 1-401 to 1-437), each containing any of these elements in any of these amounts, were superior to Disc No. 1-106 in terms of the signal storage stability. This means that, like Ge, the elements added in the present example each have the function of enhancing the signal storage stability. However, the information recording media 1 (disc No. 1-404, Example 9

The present example is an example in which $Sb_{75}Te_{12}Ge_8C_5$ was used as the material for the recording layer 15 of the information recording medium 1 of Example 1, and various dielectric materials were used as the materials for the first interface layer 14 and the second interface layer 16. The method for producing the information recording media 1 of the present example is the same as in Example 1.

The information recording media 1 of the present example included the second interface layer 14 and the second interface layer 16 represented by [the first interface layer 14, the second interface layer 16]=[$(ZrO_2)_{50}(Cr_2O_3)_{50}$, $(ZrO_2)_{50}(Cr_2O_3)_{50}$], [$(HfO_2)_{50}(Cr_2O_3)_{50}$, $(ZrO_2)_{50}(Cr_2O_3)_{50}$], [$(ZrO_2)_{70}(Bi_2O_3)_{30}$, $(ZrO_2)_{50}(Cr_2O_3)_{50}$], [$(ZrO_2)_{50}(In_2O_3)_{50}$, $(ZrO_2)_{50}(Cr_2O_3)_{50}$], [$(ZrO_2)_{60}(Ga_2O_3)_{40}$, $(ZrO_2)_{50}(Cr_2O_3)_{50}$], [$(ZrO_2)_{50}(Al_2O_3)_{50}$, $(ZrO_2)_{50}(Cr_2O_3)_{50}$], [$(ZrO_2)_{50}(Cr_2O_3)_{50}$, $(ZrO_2)_{65}(Ga_2O_3)_{35}$], [$(ZrO_2)_{70}(TiO_2)_{30}$, $(ZrO_2)_{50}(Cr_2O_3)_{50}$], [$ZrO_{26}(Nb_2O_5)_{30}$, $(ZrO_2)_{50}(Cr_2O_3)_{50}$], [$(ZrO_2)_{70}(ZnO)_{30}$, $(ZrO_2)_{50}(Cr_2O_3)_{50}$], [$(ZrO_2)_{70}(Dy_2O_3)_{30}$, $(ZrO_2)_{50}(Cr_2O_3)_{50}$], [$(ZrO_2)_{35}(SiO_2)_{35}(Cr_2O_3)_{30}$, $(ZrO_2)_{5}O(Cr_2O_3)_{50}$], [$(ZrO_2)_{50}(Y_2O_3)_{10}(Cr_2O_3)_{30}$, $(ZrO_2)_{50}(Cr_2O_3)_{50}$], [$(ZrO_2)_{35}(SiO_2)_{35}(In_2O_3)_{30}$, $(ZrO_2)_{50}(Cr_2O_3)_{50}$], [$(ZnO_2)_{30}(SiO_2)_{20}(In_2O_3)_{20}(Cr_2O_3)_{30}$, $(ZrO_2)_{50}(Cr_2O_3)_{50}$], [$(ZrO_2)_{30}(SiO_2)_{20}(TiO_2)_{20}(Cr_2O_3)_{30}$, $(ZrO_2)_{50}(Cr_2O_3)_{50}$], [$(ZnO_2)_{50}(Cr_2O_3)_{50}$, $(HfO_2)_{50}(Cr_2O_3)_{50}$], [$(ZnO_2)_{50}(Cr_2O_3)_{50}$, $(ZrO_2)_{70}(Bi_2O_3)_{30}$], [$(ZrO_2)_{50}(Cr_2O_3)_{50}$, $(ZrO_2)_{25}(SiO_2)_{25}(Cr_2O)_{50}$], [$(ZrO_2)_{50}(Cr_2O_3)_{50}$, $(ZrO_2)_{45}(Y_2O)_5(Cr_2O_3)_{50}$], [$(ZnO_2)_{35}(SiO_2)_{35}(Cr_2O_3)_{30}$, $(ZrO_{25}(SiO_2)_{25}(Cr_2O_3)_{50}$] and [$(ZrO_2)_{30}(SiO_2)_{20}(In_2O_3)_{20}(Cr_2O_3)_{30}$, $(ZrO_2)_{25}(SiO_2)_{25}(Cr_2O_3)_{50}$], respectively. These materials are denoted as mol %. These media were numbered 1-501 to 1-521. As a comparative example, there was prepared the information recording medium 1 including the first interface layer 14 and the second interface layer 16, each composed of $(ZnS)_{80}(SiO_2)_{20}$ (mol %) that is a material conventionally used for the interface layer. This medium was referred to as Comparative Example 1-005.

Disc No. 1-501 to 1-521 of the present example and Disc No. 1-005 thus produced were evaluated, as in Example 1, for shelf-life deterioration, Arc. OW deterioration, rewriting performance (erasure rate), and signal storage stability at 2× and 4× speed recordings. In the present example, the reproducing power was 0.35 mW as in Example 1.

Table 17 shows the evaluation results of the shelf-life deterioration, Arc. OW deterioration, rewriting performance (erasure rate), and signal storage stability at 2× and 4× speed recordings, when 1× linear velocity was defined as 4.9 m/s (the shortest mark length (2T)=0.149 μm, periodic clock=66 MHz). The evaluation criteria for each of the evaluation items with ⊚, ○, Δ, and × were the same as in Example 1.

TABLE 17

| Disc No. | First interface layer 14 | Second interface layer 16 | Shelf-life deterioration | Arc. OW deterioration | Rewriting performance | Storage stability |
|---|---|---|---|---|---|---|
| | | | \multicolumn{4}{c}{2× speed (=9.8 m/s)} |
| 1-501 | $(ZrO_2)_{50}(Cr_2O_3)_{50}$ | $(ZrO_2)_{50}(Cr_2O_3)_{50}$ | ○ | ○ | ⊚ | Δ |
| 1-502 | $(HfO_2)_{50}(Cr_2O_3)_{50}$ | $(ZrO_2)_{50}(Cr_2O_3)_{50}$ | ○ | ○ | ⊚ | Δ |
| 1-503 | $(ZrO_2)_{70}(Bi_2O_3)_{30}$ | $(ZrO_2)_{50}(Cr_2O_3)_{50}$ | ○ | ○ | ⊚ | Δ |
| 1-504 | $(ZrO_2)_{50}(In_2O_3)_{50}$ | $(ZrO_2)_{50}(Cr_2O_3)_{50}$ | ○ | ○ | ○ | ⊚ |
| 1-505 | $(ZrO_2)_{60}(Ga_2O_3)_{40}$ | $(ZrO_2)_{50}(Cr_2O_3)_{50}$ | ○ | ○ | ○ | ⊚ |
| 1-506 | $(ZrO_2)_{50}(Al_2O_3)_{50}$ | $(ZrO_2)_{50}(Cr_2O_3)_{50}$ | ○ | ○ | ○ | ○ |
| 1-507 | $(ZrO_2)_{70}(TiO_2)_{30}$ | $(ZrO_2)_{50}(Cr_2O_3)_{50}$ | ○ | ○ | ○ | ○ |
| 1-508 | $(ZrO_2)_{70}(Nb_2O_5)_{30}$ | $(ZrO_2)_{50}(Cr_2O_3)_{50}$ | ○ | ○ | ○ | ○ |
| 1-509 | $(ZrO_2)_{70}(ZnO)_{30}$ | $(ZrO_2)_{50}(Cr_2O_3)_{50}$ | ○ | ○ | ○ | ○ |
| 1-510 | $(ZrO_2)_{70}(Dy_2O_3)_{30}$ | $(ZrO_2)_{50}(Cr_2O_3)_{50}$ | ○ | ○ | ○ | ○ |
| 1-511 | $(ZrO_2)_{35}(SiO_2)_{35}(Cr_2O_3)_{30}$ | $(ZrO_2)_{50}(Cr_2O_3)_{50}$ | ○ | ○ | ⊚ | Δ |
| 1-512 | $(ZrO_2)_{50}(Y_2O_3)_{10}(Cr_2O_3)_{30}$ | $(ZrO_2)_{50}(Cr_2O_3)_{50}$ | ○ | ○ | ⊚ | Δ |
| 1-513 | $(ZrO_2)_{35}(SiO_2)_{35}(In_2O_3)_{30}$ | $(ZrO_2)_{50}(Cr_2O_3)_{50}$ | ○ | ○ | ○ | ⊚ |
| 1-514 | $(ZrO_2)_{30}(SiO_2)_{20}(In_2O_3)_{20}(Cr_2O_3)_{30}$ | $(ZrO_2)_{50}(Cr_2O_3)_{50}$ | ○ | ○ | ○ | ○ |
| 1-515 | $(ZrO_2)_{30}(SiO_2)_{30}(TiO_2)_{20}(Cr_2O_3)_{50}$ | $(ZrO_2)_{50}(TiO_2)_{50}$ | ○ | ○ | ○ | ○ |
| 1-516 | $(ZrO_2)_{50}(Cr_2O_3)_{50}$ | $(HfO_2)_{50}(Cr_2O_3)_{50}$ | ○ | ○ | ⊚ | Δ |
| 1-517 | $(ZrO_2)_{50}(Cr_2O_3)_{50}$ | $(ZrO_2)_{70}(Bi_2O_3)_{30}$ | ○ | ○ | ⊚ | Δ |
| 1-518 | $(ZrO_2)_{50}(Cr_2O_3)_{50}$ | $(ZrO_2)_{25}(SiO_2)_{25}(Cr_2O_3)_{50}$ | ○ | ○ | ⊚ | Δ |
| 1-519 | $(ZrO_2)_{50}(Cr_2O_3)_{50}$ | $(ZrO_2)_{45}(Y_2O_3)_5(Cr_2O_3)_{50}$ | ○ | ○ | ⊚ | Δ |
| 1-520 | $(ZrO_2)_{35}(SiO_2)_{35}(Cr_2O_3)_{30}$ | $(ZrO_2)_{25}(SiO_2)_{25}(Cr_2O_3)_{50}$ | ○ | ○ | ⊚ | Δ |
| 1-521 | $(ZrO_2)_{30}(SiO_2)_{20}(In_2O_3)_{20}(Cr_2O_3)_{30}$ | $(ZrO_2)_{25}(SiO_2)_{25}(Cr_2O_3)_{50}$ | ○ | ○ | ○ | ○ |
| 1-005 | $(ZnS)_{80}(SiO_2)_{20}$ | $(ZnS)_{80}(SiO_2)_{20}$ | ○ | ○ | ○ | Δ |

| Disc No. | Shelf-life deterioration | Arc. OW deterioration | Rewriting performance | Storage stability | Comprehensive evaluation |
|---|---|---|---|---|---|
| | \multicolumn{5}{c}{4× speed (=19.6 m/s)} |
| 1-501 | ○ | ○ | ○ | ○ | ○ |
| 1-502 | ○ | ○ | ○ | ○ | ○ |
| 1-503 | ○ | ○ | ○ | ○ | ○ |
| 1-504 | ○ | ○ | Δ | ○ | ○ |
| 1-505 | ○ | ○ | Δ | ○ | ○ |
| 1-506 | ○ | ○ | ○ | ○ | ○ |
| 1-507 | ○ | ○ | ○ | ○ | ○ |
| 1-508 | ○ | ○ | ○ | ○ | ○ |
| 1-509 | ○ | ○ | Δ | ○ | ○ |
| 1-510 | ○ | ○ | Δ | ○ | ○ |
| 1-511 | ○ | ○ | ○ | ○ | ○ |
| 1-512 | ○ | ○ | ○ | ○ | ○ |
| 1-513 | ○ | ○ | Δ | ○ | ○ |
| 1-514 | ○ | ○ | ○ | ○ | ○ |
| 1-515 | ○ | ○ | ○ | ○ | ○ |
| 1-516 | ○ | ○ | ○ | ○ | ○ |

TABLE 17-continued

| | | | | | |
|---|---|---|---|---|---|
| 1-517 | ○ | ○ | ○ | ○ | ○ |
| 1-518 | ○ | ○ | ○ | ○ | ○ |
| 1-519 | ○ | ○ | ○ | ○ | ○ |
| 1-520 | ○ | ○ | ○ | ○ | ○ |
| 1-521 | ○ | ○ | ○ | ○ | ○ |
| 1-005 | ○ | ○ | Δ | ○ | Δ |

As shown in Table 17, some of the media (Discs No. 1-501 to 1-503, 1-511, 1-512, and 1-516 to 1-520) were superior to Comparative Example 1-005 in terms of the rewriting performance, some of the media (Discs No. 1-504, 1-505, 1-509, 1-510, and 1-513) were superior to Comparative Example 1-005 in terms of the signal storage stability, and some of the media (Discs No. 1-506 to 1-508, 1-514, 1-515, and 1-521) were superior to Comparative Example 1-005 in terms of both the rewriting performance and signal storage stability. Comprehensively, all the information recording media 1 achieved properties superior to those of Comparative Example 1-005.

Next, Table 18 shows the evaluation results of the shelf-life deterioration, Arc. OW deterioration, rewriting performance (erasure rate), and signal storage stability at 2× and 4× speed recordings, when 1× linear velocity was defined as 3.7 m/s (the shortest mark length (2T)=0.112 μm, periodic clock=66 MHz). The evaluation criteria for each of the evaluation items with ⊚, ○, Δ, and x were the same as in Example 1.

TABLE 18

| | | | 2× speed (=7.4 m/s) | | | |
|---|---|---|---|---|---|---|
| Disc No. | First interface layer 14 | Second interface layer 16 | Shelf-life deterioration | Arc. OW deterioration | Rewriting performance | Storage stability |
| 1-501 | $(ZrO_2)_{50}(Cr_2O_3)_{50}$ | $(ZrO_2)_{50}(Cr_2O_3)_{50}$ | ○ | ○ | ⊚ | Δ |
| 1-502 | $(HfO_2)_{50}(Cr_2O_3)_{50}$ | $(ZrO_2)_{50}(Cr_2O_3)_{50}$ | ○ | ○ | ⊚ | Δ |
| 1-503 | $(ZrO_2)_{70}(Bi_2O_3)_{30}$ | $(ZrO_2)_{50}(Cr_2O_3)_{50}$ | ○ | ○ | ⊚ | Δ |
| 1-504 | $(ZrO_2)_{50}(In_2O_3)_{50}$ | $(ZrO_2)_{50}(Cr_2O_3)_{50}$ | ○ | ○ | ○ | ⊚ |
| 1-505 | $(ZrO_2)_{60}(Ga_2O_3)_{40}$ | $(ZrO_2)_{50}(Cr_2O_3)_{50}$ | ○ | ○ | ○ | ⊚ |
| 1-506 | $(ZrO_2)_{50}(Al_2O_3)_{50}$ | $(ZrO_2)_{50}(Cr_2O_3)_{50}$ | ○ | ○ | ○ | ○ |
| 1-507 | $(ZrO_2)_{70}(TiO_2)_{30}$ | $(ZrO_2)_{50}(Cr_2O_3)_{50}$ | ○ | ○ | ○ | ○ |
| 1-508 | $(ZrO_2)_{70}(Nb_2O_5)_{30}$ | $(ZrO_2)_{50}(Cr_2O_3)_{50}$ | ○ | ○ | ○ | ○ |
| 1-509 | $(ZrO_2)_{70}(ZnO)_{30}$ | $(ZrO_2)_{50}(Cr_2O_3)_{50}$ | ○ | ○ | ○ | ○ |
| 1-510 | $(ZrO_2)_{70}(Dy_2O_3)_{30}$ | $(ZrO_2)_{50}(Cr_2O_3)_{50}$ | ○ | ○ | ○ | ○ |
| 1-511 | $(ZrO_2)_{35}(SiO_2)_{35}(Cr_2O_3)_{30}$ | $(ZrO_2)_{50}(Cr_2O_3)_{50}$ | ○ | ○ | ⊚ | Δ |
| 1-512 | $(ZrO_2)_{50}(Y_2O_3)_{10}(Cr_2O_3)_{30}$ | $(ZrO_2)_{50}(Cr_2O_3)_{50}$ | ○ | ○ | ⊚ | Δ |
| 1-513 | $(ZrO_2)_{35}(SiO_2)_{35}(In_2O_3)_{30}$ | $(ZrO_2)_{50}(Cr_2O_3)_{50}$ | ○ | ○ | ○ | ⊚ |
| 1-514 | $(ZrO_2)_{30}(SiO_2)_{20}(In_2O_3)_{20}(Cr_2O_3)_{30}$ | $(ZrO_2)_{50}(Cr_2O_3)_{50}$ | ○ | ○ | ○ | ○ |
| 1-515 | $(ZrO_2)_{30}(SiO_2)_{20}(TiO_2)_{20}(Cr_2O_3)_{30}$ | $(ZrO_2)_{50}(TiO_2)_{50}$ | ○ | ○ | ○ | ○ |
| 1-516 | $(ZrO_2)_{50}(Cr_2O_3)_{50}$ | $(HfO_2)_{50}(Cr_2O_3)_{50}$ | ○ | ○ | ⊚ | Δ |
| 1-517 | $(ZrO_2)_{50}(Cr_2O_3)_{50}$ | $(ZrO_2)_{70}(Bi_2O_3)_{30}$ | ○ | ○ | ⊚ | Δ |
| 1-518 | $(ZrO_2)_{50}(Cr_2O_3)_{50}$ | $(ZrO_2)_{25}(SiO_2)_{25}(Cr_2O_3)_{50}$ | ○ | ○ | ⊚ | Δ |
| 1-519 | $(ZrO_2)_{50}(Cr_2O_3)_{50}$ | $(ZrO_2)_{45}(Y_2O_3)_5(Cr_2O_3)_{50}$ | ○ | ○ | ⊚ | Δ |
| 1-520 | $(ZrO_2)_{35}(SiO_2)_{35}(Cr_2O_3)_{30}$ | $(ZrO_2)_{25}(SiO_2)_{25}(Cr_2O_3)_{50}$ | ○ | ○ | ⊚ | Δ |
| 1-521 | $(ZrO_2)_{30}(SiO_2)_{20}(In_2O_3)_{20}(Cr_2O_3)_{30}$ | $(ZrO_2)_{25}(SiO_2)_{25}(Cr_2O_3)_{50}$ | ○ | ○ | ○ | ○ |
| 1-005 | $(ZnS)_{80}(SiO_2)_{20}$ | $(ZnS)_{80}(SiO_2)_{20}$ | ○ | ○ | ○ | Δ |

| | | 4× speed (=14.8 m/s) | | | |
|---|---|---|---|---|---|
| Disc No. | Shelf-life deterioration | Arc. OW deterioration | Rewriting performance | Storage stability | Comprehensive evaluation |
| 1-501 | ○ | ○ | ○ | ○ | ○ |
| 1-502 | ○ | ○ | ○ | ○ | ○ |
| 1-503 | ○ | ○ | ○ | ○ | ○ |
| 1-504 | ○ | ○ | Δ | ○ | ○ |
| 1-505 | ○ | ○ | Δ | ○ | ○ |
| 1-506 | ○ | ○ | ○ | ○ | ○ |
| 1-507 | ○ | ○ | ○ | ○ | ○ |
| 1-508 | ○ | ○ | ○ | ○ | ○ |
| 1-509 | ○ | ○ | Δ | ○ | ○ |
| 1-510 | ○ | ○ | Δ | ○ | ○ |
| 1-511 | ○ | ○ | ○ | ○ | ○ |
| 1-512 | ○ | ○ | ○ | ○ | ○ |
| 1-513 | ○ | ○ | Δ | ○ | ○ |
| 1-514 | ○ | ○ | ○ | ○ | ○ |
| 1-515 | ○ | ○ | ○ | ○ | ○ |
| 1-516 | ○ | ○ | ○ | ○ | ○ |
| 1-517 | ○ | ○ | ○ | ○ | ○ |
| 1-518 | ○ | ○ | ○ | ○ | ○ |
| 1-519 | ○ | ○ | ○ | ○ | ○ |
| 1-520 | ○ | ○ | ○ | ○ | ○ |
| 1-521 | ○ | ○ | ○ | ○ | ○ |
| 1-005 | ○ | ○ | Δ | ○ | Δ |

As shown in Table 18, some of the media (Discs No. 1-501 to 1-503, 1-511, 1-512, and 1-516 to 1-520) were superior to Comparative Example 1-005 in terms of the rewriting performance, some of the media (Discs No. 1-504, 1-505, 1-509, 1-510, and 1-513) were superior to Comparative Example 1-005 in terms of the signal storage stability, and some of the media (Discs No. 1-506 to 1-508, 1-514, 1-515, and 1-521) were superior to Comparative Example 1-005 in terms of both the rewriting performance and signal storage stability. Comprehensively, all the information recording media 1 achieved properties superior to those of Comparative Example 1-005.

According to the above-mentioned results, it is more preferable that the first interface layer 14 and the second interface layer 16 each are composed of an oxide of at least one selected from Si, Zr, Hf, Bi, Cr, In, Ga, Al, Ti, Nb, Y, Zn, and Dy.

Example 10

The present example is an example of the electrical information recording medium (memory) 56 shown in FIG. 5.

Hereinafter, the method for producing the information recording media of the present example will be described with reference to FIG. 5.

As the substrate 51, an Si substrate with a nitrided surface was prepared. On the substrate, a 0.1 μm-thick Pt film with an area of 6 μm×6 μm to serve as the lower electrode 52, a 0.01 μm-thick $(ZrO_2)_{25}(SiO_2)_{25}(Cr_2O_3)_{50}$ film with an area of 4.5 μm×5 μm to serve as the first interface layer 501, a 0.1 μm-thick film with an area of 5 μm×5 μm to serve as the first recording layer 53, a 0.01 μm-thick $(ZrO_2)_{25}(SiO_2)_{25}(Cr_2O_3)_{50}$ film with an area of 4.5 μm×5 μm to serve as the second interface layer 502, a 0.01 μm-thick $(ZrO_2)_{25}(SiO_2)_{25}(Cr_2O_3)_{50}$ film with an area of 4.5 μm×5 μm to serve as the third interface layer 503, a 0.1 μm-thick film with an area of 5 μm×5 μm to serve as the second recording layer 54, a 0.01 μm-thick $(ZrO_2)_{25}(SiO_2)_{25}(Cr_2O_3)_{50}$ film with an area of 4.5 μm×5 μm to serve as the fourth interface layer 504, and a 0.1 μm-thick Pt film with an area of 5 μm×5 μm to serve as the upper electrode 55 were stacked sequentially by the sputtering method. The first interface layer 501, the second interface layer 502, the third interface layer 503, and the fourth interface layer 504 each were made of insulating material. Thus, in order to supply current to the first recording layer 53 and the second recording layer 54, the first interface layer 501, the second interface layer 502, the third interface layer 503, and the fourth interface layer 504 were formed in smaller areas than those of the first recording layer 53 and the second recording layer 54 so as to provide these interface layers with a portion in which the lower electrode 52 and the first recording layer 53, the first recording layer 53 and the second recording layer 54, or the second recording layer 54 and the upper electrode 55 are connected.

Thereafter, an Au lead wire was bonded to each of the lower electrode 52 and the upper electrode 55 so as to connect the electrical information recording and reproducing apparatus 62 to the electrical information recording medium 56 via the application units 57. The electrical information recording and reproducing apparatus 62 allowed the pulse power supply 60 to be connected between the lower electrode 52 and the upper electrodes 55 via the switch 59. Furthermore, the resistance measuring device 58 connected between the lower electrode 52 and the upper electrodes 55 via the switch 61 detected the change in resistance caused by the phase changes of the first recording layer 53 and the second recording layer 54.

In the information recording media 56 of the present example, the materials used for the first recording layers 53 and the second recording layers 54 were phase change materials represented by $Sb_{x1}Te_{x2}Ge_{x3}C_{x4}$ (atom %), where (X1, X2, X3, X4)=(65, 25, 5, 5), (65, 20, 10, 5), (65, 15, 10, 10), (60, 15, 15, 10), (70, 15, 10, 5), (80, 15, 3, 2), (80, 15, 1, 4), (65, 10, 20, 5), (65, 8, 22, 5), (73, 15, 10, 2), (70, 10, 10, 10), (65, 10, 10, 15), (65, 10, 5, 20), (65, 8, 5, 22), (63, 10, 5, 22), (78, 12, 5, 5), (75, 15, 5, 5), (73, 13, 9, 5), (75, 11, 9, 5), (77, 11, 4, 8), (74, 14, 4, 8), (72, 12, 8, 8), and (72, 10, 8, 10), respectively.

As a result, it has found that both of the first recording layer 53 and the second recording layer 54 can be changed electrically and reversibly between the crystalline state and the amorphous state, and rewriting can be performed thereon at least $10^{10}$ times. When the electrical information recording medium 56 was subject to the accelerated test at 80° C. and 20% RH for 50 hours, satisfactory rewriting performance was achieved (=no Arc. OW deterioration occurred). Accordingly, it has been proved that the electrical information recording medium 56 has satisfactory properties as an electrical information recording medium.

Example 11

The present example is an example of the information recording medium 8 shown in FIG. 8 used for a system that performs recording and reproducing of information with an optical system using the SIL. Hereinafter, the method for producing the information recording media of the present example will be described with reference to FIG. 8.

First, a polycarbonate substrate having a guide groove (with a depth of 20 nm and a track pitch of 200 nm) was prepared as the substrate 11. On the substrate 11, a 100 nm-thick Ag—Pd—Cu film (containing at least 96 wt % of Ag) to serve as the reflective layer 12, a 13 nm-thick $TiO_2$ film to serve as the first dielectric layer 13, a 3 nm-thick $(ZrO_2)_{35}(SiO_2)_{35}(Cr_2O_3)_{30}$ (mol %) film to serve as the first interface layer 14, a 10 nm-thick film (the composition thereof will be described later) to serve as the recording layer 15, a 5 nm-thick $(ZrO_2)_{35}(SiO_2)_{35}(Cr_2O_3)_{30}$ (mol %) film to serve as the second interface layer 16, and a $(ZnS)_{80}(SiO_2)_{20}$ (mol %) film to serve as the second dielectric layer 17 were formed sequentially by the sputtering method. The thickness of the second dielectric layer 17 was determined by the calculation based on the matrix method. Specifically, it was determined so that when a laser beam with a wavelength of 405 nm was incident, the information recording medium with the recording layer 15 being in the crystalline state (a mirror surface area of the substrate) had a reflectance of 18% to 28%, and the information recording medium with the recording layer 15 being in the amorphous state (the mirror surface area of the substrate) had a reflectance of 1.5% to 7%. Thereafter, an initialization process was performed for crystallizing the entire surface of the recording layer 15 with a laser beam.

Subsequently, the optical separation layer 82 with the guide groove was formed 3 μm thick on the first information layer 31, and the second information layer 83 was formed on the optical separation layer 82. The resin composing the optical separation layer 82 was an acrylic resin with a refractive index of 1.8. The second information layer 86 was formed by forming a 20 nm-thick $TiO_2$ film to serve as the transmittance adjusting layer 801, a 10 nm-thick Ag—Pd—Cu film (containing at least 96 wt % of Ag) to serve as the reflective layer 802, a 10 nm-thick $Al_2O_3$ film to serve as the first dielectric layer 803, a 5 nm-thick $(ZrO_2)_{25}(SiO_2)_{25}(Cr_2O_3)_{50}$ (mol %) film to serve as the first interface layer 804, a 7 nm-thick $Ge_{22}Sb_2Te_{25}$ film to serve as the recording layer 805, a 5 nm-thick $(ZrO_2)_{25}(SiO_2)_{25}(Cr_2O_3)_{50}$ (mol %) film to serve as the second interface layer 806, a $(ZnS)_{80}(SiO_2)_{20}$ (mol %)

film to serve as the second dielectric layer 807, and a 20 nm-thick $SiO_2$ to serve as the third dielectric layer 808 sequentially by the sputtering method. The thickness of the second dielectric layer 807 was determined by the calculation based on the matrix method. Specifically, it was determined so that when a laser beam with a wavelength of 405 nm was incident, the second information layer 83 with the recording layer 805 being in the crystalline state (the mirror surface area of the substrate) had a reflectance of 3.5% to 7% and a transmittance of 45% to 55%. Thereafter, an initialization process was performed for crystallizing the entire surface of the recording layer 805 of the second information layer 83 with a laser beam. Thereafter, a resin with a refractive index of 1.8 was applied to the third dielectric layer 808 and spin coating was performed. After that, the resin was cured with ultraviolet rays to form the cover layer 84 with a thickness of 3 p.m. Thus, the information recording medium 8 was produced.

In the information recording media 8 of the present example, the materials used for the recording layers 15 were phase change materials represented by $Sb_{x1}Te_{x2}Ge_{x3}C_{x4}$ (atom %), where (X1, X2, X3, X4)=(65, 20, 10, 5), (65, 15, 10, 10), (65, 10, 10, 15), (70, 20, 5, 5), (70, 15, 10, 5), (72, 18, 8, 2), (72, 15, 8, 5), (72, 10, 8, 8), (72, 18, 5, 5), (72, 13, 10, 5), (75, 15, 5, 5), (75, 12, 8, 5), and (75, 10, 10, 5), respectively. These media were numbered 8-101 to 8-113.

As comparative examples, information recording media (numbered 8-001 and 8-002) were produced. Both of them had the above-mentioned configuration of the information recording medium 8, but the recording layers 15 thereof were formed of $Sb_{65}Te_{30}Ge_5$ and $Sb_{70}Te_{25}Ge_5$, respectively.

The information recording media 8 of the present example and the information recording media of the present comparative examples thus produced were evaluated for recording-once shelf-life deterioration and Arc. OW deterioration at 1× speed recording. All of the evaluations were made using the recording and reproducing apparatus 9 shown in FIG. 9. The laser beam emitted from the laser source 901 had a wavelength 405 nm, and information was recorded on the groove. In the present example, the linear velocity at 1× speed was 3 m/s and the reproducing power was 1.0 mW. The accelerated test was performed in a thermostatic bath at 80° C. and 20% RH for 50 hours as in Example 1. The below-mentioned CNR and erasure rate evaluations were made using a spectrum analyzer.

The shelf-life deterioration was evaluated as follows. A 8T mark was recorded once before and after performing the accelerated test under the above-mentioned conditions, and the 8T mark recorded before the accelerated test and the 8T mark recorded after the accelerated test were measured for the recording power property of CNR to see if there was a difference therebetween (if power shift had occurred). Specifically, the recording power at which CNR reaches a saturation value (=the maximum value−1 dB) was defined as recording sensitivity, and the amount of change in CNR between before and after the accelerated test was evaluated at powers of the recording sensitivity×0.8, the recording sensitivity×0.9, the recording sensitivity, and the recording sensitivity×1.1. No shelf-life deterioration means that CNR did not change between before and after the accelerated test at all of the above-mentioned powers. In the present example, with respect to the shelf-life deterioration, ⊚ indicates that the amount of change in CNR (=CNR before acceleration−CNR after acceleration) is 1 dB or less, ○ indicates 2 dB or less, and Δ indicates 3 dB or less at all of the powers, and x indicates that it is more than 3 dB at least one of the powers.

The Arc. OW deterioration was evaluated as follows. First, a 3T mark was recorded 10 times at the power of recording sensitivity before the accelerated test. After the accelerated test, a 8T mark was recorded once on the 3T mark, and the 8T mark was measured for CNR. This CNR was compared with the CNR of a 8T mark recorded 10 times before the accelerated test to see if there was a difference therebetween. In the present example, with respect to the Arc. OW deterioration, ⊚ indicates that the amount of change in CNR (=CNR before acceleration−CNR after acceleration) is 1 dB or less, ○ indicates 2 dB or less, and Δ indicates 3 dB or less, and x indicates that it is more than 3 dB at least one of the powers.

The reproducing power and the recording power (sensitivity) described in the present example so far do not refer to powers measured at the position on which the laser beam was focused by the optical system shown in FIG. 9, but refer to powers measured at the position on which the laser beam was focused when the optical system in the recording and reproducing apparatus shown in FIG. 9 was replaced with an optical system (such as the recording and reproducing apparatus shown in FIG. 4) used in a Blu-ray Disc system. Table 19 shows the evaluation results of the shelf-life deterioration and Arc. OW deterioration.

TABLE 19

| | | 1 × speed (= 3 m/s) | |
|---|---|---|---|
| Disc No. | Recording layer 15 | Shelf-life deterioration | Arc. OW deterioration |
| 8-101 | $Sb_{65}Te_{20}Ge_{10}C_5$ | ○ | ○ |
| 8-102 | $Sb_{65}Te_{15}Ge_{10}C_{10}$ | ○ | ○ |
| 8-103 | $Sb_{65}Te_{15}Ge_{10}C_{10}$ | ○ | ○ |
| 8-104 | $Sb_{70}Te_{20}Ge_5C_{50}$ | ○ | ○ |
| 8-105 | $Sb_{70}Te_{15}Ge_{10}C_5$ | ○ | ○ |
| 8-106 | $Sb_{72}Te_{18}Ge_8C_2$ | ○ | ○ |
| 8-107 | $Sb_{72}Te_{15}Ge_8C_5$ | ○ | ○ |
| 8-108 | $Sb_{72}Te_{10}Ge_8C_8$ | ○ | ○ |
| 8-109 | $Sb_{72}Te_{18}Ge_5C_5$ | ○ | ○ |
| 8-110 | $Sb_{72}Te_{13}Ge_{10}C_5$ | ○ | ○ |
| 8-111 | $Sb_{75}Te_{15}Ge_5C_5$ | ○ | ○ |
| 8-112 | $Sb_{75}Te_{12}Ge_8C_5$ | ⊚ | ⊚ |
| 8-113 | $Sb_{75}Te_{10}Ge_{10}C_5$ | ⊚ | ⊚ |
| 8-001 | $Sb_{65}Te_{30}Ge_5$ | X | X |
| 8-002 | $Sb_{70}Te_{25}Ge_5$ | Δ | Δ |

As shown in Table 19, all of the information recording media 1 (Disc No. 8-101 to 8-113) of the present example were superior to the comparative examples 8-001 and 8-002 in terms of the shelf-life deterioration and Arc. OW deterioration at 1× speed recording.

As described above, information recording media having better properties than those of conventional ones were obtained in the present invention.

While embodiments of the present invention have been illustrated referring to the examples thereof, it should be understood that, as described above, the present invention is not limited to the above-mentioned embodiments, and may be applied to other embodiments based on the technical idea of the present invention.

INDUSTRIAL APPLICABILITY

The information recording medium and the method for producing the information recording medium of the present invention are useful for media, such as Blu-ray Disc media and media allowing information to be recorded thereon and reproduced therefrom by using SIL, as a high speed, high capacity optical information recording medium. The information recording medium and the method for producing the information recording medium of the present invention also are applicable to discs with a small diameter, for example, 6 cm and 8 cm. Furthermore, as an electrical information recording medium, the information recording medium of the present invention is useful also as an electrical switching element.

The invention claimed is:

1. An information recording medium allowing information to be recorded thereon by irradiation with a laser beam or by application of electrical energy, and
comprising a recording layer capable of undergoing a phase change by the irradiation with the laser beam or by the application of the electrical energy,
wherein the recording layer contains Sb, Te, Ge, and C, and a content of Te in the recording layer is at least 8 atom % but not more than 25 atom %.

2. The information recording medium according to claim 1, wherein the recording layer contains at least 65 atom % of Sb.

3. The information recording medium according to claim 1, wherein when Sb, Te, Ge, and C contained in the recording layer are represented by formula (1) below:

$$Sb_{x1}Te_{x2}Ge_{x3}C_{x4}(\text{atom \%}) \quad (1),$$

the formula (1) satisfies $x1 \geq 65$, $8 \leq x2 \leq 25$, $2 \leq x3 \leq 20$, $0 < x4 \leq 20$, and $x1+x2+x3+x4=100$.

4. The information recording medium according to claim 1, wherein the content of Te is equal to or higher than a content of Ge in the recording layer.

5. The information recording medium according to claim 4, allowing information to be recorded thereon by the irradiation with the laser beam, and
comprising N information layers, where N is an integer satisfying $N \geq 2$,
wherein when the N information layers are referred to as a first information layer to an N-th information layer sequentially from a side opposite to a laser beam incident side, at least the first information layer includes the recording layer.

6. The information recording medium according to claim 1, wherein the recording layer further contains an element M, where M is at least one element selected from B, Al, Ga, In, S, Mg, Si, N, Bi, Zn, Cu, Ag, Au, Ni, Mn, Cr, W, Ti, Nb, Ta, Zr, Y, Ce, Nd, Gd, Tb, and Dy.

7. The information recording medium according to claim 6, wherein the M is at least one element selected from Si and N.

8. The information recording medium according to claim 6, wherein the M is at least one element selected from In, Bi, and Zn.

9. The information recording medium according to claim 6, wherein when Sb, Te, Ge, C and M contained in the recording layer are represented by formula (2) below:

$$Sb_{x1}Te_{x2}Ge_{x3}C_{x4}M_{x5}(\text{atom \%}) \quad (2),$$

the formula (2) satisfies $x1 \geq 65$, $8 \leq x2 \leq 25$, $2 \leq x3 \leq 20$, $0 < x4 \leq 20$, $0 < x5 \leq 10$, and $x1+x2+x3+x4+x5=100$.

10. The information recording medium according to claim 1, allowing information to be recorded thereon by the irradiation with the laser beam, and
comprising N information layers, where N is an integer satisfying $N \geq 2$,
wherein when the N information layers are referred to as a first information layer to an N-th information layer sequentially from a side opposite to a laser beam incident side, at least one of the information layers from the first information layer to the N-th information layer includes the recording layer.

11. The information recording medium according to claim 10, wherein the first information layer includes the recording layer.

12. The information recording medium according to claim 10, wherein the N is 2, 3, or 4.

13. The information recording medium according to claim 1, allowing information to be recorded thereon by the irradiation with the laser beam, and
further comprising:
a first adjacent layer disposed adjacent to a surface of the recording layer on a side opposite to a laser beam incident side, and
a second adjacent layer disposed adjacent to a surface of the recording layer on the laser beam incident side,
wherein at least one of the first adjacent layer and the second adjacent layer is composed of an oxide of at least one element selected from Si, Zr, Hf, Bi, Cr, In, Ga, Al, Ti, Nb, Y, Zn, and Dy.

14. The information recording medium according to claim 13, further comprising a dielectric layer disposed on the side opposite to the laser beam incident side with respect to the recording layer,
wherein the dielectric layer is composed of an oxide of at least one element selected from Si, Zr, Hf, Bi, Cr, In, Ga, Al, Ti, Nb, Y, Zn, and Dy.

15. The information recording medium according to claim 1, allowing information to be recorded thereon by the irradiation with the laser beam, and
further comprising a reflective layer disposed on a side opposite to a laser beam incident side with respect to the recording layer,
wherein the reflective layer is composed mainly of Ag.

16. A method for producing the information recording medium of claim 1,
comprising at least the step of forming the recording layer included in the information recording medium,
wherein in the step,
the recording layer is formed by a sputtering method using a sputtering target containing Sb, Te, Ge, and C, a content of Te being at least 5 atom % but not more than 30 atom %.

17. The method for producing the information recording medium according to claim 16, wherein the sputtering target contains at least 60 atom % of Sb.

18. The method for producing the information recording medium according to claim 16, wherein the sputtering target further contains an element M, where M is at least one element selected from B, Al, Ga, In, S, Mg, Si, N, Bi, Zn, Cu, Ag, Au, Ni, Mn, Cr, W, Ti, Nb, Ta, Zr, Y, Ce, Nd, Gd, Tb, and Dy.

19. A method for producing the information recording medium of claim 1,
comprising at least the step of forming the recording layer included in the information recording medium,
wherein in the step,
the recording layer is formed by sputtering simultaneously, using a plurality of power supplies, a plurality of sputtering targets that each are composed of at least one element selected from Sb, Te, Ge, and C and have different compositions from each other.

20. The method for producing the information recording medium according to claim 19, wherein in the step,
the recording layer is formed by sputtering simultaneously, using the plurality of power supplies, a plurality of sputtering targets that each are composed of at least one element selected from Sb, Te, Ge, C, and an element M, where M is at least one element selected from B, Al, Ga, In, S, Mg, Si, N, Bi, Zn, Cu, Ag, Au, Ni, Mn, Cr, W, Ti, Nb, Ta, Zr, Y, Ce, Nd, Gd, Tb, and Dy, and have different compositions from each other.

21. A sputtering target used for forming the recording layer included in the information recording medium of claim 1, the sputtering target containing Sb, Te, Ge, and C, a content of Te being at least 5 atom % but not more than 30 atom %.

22. The sputtering target according to claim 21, containing at least 60 atom % of Sb.

23. The sputtering target according to claim 21, further containing an element M, where M is at least one element selected from B, Al, Ga, In, S, Mg, Si, N, Bi, Zn, Cu, Ag, Au, Ni, Mn, Cr, W, Ti, Nb, Ta, Zr, Y, Ce, Nd, Gd, Tb, and Dy.

* * * * *